(12) United States Patent
Iijima et al.

(10) Patent No.: US 10,651,395 B2
(45) Date of Patent: May 12, 2020

(54) ORGANIC ELECTROLUMINESCENT ELEMENT, DISPLAY DEVICE, AND ILLUMINATION DEVICE

(71) Applicant: KONICA MINOLTA, INC., Tokyo (JP)

(72) Inventors: Takayuki Iijima, Shizuoka (JP); Hiroshi Kita, Tokyo (JP)

(73) Assignee: KONICA MINOLTA, INC., Tokyo (JP)

(*) Notice: Subject to any disclaimer, the term of this patent is extended or adjusted under 35 U.S.C. 154(b) by 101 days.

(21) Appl. No.: 15/747,025

(22) PCT Filed: Jul. 22, 2016

(86) PCT No.: PCT/JP2016/071481
§ 371 (c)(1),
(2) Date: Jan. 23, 2018

(87) PCT Pub. No.: WO2017/018326
PCT Pub. Date: Feb. 2, 2017

(65) Prior Publication Data
US 2019/0013478 A1    Jan. 10, 2019

(30) Foreign Application Priority Data

Jul. 24, 2015 (JP) ................................. 2015-146543
Dec. 22, 2015 (JP) ................................. 2015-250261

(51) Int. Cl.
*H01L 51/00* (2006.01)
*C09K 11/06* (2006.01)
*H01L 51/50* (2006.01)

(52) U.S. Cl.
CPC .......... *H01L 51/0071* (2013.01); *C09K 11/06* (2013.01); *H01L 51/008* (2013.01);
(Continued)

(58) Field of Classification Search
None
See application file for complete search history.

(56) References Cited

U.S. PATENT DOCUMENTS

2009/0026938 A1* 1/2009 Okada ................. H01L 51/5016
                                                                    313/504
2010/0295444 A1   11/2010 Kuma et al.
2015/0236274 A1    8/2015 Hatakeyama et al.

FOREIGN PATENT DOCUMENTS

| JP | 2013053253 A | 3/2013 |
| JP | 2013056859 A | 3/2013 |
| JP | 2013116975 A | 6/2013 |
| WO | 2010134350 A1 | 11/2010 |
| WO | 2015102118 A1 | 7/2015 |

OTHER PUBLICATIONS

H. Uoyama, et al., Highly efficient organic light-emitting diodes from delayed fluorescence; Nature; vol. 492; Dec. 2012; pp. 234-238.

(Continued)

*Primary Examiner* — Jay Yang
(74) *Attorney, Agent, or Firm* — Lucas & Mercanti, LLP

(57) ABSTRACT

The purpose of the present invention is to provide an organic electroluminescent element having improved luminous efficiency and stability under high-temperature storage. The present invention is an organic electroluminescent element that has an anode, a cathode, and at least one light-emitting layer sandwiched between the anode and the cathode, and is characterized in that at least one of the light-emitting layers contains a π-conjugated boron compound having a structure represented by general formula (1).

(Continued)

[Formula 1]

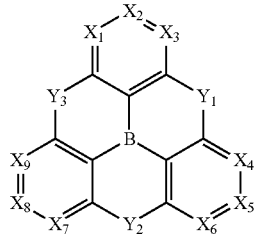

General formula 1

(In general formula (1), $X_1$ to $X_9$ each independently represents —CR or a nitrogen atom, R represents a hydrogen atom or a substituent, and $Y_1$ to $Y_3$ each independently represents an oxygen atom or a sulfur atom).

19 Claims, 8 Drawing Sheets

(52) U.S. Cl.
CPC ...... *H01L 51/0056* (2013.01); *H01L 51/0061* (2013.01); *H01L 51/0067* (2013.01); *H01L 51/0072* (2013.01); *H01L 51/0073* (2013.01); *H01L 51/0085* (2013.01); *C09K 2211/185* (2013.01); *H01L 51/506* (2013.01); *H01L 51/5012* (2013.01); *H01L 51/5016* (2013.01); *H01L 51/5076* (2013.01); *H01L 2251/552* (2013.01)

(56) References Cited

OTHER PUBLICATIONS

Q. Zhang, et al., Efficient blue organic light-emitting diodes employing thermally activated delayed fluorescence; Nature Photonics; Mar. 2014, pp. 1-7.
H. Nakanotani, et al., High-efficiency organic light-emitting diodes with fluorescent emitters; Nature Communications; May 2014, pp. 1-7.
Y. Kitamoto, et al., Light blue and green thermally activated delayed fluorescence from 10H-phenoxaborin-derivatives and their . . . ; Journal of Materials Chemistry C; vol. 3; 2015, pp. 9122-9130.
Katsuaki Suzuki, et al., Angew. Chem. Int. Ed .2015, 54, 874-878 (not available).
T.B. Tai, et al.; Theoretical design of pi-conjugated heteropolycyclic compounds containing a tricoordinated boron center; Journal of Physical Chemistry; vol. 117; 2013; pp. 14999-15008.
International Search Report dated Sep. 13, 2016 for PCT/JP2016/071481.
English translation of Written Opinion of the International Search Report dated Sep. 13, 2016 from corresponding PCT/JP2016/071481.
Shidang Xu, et al., Angew. Chem. Int. Ed .2015, 54, 874-878, "An Organic Molecule with Asymmetric Structure Exhibiting Aggregation-Induced Emission, Delayed Fluorescence, and Mechanoluminescence".
KIPO, Notification of Reason for Refusal for corresponding Korean Patent Application No. 10-2017-7036484, dated Jun. 12, 2019 with English translation (12 pages).
JPO, Notice of Reason for Refusal for corresponding Japanese Patent Application No. 2017-530826, dated Mar. 10, 2020, with English translation (7 pages).

* cited by examiner

ORGANIC ELECTROLUMINESCENT ELEMENT, DISPLAY DEVICE, AND ILLUMINATION DEVICE

CROSS REFERENCE TO RELATED APPLICATION

This Application is a 371 of PCT/JP2016/071481 filed on Jul. 22, 2016 which, in turn, claimed the priority of Japanese Patent Application No. 2015-146543 filed on Jul. 24, 2015 and Japanese Patent Application No. 2015-250261 filed on Dec. 22, 2015, all applications are incorporated herein by reference.

TECHNICAL FIELD

The present invention relates to an organic electroluminescent element and a display apparatus and a lighting apparatus including the organic electroluminescent element.

BACKGROUND ART

Organic EL elements (also referred to as "organic electroluminescence light emitting elements"), which employ electroluminescence of organic materials (hereinafter referred to as "EL"), have already been put into practice as novel light-emitting systems capable of planar light emission. Organic EL elements have recently been applied to electronic displays and also to lighting apparatuses, and further development of organic EL elements is anticipated.

When an electric field is applied to such an organic EL element, holes and electrons are respectively injected from an anode and a cathode into a light-emitting layer, and the injected holes and electrons are recombined in the light-emitting layer to generate excitons. In this case, singlet excitons and triplet excitons are generated at a ratio of 25%:75%, and thus, phosphorescence, which employs triplet excitons, theoretically provides internal quantum efficiency higher than that of fluorescence. Unfortunately, achievement of high quantum efficiency in a phosphorescent mode requires use of a complex of a rare metal, such as iridium or platinum as a central metal, which may cause future significant problems in the industry in terms of the reserves and price of rare metals.

Meanwhile, various fluorescent elements also have been developed for improving the emission efficiency, and a new movement has occurred in recent years. For example, PTL 1 discloses a technique focused on a triplet-triplet annihilation (TTA) phenomenon (hereinafter also called "triplet-triplet fusion (TTF)") wherein singlet excitons are generated by collision of two triplet excitons. This technique allows the TTA phenomenon to occur efficiently and thus improves the emission efficiency of a fluorescent element. This technique can increase the emission efficiency of the fluorescent material to two to three times that of a conventional fluorescent material. However, a problem of improving the emission efficiency remains, unlike a phosphorescent material, because singlet excitons are theoretically generated at efficiency of only about 40% by the TTA phenomenon.

In more recent years, fluorescent materials based on a thermally activated delayed fluorescence (hereinafter abbreviated as "TADF" as appropriate) phenomenon, which employs a phenomenon in which reverse intersystem crossing (hereinafter, abbreviated as "RISC" as appropriate) from the triplet excitons to the singlet excitons is caused, and applicability of the materials to organic EL elements has been reported (see, for example, PTL 2 and NPLs 1 and 2). Use of delayed fluorescence by means of this TADF mechanism can theoretically achieve 100% internal quantum efficiency, equivalent to phosphorescence, even in fluorescence caused by electric-field excitation.

In order for development of the TADF phenomenon, it is necessary to cause reverse intersystem crossing from 75% of triplet excitons to singlet excitons generated by electric-field excitation at room temperature or the light-emitting layer temperature in the light-emitting element. Additionally, singlet excitons generated by reverse intersystem crossing emit fluorescence similarly to 25% of singlet excitons generated by direct excitation to enable theoretically 100% internal quantum efficiency to be achieved. In order to cause this reverse intersystem crossing, it is essential that the absolute value of the difference between the lowest singlet excited energy level ($S_1$) and the lowest triplet excited energy level ($T_1$) (hereinafter, referred to as $\Delta E_{ST}$) is extremely small.

Meanwhile, it is known that incorporation of a material exhibiting the TADF property as a third component (assist dopant material) into a light-emitting layer including a host material and a light-emitting material is effective for achieving high emission efficiency (see NPL 3). Generation of 25% of singlet excitons and 75% of triplet excitons on the assist dopant by electric-field excitation enables production of singlet excitons through reverse intersystem crossing (RISC). The energy of the singlet excitons is transferred to the luminescent compound by fluorescence resonance energy transfer (hereinafter, abbreviated as FRET, as appropriate), and the luminescent compound can emit light by means of the transferred energy. Thus, use of the theoretically 100% exciton energy enables the luminescent compound to emit light, and high emission efficiency is developed.

Herein, in order to minimize ΔEst in an organic compound, it is known that the highest occupied molecular orbital (HOMO) and the lowest unoccupied molecular orbital (LUMO) are preferably localized in a molecule without mixing the orbitals.

Conventionally, for distinctly separating the HOMO and the LUMO, there is known a technique of introducing a strong electron-donating group (donor unit) or electron-withdrawing group (acceptor unit) into the molecule. Introduction of a strong electron-donating group or electron-withdrawing group, however, generates a strong intramolecular charge-transfer (CT)-type excited state, and is responsible to lengthening of wavelengths (broadening) in an absorption spectrum or emission spectrum of the compound, leading to a problem of difficult control of the emission wavelength. Moreover, in a π-conjugated boron compound having a strong electron-withdrawing group, as the LUMO level is lowered, the HOMO level is also lowered. Thus, when the π-conjugated boron compound is employed in a light-emitting material or the like, there have been a problem in that the host material is difficult to select due to the low HOMO level and LUMO level of the light-emitting material and the balance between carriers during driving of the EL becomes lost.

π-conjugated boron compounds are anticipated as electron-accepting groups for TADF compounds. This is because the π-conjugated boron compounds, which have an electron withdrawing ability weaker than that of commonly used electron-accepting groups such as a cyano group, sulfonyl group, and triazinyl group as well as exhibit excellent electron transportability and a high light-emitting ability, may be utilized in the electron transport layer or light-emitting layer in organic electroluminescent elements.

For example, NPL 4 discloses a TADF compound in which 10H-phenoxaborin is used as an acceptor unit. NPL 5 discloses a TADF compound of a trimesitylborane derivative.

Meanwhile, an issue of such compounds is low stability. Boron, which is a group 13 element, is an electron-deficient element having an empty p-orbital and is thus susceptible to attack by nucleophilic species. Accordingly, boron containing compounds are generally unstable.

There have been reported various methods for improving the thermodynamic stability of π-conjugated boron compounds. For example, in PTL 3 and PTL 5, attempts have been made to employ a compound having a double phenoxaborin skeleton, which is formed by further adding oxygen atoms to the phenoxaborin, in an organic electroluminescent element as means for improving the thermodynamic stability of a π-conjugated boron compound. PTL 4 discloses a compound fully-annulated by carrying out cross-linking in three directions around the boron atom by means of carbon atoms.

CITATION LIST

Patent Literature

PTL 1
International Publication No. WO2010/134350
PTL 2
Japanese Patent Application Laid-Open No. 2013-116975
PTL 3
Japanese Patent Application Laid-Open No. 2013-053253
PTL 4
Japanese Patent Application Laid-Open No. 2013-056859
PTL 5
International Publication No. WO2015/102118

Non-Patent Literature

NPL 1
H. Uoyama, et al., Nature, 2012, 492, 234-238
NPL 2
Q. Zhang, et al., Nature, Photonics, 2014, 8, 326-332
NPL 3
H. Nakanotani, et al., Nature Communication, 2014, 5, 4016-4022
NPL 4
Yuichi Kitamoto, et al., J. Mater. Chem. C, 2015, 3, 9122-9130
NPL 5
Shidang Xu, et al., Angew. Chem. Int. Ed. 2015, 54, 874-878

SUMMARY OF INVENTION

Technical Problem

As aforementioned, various π-conjugated boron compounds have been studied, but no highly stable compound has yet been developed. For example, the TADF compound of NPL 4, in which 10H-phenoxaborin is used as an acceptor unit, is more highly stabilized than usual triphenylborane by the effect of electron donation from the oxygen atoms in the skeleton to the boron atom. However, it is difficult to say that the compound has sufficient durability in electrochemically severe usages such as organic electroluminescent elements. Also in the trimesitylborane derivative of NPL 5, the shielding effect of the alkyl group alone is insufficient as means for improving the durability.

Further, in PTL 3 and PTL 5, attempts have been made to employ a compound having a double phenoxaborin skeleton formed by adding oxygen atoms to the phenoxaborin in organic electroluminescent elements. Accordingly, such compounds have thermodynamic stability more greatly improved than that of conventional boron compounds, but their redox properties are insufficient as light-emitting materials. As host materials and electron transport materials, their electrochemical durability has not reached a practical level. The compound of PTL 4 also has not achieved acceptable durability as an organic electroluminescent element.

In this manner, the thermodynamic stability and durability of π-conjugated boron compounds have been gradually improved by effects of steric shielding and electron donation, but no compound that exhibits sufficient durability in electrochemically severe usages such as organic electroluminescent elements has been obtained. Further, in order to put display apparatuses and lighting apparatuses including an organic electroluminescent element including a π-conjugated boron compound into practical use as products, it is necessary to further improve the performance.

The present invention has prepared in the view of the above problems and situations, and an object of the present invention is to provide a novel organic electroluminescent element having improved emission efficiency and stability under storage at a high temperature. Another object of the present invention is to provide a delayed fluorescence material and a charge transport material containing a π-conjugated boron compound to be used in the organic electroluminescent element, and a display apparatus and a lighting apparatus including the organic electroluminescent element.

Solution to Problem

The present inventor has found that an organic electroluminescent element having excellent emission efficiency and storage stability at a high temperature by incorporating a compound, which includes a structure obtained by carrying out full annulation in three directions around the boron atom and introducing oxygen atoms or sulfur atoms into ring-forming atoms into at least one of light-emitting layers in an organic electroluminescent element, having achieved the present invention.

The problems according to the present invention described above are solved by the following aspects:

In view of the above problems, a first aspect of the present invention relates to the organic electroluminescent element.

[1] An organic electroluminescent element including an anode, a cathode, and at least one organic layer sandwiched between the anode and the cathode, in which at least one of the organic layer includes a π-conjugated boron compound represented by the following general formula 1:

[Formula 1]

General formula 1

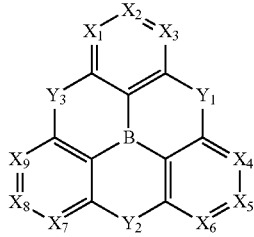

in which
$X_1$ to $X_9$ each independently represent —CW or a nitrogen atom,
W represents a hydrogen atom or substituent, and
$Y_1$ to $Y_3$ each independently represent an oxygen atom or sulfur atom.

[2] The organic electroluminescent element according to [1], in which, in general formula 1, $X_1$ to $X_9$ are —CW, and $Y_1$ to $Y_3$ are an oxygen atom.

[3] The organic electroluminescent element according to [1] or [2], in which the w is an electron-donating group.

[4] The organic electroluminescent element according to [3], in which the electron-donating group represented by the w is represented by the following general formula 2:

[Formula 2]

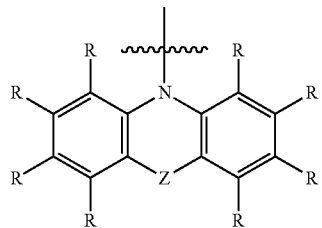

General formula 2 in which
Z represents $CR_1R_2$, $SiR_3R_4$, an oxygen atom, a sulfur atom, or $NR_5$, and
$R_1$ to $R_5$ and R each independently represent a hydrogen atom or substituent.

[5] The organic electroluminescent element according to [3], in which the electron-donating group represented by the w is represented by the following general formula 3:

[Formula 3]

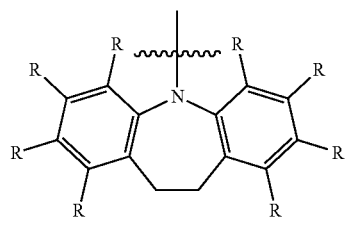

General formula 3 in which
each R independently represents a hydrogen atom or substituent.

[6] The organic electroluminescent element according to [3], in which the electron-donating group represented by the w is represented by the following general formula 4:

[Formula 4]

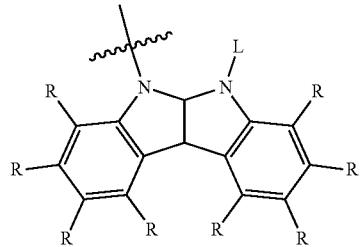

General formula 4 in which
each R independently represents a hydrogen atom or substituent, and
L represents a substituent.

[7] The organic electroluminescent element according to [3], in which the electron-donating group represented by the w is represented by the following general formula 5:

[Formula 5]

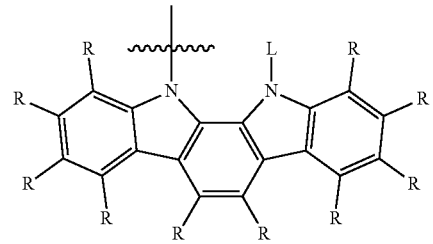

General formula 5 in which
each R independently represents a hydrogen atom or substituent, and
L represents a substituent.

[8] The organic electroluminescent element according to [3], in which the electron-donating group represented by the w is represented by the following general formula 6:

[Formula 6]

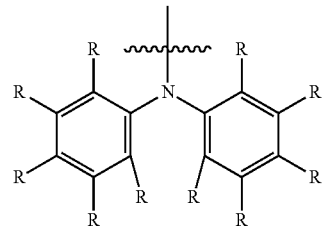

General formula 6 in which
each R independently represents a hydrogen atom or substituent.

[9] The organic electroluminescent element according to [3], in which the electron-donating group represented by the w is represented by the following general formula 7:

[Formula 7]

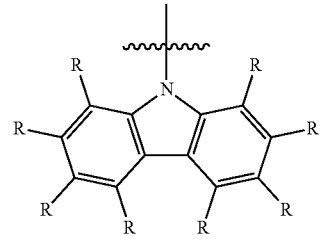

General formula 7 in which
each R independently represents a hydrogen atom or substituent.

[10] The organic electroluminescent element according to any of [1] to [9], in which, in the general formula 1, the $X_7$ to $X_9$ are —CW and the W is an electron-donating group.

[11] The organic electroluminescent element according to [10], in which the W is an electron-donating group represented by the following general formula 7:

[Formula 8]

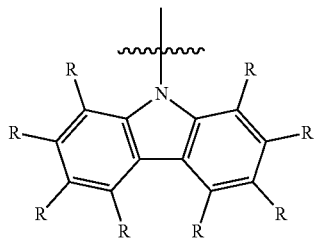

General formula 7 in which each R independently represents a hydrogen atom or substituent.

[12] The organic electroluminescent element according to any of [1] to [11], wherein ΔEst of the π-conjugated boron compound represented by general formula 1 is 0.50 eV or less, the ΔEst being an absolute value of difference between lowest singlet excited energy level and lowest triplet excited energy level of the compound.

[13] The organic electroluminescent element according to any of [1] to [12], in which the organic layer includes a light-emitting layer, and the light-emitting layer includes the π-conjugated boron compound represented by general formula 1.

[14] The organic electroluminescent element according to [13], in which the light-emitting layer includes the π-conjugated boron compound represented by general formula 1 and at least one of a fluorescence-emitting material and a phosphorescence-emitting material.

[15] The organic electroluminescent element according to any of [1] to [14], in which the π-conjugated boron compound represented by general formula 1 is used in combination with an electron transport material.

[16] The organic electroluminescent element according to any of [1] to [14], in which the π-conjugated boron compound represented by general formula 1 is used in combination with a hole transport material.

[17] The organic electroluminescent element according to any of [1] to [14], in which the organic layer including the π-conjugated boron compound represented by general formula 1 is a layer adjacent to the cathode.

A second aspect of the present invention relates to a display apparatus and a lighting apparatus using the organic electroluminescent element of the present invention.

[18] The display apparatus including the organic electroluminescent element according to any of [1] to [17].

[19] The lighting apparatus including the organic electroluminescent element according to any of [1] to [17].

Advantageous Effects of Invention

According to the present invention, an organic electroluminescent element including a π-conjugated boron compound and having improved emission efficiency and storage stability at a high temperature can be provided. A display apparatus and a lighting apparatus including the organic electroluminescent element can also be provided.

DESCRIPTION OF EMBODIMENTS

Figure 1:
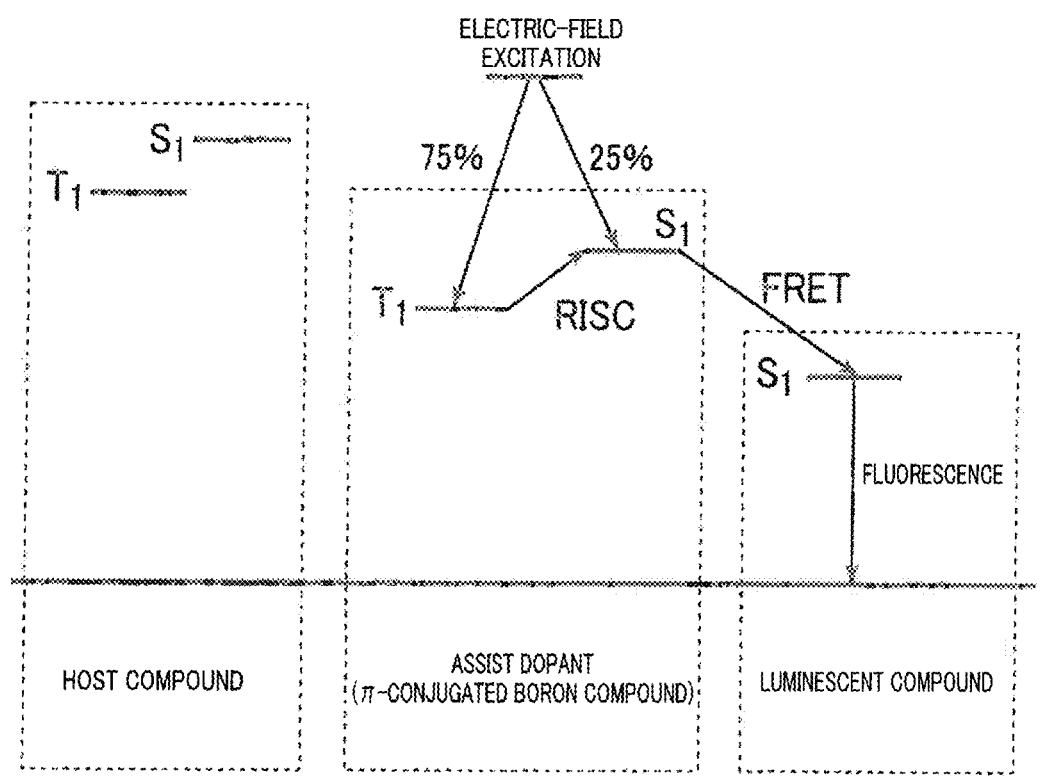
FIG. 1 is a schematic illustration of an energy diagram when the π-conjugated boron compound serves as an assist dopant material.

Hereinafter, the present invention and components thereof, and embodiments and aspects for carrying out the present invention will be explained in detail. Herein, "to" between numerical values is used to mean to include the numerical values described before and after "to" as the lower limit and the upper limit.

The present inventors have found that the emission efficiency and stability under storage at a high temperature of an organic electroluminescent element are improved by a π-conjugated boron compound including a structure represented by the following general formula 1:

[Formula 9]

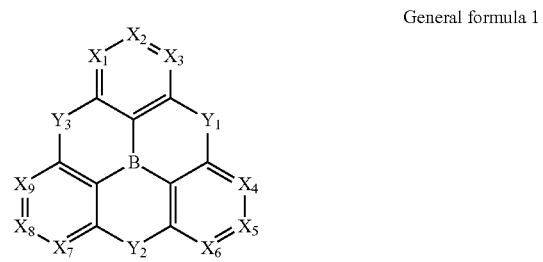

General formula 1 wherein $X_1$ to $X_9$ each independently represent —CW or a nitrogen atom,

R represents a hydrogen atom or substituent, and $Y_1$ to $Y_3$ each independently represent an oxygen atom or sulfur atom.

The π-conjugated boron compound used in the present invention, as clearly seen from the above general formula 1, has a structure obtained by incorporating boron into a carbon skeleton and carrying out full annulation in three directions around the boron, and rings around the boron contain single-bonded oxygen atoms or sulfur atoms. It is conceived that such a compound has excellent electron transportability and high emission efficiency, which are characteristics derived from boron, and further has an improved acceptor property due to presence of oxygen atoms or sulfur atoms having unshared electron pairs. The low stability, which has been an issue of conventional π-conjugated boron compounds, is overcome by carrying out full annulation in three directions around the boron, without impairing the electron transportability and high emission efficiency of boron.

Further, in the π-conjugated boron compound used in the present invention, an electron-donating substituent may be bonded to at least one of $X_1$ to $X_9$ of the above general formula 1.

The present application is an organic electroluminescent element including an anode, a cathode, and at least one organic layer sandwiched between the anode and the cathode, wherein the organic electroluminescent element contains a specific π-conjugated boron compound. Hereinafter, will be described an emission mode of organic EL and light-emitting materials, which relate to the technical concept of the present invention.

<Emission Mode of Organic EL>

Organic EL emits light based on either the following two emission modes: "phosphorescence," which occurs during transfer of excitons from the triplet excited state to the ground state, and "fluorescence," which occurs during transfer of excitons from the singlet excited state to the ground state.

In the case of electric-field excitation as in organic EL, triplet excitons are generated at a probability of 75% and singlet excitons are generated at a probability of 25%. Thus, "a phosphorescent" mode exhibits emission efficiency higher than that of the fluorescent mode, and is excellent for reducing power consumption.

Meanwhile, also in the case of "fluorescence", triplet excitons are generated at a probability of 75%, and their energy is usually converted into only heat due to non-radiative deactivation. By increasing the density of such triplet excitons, one singlet exciton is generated from two triplet excitons to thereby improve the emission efficiency. A mode has been found in which this mechanism, called a triplet-triplet annihilation (TTA) (also called triplet-triplet fusion and abbreviated as TTF), is employed.

Adachi, et al. have more recently found that a reduced energy gap between the singlet excited state and the triplet excited state causes reverse intersystem crossing from the triplet excited state, which has a lower energy level, to the singlet excited state depending on the Joule heat during emission and/or the ambient temperature around a light-emitting element, resulting in a phenomenon that achieves fluorescence at substantially 100% (referred to as "thermally activated delayed fluorescence (TADF)"). They have also found a fluorescent substance that achieves this phenomenon (see NPL 1 and the like).

<Phosphorescence-Emitting Compound>

Theoretically, phosphorescence has emission efficiency three times higher than that of fluorescence as described above. Unfortunately, energy deactivation from the triplet excited state to the singlet ground state (i.e., phosphorescence) is a forbidden transition. The intersystem crossing from the singlet excited state to the triplet excited state is also a forbidden transition, and thus, the rate constant of such a transition is generally small. Thus, the lifetime of excitons is on the order of milliseconds to seconds, and intended emission is difficult to achieve.

In the case of emission of a complex containing a heavy metal, such as iridium or platinum, the rate constant of the aforementioned forbidden transition increases by three or more orders of magnitude by the heavy atom effect of the central metal, and a phosphorescent quantum efficiency of 100% may be achieved depending on the selection of a ligand.

<Fluorescence-Emitting Compound>

Unlike the phosphorescence-emitting compound, a common fluorescence-emitting compound is not necessarily a heavy metal complex, and may be an organic compound composed of a combination of common elements, such as carbon, oxygen, nitrogen, and hydrogen. In such a fluorescent compound, other non-metal elements, such as phosphorus, sulfur, or silicon can be used, and a complex of a typical metal, such as aluminum or zinc can also be employed. A wide variety of such elements may be used without substantial limitation. Unfortunately, with a conventional fluorescent compound, in which only 25% of excitons is used for light emission as aforementioned, highly effective emission phosphorescence cannot be anticipated.

<Delayed Fluorescent Compound>

[Excited Triplet-Triplet Annihilation (TTA) Delayed Fluorescent Compound]

An emission mode utilizing delayed fluorescence has emerged for solving the problems involved in a fluorescence-emitting compound. The TTA mode, which is based on collision between triplet excitons, is described by the general formula as follows. That is, the TTA mode is advantageous in that a portion of triplet excitons, the energy of which would otherwise be converted into only heat by non-radiative deactivation, undergo reverse intersystem crossing, to generate singlet excitons that can contribute to luminescence. In an actual organic EL element, the TTA mode can achieve an external extraction quantum efficiency twice that achieved in a conventional fluorescent element.

General formula: $T^*+T^*\rightarrow S^*+S$ wherein, $T^*$ represents a triplet exciton, $S^*$ represents a singlet exciton, and S represents a molecule in the ground state.

Unfortunately, the TTA mode fails to achieve 100% internal quantum efficiency in principle because two triplet excitons generate only one singlet exciton that contributes to luminescence, also as illustrated in the aforementioned formula.

[Thermally Activated Delayed Fluorescent (TADF) Compound]

The TADF mode, which is another highly efficient fluorescent mode, can solve problems involved in the TTA mode. The fluorescence-emitting compound is advantageous in that the compound can be molecularly designed without limitation, as described above. In other words, of molecularly designed compounds, some compounds exhibit an extremely small difference between the energy level of a triplet excited state and the energy level of a singlet excited state.

Such a compound, although having no heavy atom in the molecule, undergoes reverse intersystem crossing from the triplet excited state to the singlet excited state, which cannot normally occur, because of small ΔEst. Furthermore, since the rate constant of deactivation from the singlet excited state to the ground state (i.e., fluorescence) is extremely large, the transfer of triplet excitons to the ground state via the singlet excited state with emission of fluorescence is kinetically more advantageous than the transfer of the triplet excitons to the ground state with thermal deactivation (non-radiative deactivation). Thus, in the TADF mode, 100% fluorescence can be theoretically achieved.

<Molecular Designing Idea Concerning ΔEst>

A molecular designing idea to reduce the ΔEst will be described.

In order to reduce the value of ΔEst, in principle, reducing the spatial overlaps of the highest occupied molecular orbital (HOMO) and the lowest unoccupied molecular orbital (LUMO) in the molecule is most effective.

It is known that in the electronic orbitals of the molecule, the HOMO has a distribution to an electron donating position and the LUMO has a distribution to an electron withdrawing position, in general. By introducing an electron donating skeleton and electron withdrawing skeleton in the molecule, it is possible to keep apart the positions in which the HOMO and the LUMO exist.

In "An advanced stage of organic optoelectronics with the aim of commercialization" OYO BUTURI Vol. 82, No. 6, 2013, for example, by introducing an electron withdrawing skeleton such as a cyano group, a triazine group or the like, and an electron donating skeleton such as a carbazole group, a diphenylamino group or the like, the LUMO and HOMO are respectively made localized.

In addition, it is also effective to reduce the molecular structure change between the ground state and the triplet excited state of the compound. As a method of reducing the structure change, it is effective to allow a compound to be stiff. Stiffness referred to herein means that freely movable portions in the molecule are not abundant such as by prevention of a free rotation of the bond between the rings in the molecule, or by introduction of a condensed ring having a large π-conjugate plane, for example. In particular, by making the portion participating in the light emission stiffer, it is possible to reduce the molecular structure change in the excited state.

<Common Problem Possessed by TADF Compound>

A TADF compound possesses a variety of problems arisen from the aspects of its light emission mechanism and its molecular structure. Some common problems possessed by a TADF compound will be described in the following.

In a TADF compound, it is required to keep apart the portion in which the HOMO exists and the portion in which the LUMO exist as much as possible in order to reduce ΔEst. For this reason, the electronic state of the molecule becomes almost near the donor/acceptor intramolecular CT state in which the HOMO portion and the LUMO portion are separated (intramolecular charge transfer state).

When a plurality of such molecules exists, bringing the donor portion in one molecule and the acceptor portion in other molecule close to each other achieves their stabilization. Such a stabilized condition is formed not only with two molecules but also can be formed with a plurality of molecules, such as three or five molecules. As a result, there are produced a variety of stabilized conditions having a broad distribution. The shape of absorption spectrum or the emission spectrum will be broad. Further, even if a multiple molecular aggregation of more than two molecules is not formed, there may be formed a variety of existing conditions having different interaction directions, angles or the like of two molecules. Thus, basically, the shape of absorption spectrum or the emission spectrum will be broad.

When the emission spectrum becomes broad, it will generate two major problems. One is a problem of decreasing the color purity of the emission color. This is not so significant when the compound is applied to an illumination application. However, when the compound is used for an electronic display application, the color reproduction region becomes small, and the color reproduction of pure colors will become decreased. As a result, it is difficult to actually apply the compound to a commercial product.

Another problem is the shortened wavelength of the rising wavelength in the short wavelength side of the emission spectrum (referred to as a "fluorescent zero-zero band"). That is, the $S_1$ level becomes high (becoming higher energy level of the lowest excited singlet energy).

When the wavelength of the fluorescent zero-zero band becomes shortened, the wavelength of the phosphorescent zero-zero band derived from $T_1$ which has lower energy than $S_1$ will naturally become shortened (increase in the $T_1$ level). Therefore, the host compound is required to have a high $S_1$ level and a high $T_1$ level in order to prevent the reverse energy transfer from the dopant.

This is an extremely major problem. A host compound basically made of an organic compound will take plural active and unstable chemical species conditions such as a cationic radical state, an anionic radical state, and an excited state in an organic EL element. These chemical species can be made existed in a relatively stable condition by expanding a π-conjugate system in the molecule.

However, in order to impart a high $S_1$ level and a high $T_1$ level to a molecule, the π-conjugate system in the molecule has to be reduced or cut. This makes it difficult to achieve stability and a high $S_1$ level and a high $T_1$ level at the same time. As a result, the lifetime of the light-emitting element becomes shorten.

Further, in a TADF compound containing no heavy metal, the deactivation transition from the triplet excited state to the ground state is forbidden transition. The presence time at the triplet excited state (exciton lifetime) is extremely long such as in an order of several hundred microseconds to milliseconds. Therefore, even if the $T_1$ energy level of the host compound is higher than that of the fluorescence-emitting compound, the probability of a reverse energy transfer from the triplet excited state of the fluorescence-emitting compound to the host compound will be increased due to the long presence time. As a result, an originally intended reverse intersystem crossing from the triplet excited state to the singlet excited state of the TADF compound does not occur sufficiently. Instead, an undesirable reverse energy transfer to the host compound mainly occurs to result in failing to obtain sufficient emission efficiency.

In order to solve the above-described problem, it is required to sharpen the shape of an emission spectrum of the TADF compound and to decrease the difference between the emission maximum wavelength and the rising wavelength of the emission spectrum. This can be achieved basically by reducing the change of the molecular structure of the singlet excited state and the triplet excited state.

Further, in order to prevent the reverse energy transfer to the host compound, it is effective to shorten the presence time of the triplet excited state of the TADF compound (exciton lifetime). In order to realize this, it is possible to solve the problem by reducing the molecular structure change between the ground state and the triplet excited state; introducing a suitable substituent or element to loosen the forbidden transition and the like.

Various measuring methods in respect of the π-conjugated boron compound according to the present invention will be described hereinafter.

[Electron Density Distribution]

In the π-conjugated boron compound according to the present invention, the HOMO and the LUMO are preferably substantially separated in the molecule, from the viewpoint of reducing ΔEst. The distribution of the HOMO and the LUMO can be determined from the electron density distribution when the structure is optimized obtained by molecular orbital calculation.

The structure optimization and calculation of the electron density distribution by molecular orbital calculation of the π-conjugated boron compound in the present invention can be carried out by using, as a calculation technique, software for molecular orbital calculation including B3LYP as a functional and 6-31G (d) as a basis function. The software is not particularly limited, and the distribution can be determined similarly by using any software.

In the present invention, Gaussian 09 available from Gaussian Inc., USA (Revision C. 01, M. J. Frisch, et al., Gaussian, Inc., 2010) was used as the software for molecular orbital calculation.

"The HOMO and the LUMO are substantially separated" means that the center of the HOMO orbital distribution and the center of the LUMO orbital distribution calculated by the molecular calculation described above are apart from each other and more preferably that the distribution of the HOMO orbit and the distribution of the LUMO orbit do not substantially overlap.

In respect of the separation state of the HOMO and the LUMO, from the aforementioned structure optimization calculation including B3LYP as the functional and 6-31G (d) as the basis function, excited state calculation by means of the time-dependent density functional theory (Time-Dependent DFT) is further carried out to determine energy levels of $S_1$ and $T_1$, ($E(S_1)$ and $E(T_1)$, respectively), and thus, the state can be calculated as $\Delta Est=|E(S_1)-E(T_1)|$. The smaller $\Delta Est$ calculated indicates that the HOMO and LUMO are more separate from each other. In the present invention, $\Delta E_{ST}$ calculated by using the calculation technique similar to that aforementioned is 0.50 eV or less, preferably 0.30 eV or less, more preferably 0.10 eV or less.

[Lowest Excited Singlet Energy Level $S_1$]

The lowest excited singlet energy level $S_1$ of the π-conjugated boron compound according to the present invention is defined based on one calculated by a typical method, also in the present invention. Specifically, a target compound is deposited onto a quartz substrate to prepare a sample, and an absorption spectrum of the sample is measured at ambient temperature (300 K) (vertical axis: absorbance, horizontal axis: wavelength). A tangential line is drawn at the rising point of the absorption spectrum on the longer wavelength side, and the lowest excited singlet energy level is calculated by a specific conversion expression on the basis of the wavelength at the point of intersection of the tangential line with the horizontal axis.

When the molecule itself of the π-conjugated boron compound used for the present invention has relatively high cohesion, errors due to cohesion may occur in thin film measurement. In the present invention, the lowest excited singlet energy level $S_1$ is determined from, as an approximation, the peak wavelength of emission of a solution of the π-conjugated boron compound at room temperature (25° C.) in consideration of a relatively small Stokes shift of the π-conjugated boron compound and a small change in the structure of the compound between the excited state and the ground state.

A solvent that may be used herein is one less likely to affect the cohesion state of the π-conjugated boron compound, that is, one having a small influence of a solvent effect, for example, a non-polar solvent, such as cyclohexane, toluene or the like can be used.

[Lowest Excited Triplet Energy Level $T_1$]

The lowest excited triplet energy level $T_1$ of the π-conjugated boron compound according to the present invention is calculated on the basis of the photoluminescent (PL) properties of a solution or thin film. For example, in respect of a calculation method in a thin film, a thin film is prepared from a dilute dispersion of the π-conjugated boron compound, and the transient PL properties of the thin film are determined with a streak camera to separate a fluorescent component and a phosphorescent component. By using the absolute value of the energy difference therebetween as ΔEst, the lowest excited triplet energy level can be determined on the basis of the lowest excited singlet energy level.

In measurement and evaluation, the absolute PL quantum efficiency was determined with an absolute PL quantum efficiency measuring apparatus C9920-02 (manufactured by Hamamatsu Photonics K.K.). The emission lifetime was determined with a streak camera C4334 (manufactured by Hamamatsu Photonics K.K.) under excitation of the sample with a laser beam.

[Energy Levels of HOMO and LUMO]

The π-conjugated boron compound according to the present invention has an LUMO energy level of −1.8 eV or more, preferably −1.7 to −0.6 eV, more preferably −1.5 to −1.1 eV. An LUMO energy level of −1.8 eV or more indicates that the π-conjugated boron compound according to the present invention has no strong electron-withdrawing group, in other words, that the HOMO energy level is not excessively lowered. In a conventional π-conjugated compound having a strong electron-withdrawing group, as the LUMO level is lowered, the HOMO level is also lowered. Thus, when the π-conjugated compound is used as a light-emitting material, for example, there has been a problem in that selection of the host material is difficult due to the low HOMO level and LUMO level of the light-emitting material and the balance between carriers during driving of the EL becomes disrupted. In contrast, with the π-conjugated boron compound according to the present invention, which has a relatively high LUMO level, the HOMO level does not excessively rise. Thus, there is provided an effect of easily generating excitons on the π-conjugated boron compound. The π-conjugated boron compound according to the present invention has a HOMO energy level of −5.5 eV or more, preferably −5.3 to −4.0 eV, more preferably −5.0 to −4.5 eV. The HOMO and LUMO energy levels are calculated by the structure optimization calculation including B3LYP as the functional and 6-31G (d) as the basis function.

[Structure of π-Conjugated Boron Compound]

The π-conjugated boron compound used in the organic electroluminescent element of the present invention is a π-conjugated boron compound having a structure represented by the following general formula 1.

[Formula 10]

General formula 1

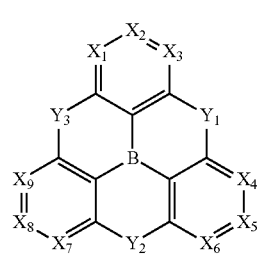

In general formula 1, $X_1$ to $X_9$ are each independently —CW or a nitrogen atom. Preferably, at least one of $X_1$ to $X_9$ is —CW, and more preferably, 3 to 6 of $X_1$ to $X_9$ are —CW. Still more preferably, all of $X_1$ to $X_9$ are —CW. A larger number of —CW moieties is preferred because the thermodynamic stability increases.

W in —CW represents a hydrogen atom or substituent. Examples of the substituent represented by W include, but not particularly limited to, optionally substituted alkyl groups, optionally substituted alkoxy groups, optionally substituted amino groups, optionally substituted aromatic ring groups, and optionally substituted aromatic heterocyclic groups, and the like.

The alkyl group of the "optionally substituted alkyl groups", which may be the substituent W, may be an alkyl group having any structure of a straight-chain, branched, or cyclic group. Examples of the alkyl group include $C_{1-20}$ straight-chain, branched, or cyclic alkyl groups. Specific examples thereof include methyl group, ethyl group, n-propyl group, isopropyl group, n-butyl group, s-butyl group, t-butyl group, n-pentyl group, neopentyl group, n-hexyl group, cyclohexyl group, 2-ethylhexyl group, n-heptyl group, n-octyl group, 2-hexyloctyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, n-nonadecyl group, and n-icosyl group. Preferred examples thereof include methyl group, ethyl group, isopropyl group, t-butyl group, cyclohexyl group, 2-ethylhexyl group, and 2-hexyloctyl group. The substituents that may be carried on these alkyl groups may be halogen atoms, aromatic rings described below, aromatic heterocyclic rings described below, amino groups described below, and the like.

The alkoxy group of the "optionally substituted alkoxy groups", which may be the substituent W, may be an alkoxy group having any structure of a straight-chain, branched, or cyclic group. Examples of the alkoxy group include $C_{1-20}$ straight-chain, branched, or cyclic alkoxy groups. Specific examples thereof include methoxy group, ethoxy group, n-propoxy group, isopropoxy group, n-butoxy group, isobutoxy group, t-butoxy group, n-pentyloxy group, neopentyloxy group, n-hexyloxy group, cyclohexyloxy group, n-heptyloxy group, n-octyloxy group, 2-ethylhexyloxy group, nonyloxy group, decyloxy group, 3,7-dimethyloctyloxy group, n-undecyloxy group, n-dodecyloxy group, n-tridecyloxy group, n-tetradecyloxy group, 2-n-hexyl-n-octyloxy group, n-pentadecyloxy group, n-hexadecyloxy group, n-heptadecyloxy group, n-octadecyloxy group, n-nonadecyloxy group, and n-icosyloxy group. Of these, methoxy group, ethoxy group, isopropoxy group, t-butoxy group, cyclohexyloxy group, 2-ethylhexyloxy group, and 2-hexyloctyloxy group are preferred. The substituents that may be carried on these alkyl groups may be halogen atoms, aromatic rings described below, aromatic heterocyclic rings described below, amino groups described below, and the like.

Examples of the aromatic ring of the "optionally substituted aromatic ring", which may be the substituent W, include benzene ring, indene ring, naphthalene ring, azulene ring, fluorene ring, phenanthrene ring, anthracene ring, acenaphthylene ring, biphenylene ring, chrysene ring, naphthacene ring, pyrene ring, pentalene ring, aceanthrylene ring, heptalene ring, triphenylene ring, as-indacene ring, chrysene ring, s-indacene ring, pleiadene ring, phenalene ring, fluoranthene ring, perylene ring, acephenanthrylene ring, biphenyl ring, terphenyl ring, and tetraphenyl ring. The substituents that may be carried on these aromatic rings may be halogen atoms, the alkyl groups aforementioned, the alkoxy groups aforementioned, aromatic heterocyclic rings described below, amino groups described below, and the like.

Examples of the aromatic heterocyclic ring of the "optionally substituted aromatic heterocyclic ring", which may be the substituent W, include carbazole ring, indoloindole ring, 9,10-dihydroacridine ring, phenoxazine ring, phenothiazine ring, dibenzothiophene ring, benzofurylindole ring, benzothienoindole ring, indolocarbazole ring, benzofurylcarbazole ring, benzothienocarbazole ring, benzothienobenzothiophene ring, benzocarbazole ring, dibenzocarbazole ring, dibenzofuran ring, benzofurylbenzofurane ring, and dibenzosilole ring. The substituents that may be carried on the aromatic heterocyclic ring may be halogen atoms, the alkyl groups aforementioned, the alkoxy groups aforementioned, the aromatic rings aforementioned, amino groups described below, and the like.

The substituents that may be carried on these alkyl groups may be halogen atoms, aromatic rings described below, aromatic heterocyclic rings described below, amino groups described below, and the like.

Examples of the substituent of the "optionally substituted amino group", which may be the substituent W, include halogen atoms, optionally substituted alkyl groups, aromatic rings or aromatic heterocyclic rings, and the like. The alkyl groups may be the same as those specifically listed above. The aromatic rings or aromatic heterocyclic rings may be the same as those specifically listed above.

Here, the π-conjugated boron compound used in the present invention preferably includes an electron-donating group as W in —CW. Boron compounds are excellent compounds having an electron-imparting property and having excellent electron transportability. It is assumed that binding an electron-donating substituent to such a boron compound enables stabilization of a charge separation state on a wide π-conjugate plane to thereby exhibit delayed fluorescence emission.

Structures that may be an "electron-donating group", among the structures exemplified as the aforementioned substituent W, may be aromatic heterocyclic rings such as carbazole ring, indoloindole ring, 9,10-dihydroacridine ring, phenoxazine ring, phenothiazine ring, dibenzothiophene ring, benzofurylindole ring, benzothienoindole ring, indolocarbazole ring, benzofurylcarbazole ring, benzothienocarbazole ring, benzothienobenzothiophene ring, benzocarbazole ring, dibenzocarbazole ring, and benzofurylbenzofurane ring; and the aromatic rings aforementioned substituted by an "electron-donating group". Examples of the "electron-donating group" include the alkyl groups and alkoxy groups aforementioned, optionally substituted amino group, and the like.

The electron-donating group is preferably arylamine. This is because binding a carbon atom with a nitrogen atom is likely to lead to charge separation based on the difference in the electronegativity between both the atoms. In this case, arylamine is likely to behave as an electron-donating group.

Further, the π-conjugated boron compound used in the present invention preferably contains an electron-donating group represented by any of the following general formulas 2 to 7, as W in —CW.

[Formula 11]

General formula 2

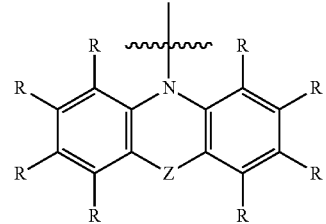

General formula 3

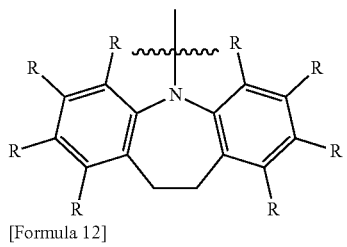

[Formula 12]

General formula 4

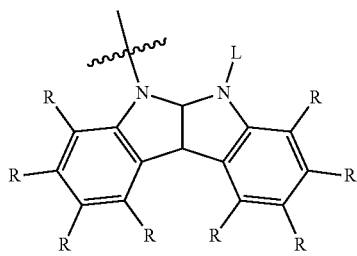

General formula 5

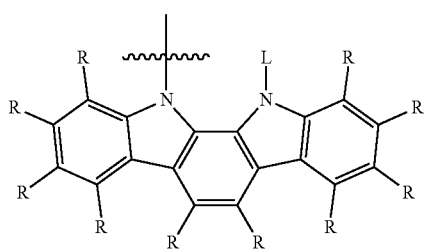

[Formula 13]

General formula 6

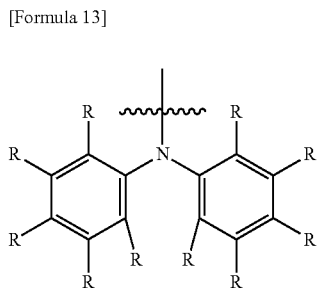

General formula 7

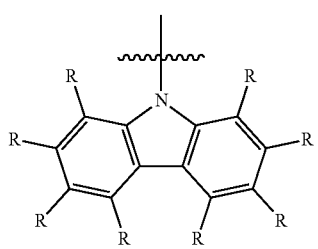

Wherein, in the above general formulas 2 to 7,

Z represents $CR_1R_2$, $SiR_3R_4$, an oxygen atom, sulfur atom, or $NR_5$, $R_1$ to $R_5$ each independently represent a hydrogen atom or substituent, Each R independently represents a hydrogen atom or substituent, and L represents a substituent.

Examples of the substituent represented by $R_1$ to $R_5$, R, or L in general formulas 2 to 7 include, but not particularly limited to, optionally substituted alkyl groups, optionally substituted alkoxy groups, optionally substituted amino groups, optionally substituted aromatic ring groups, optionally substituted aromatic heterocyclic groups, and the like. The optionally substituted alkyl group, optionally substituted alkoxy groups, optionally substituted amino groups, optionally substituted aromatic ring groups, and optionally substituted aromatic heterocyclic groups have the same definition as the optionally substituted alkyl groups, optionally substituted alkoxy groups, optionally substituted amino groups, optionally substituted aromatic ring groups, and optionally substituted aromatic heterocyclic group exemplified as the aforementioned substituent W.

A larger number of electron-donating groups is preferred because a stronger donor property is possessed, but from the viewpoint of the degree of difficulty in synthesis and a decrease in the solubility, the number is preferably one to three.

In the case where the compound has three or more electron-donating groups, it is preferred that $X_7$ to $X_9$ in general formula 1 are —CW and W is an electron-donating group. If $X_7$ to $X_9$ are —CW and W is an electron-donating group, the structure is such that three electron-donating groups are substituted in sequentially adjacent positions. In such a structure, rotational movement of the electron-donating group in the center (the electron-donating group W in —CW in $X_8$) sandwiched between two electron-donating groups is inhibited to thereby stabilize the excited state as a compound. Thus, such a structure is preferred. The three electron-donating groups bound to the same aromatic ring may be the same or different.

Further, in the π-conjugated boron compound according to the present invention, it is preferred that all of $X_7$ to $X_9$ in general formula 1 are —CW and W is an electron-donating group represented by general formula 7. The carbazole structure represented by general formula 7, which has high thermodynamic stability, is preferred in respect of enhancing the thermal stability of the π-conjugated boron compound.

In general formula 1, $Y_1$ to $Y_3$ each independently represent an oxygen atom or sulfur atom. That $Y_1$ to $Y_3$ are oxygen atoms or sulfur atoms can improve the acceptor property of the π-conjugated boron compound. Furthermore, an oxygen atom has a stronger acceptor property than a sulfur atom. Thus, at least one of $Y_1$ to $Y_3$ is preferably an oxygen atom, and more preferably, all of $Y_1$ to $Y_3$ are oxygen atoms.

In the π-conjugated boron compound used in the present invention, it is preferred that all of $X_1$ to $X_9$ are —CW and all of $Y_1$ to $Y_3$ are oxygen atoms. Such a compound is preferred because it has high thermodynamic stability and a strong acceptor property.

The π-conjugated boron compound used in the present invention may have a structure represented by general formula 1, in one molecule or may have two or more such structures. When two or more structures represented by general formula 1 are included, the structures may be the same or different.

Preferred specific example of the π-conjugated boron compound according to the present invention are listed below. These compounds may further contain a substituent or may be structural isomers or the like, and thus, the compound is not limited to this description.

[Formula 14]
A-1 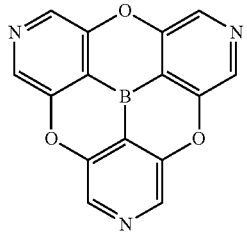
A-2 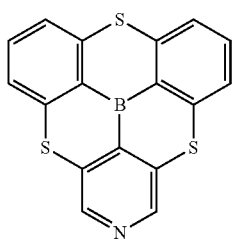
A-3 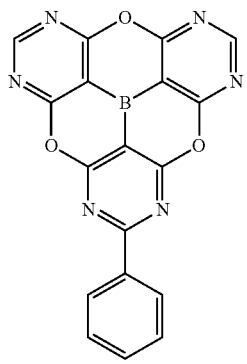
A-4 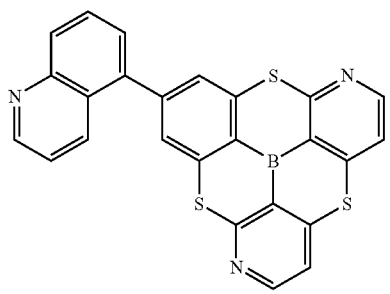
A-5 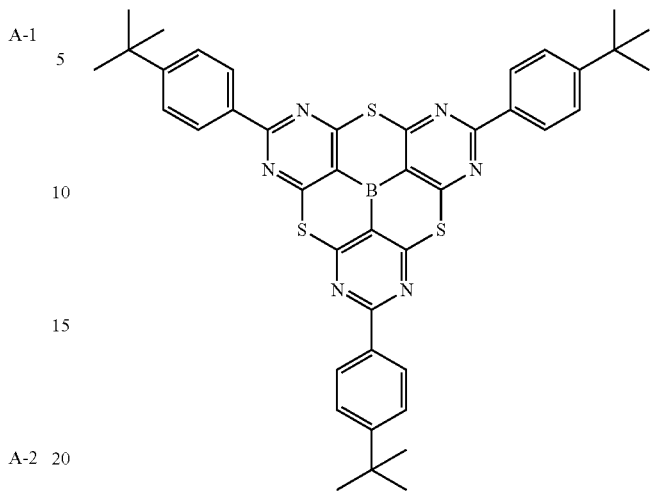
A-6 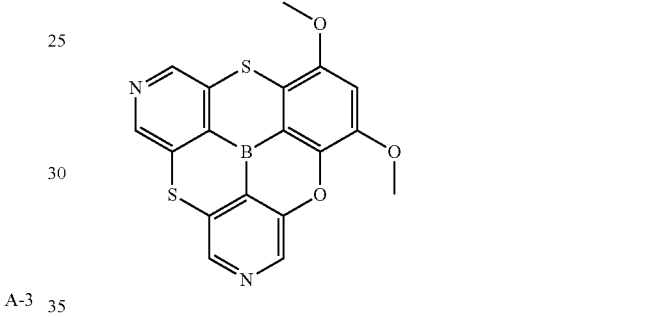
A-7 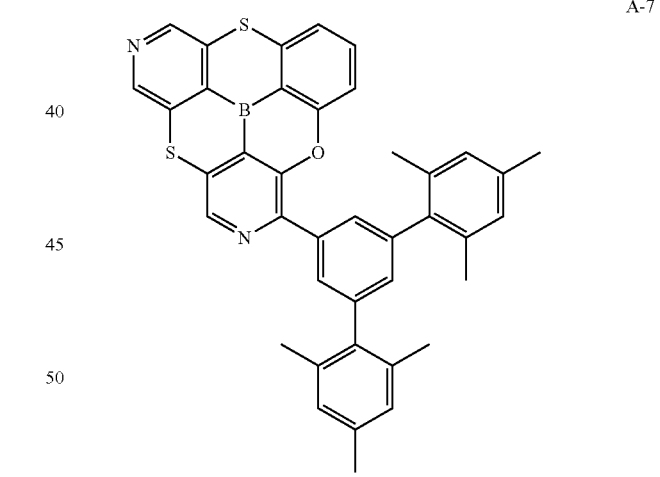
A-8 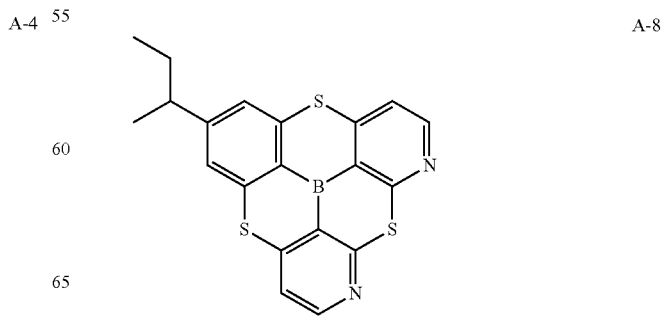

-continued
A-9
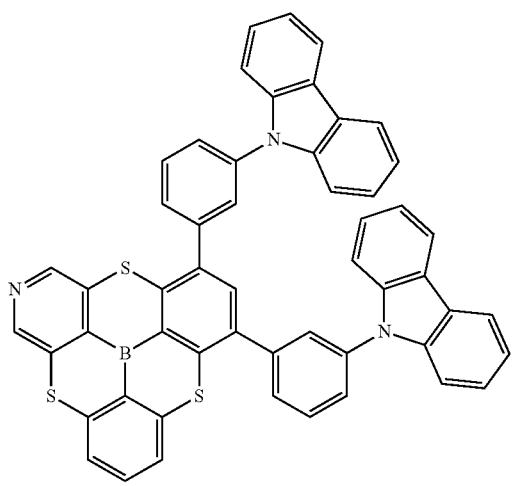
[Formula 15]
A-10
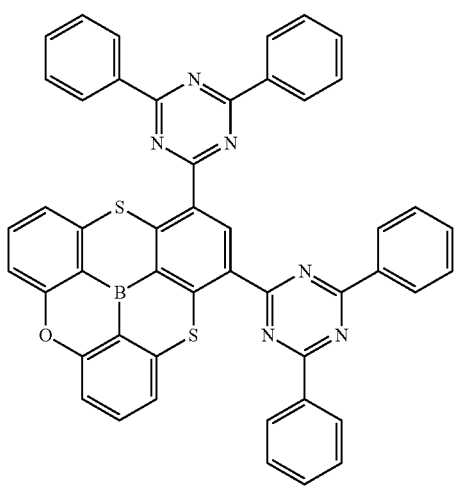
A-11
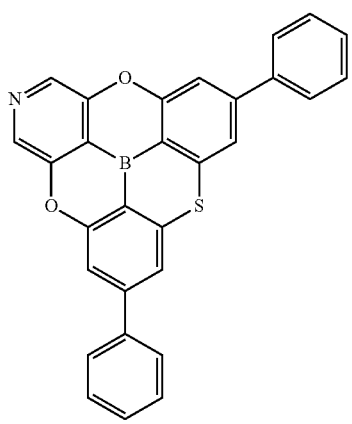
-continued
A-12
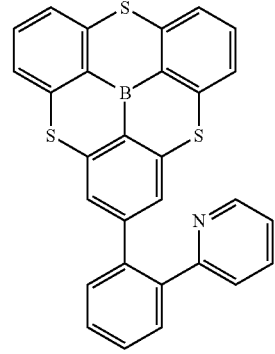
A-13
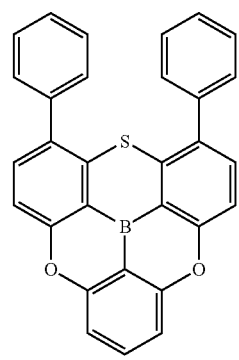
A-14
A-15
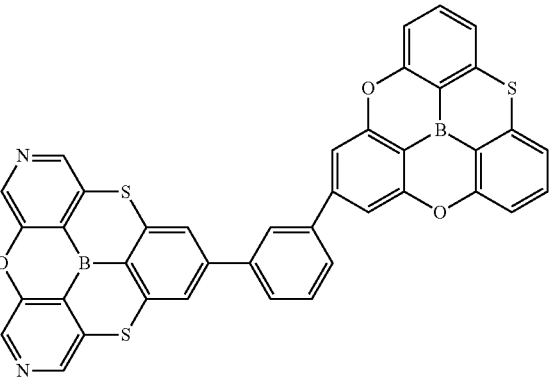

-continued
A-16
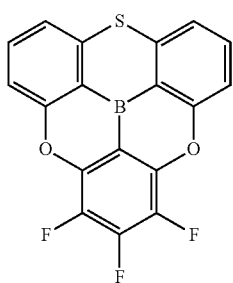
A-17
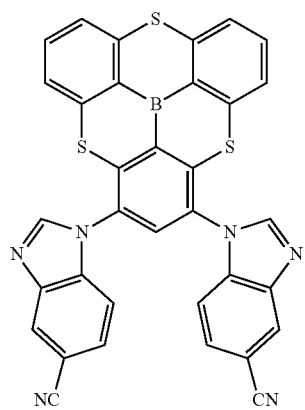
[Formula 16]
A-18
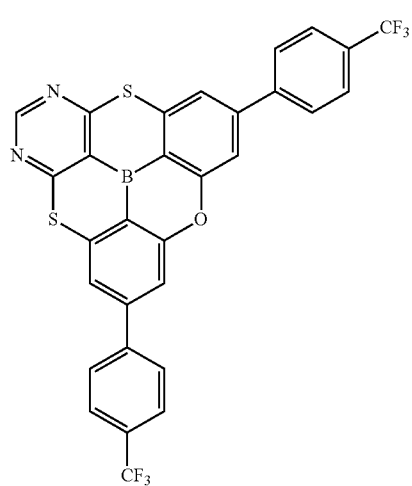
A-19
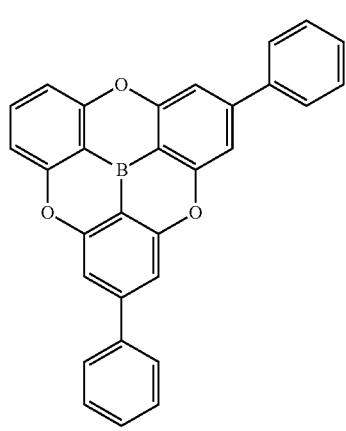
A-20
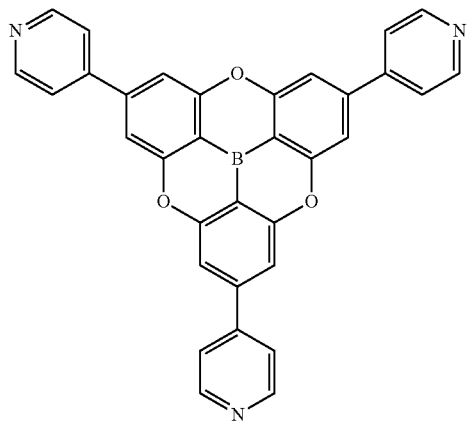
A-21
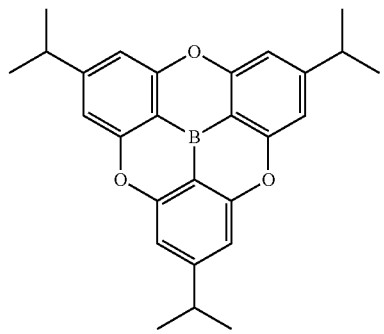
A-22
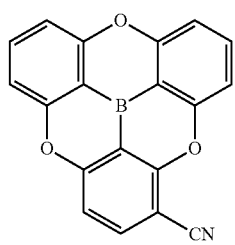
A-23
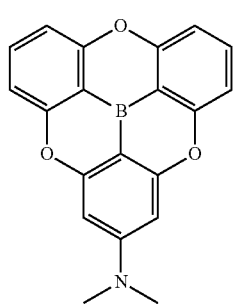

-continued
A-24
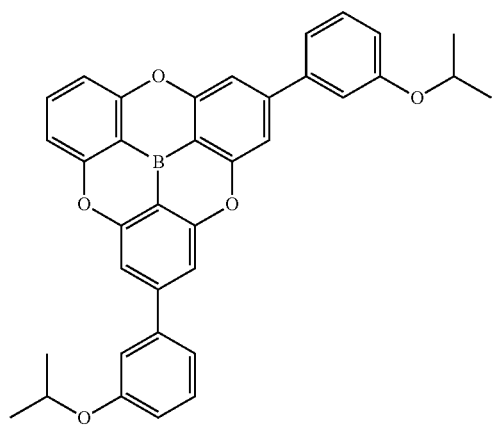
A-25
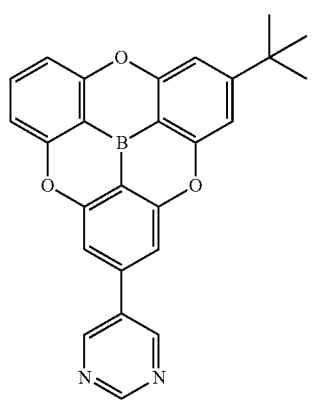
A-26
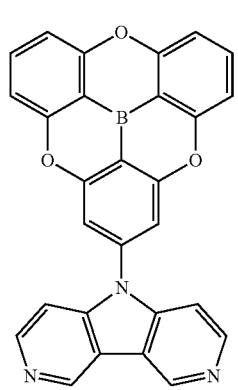
A-27
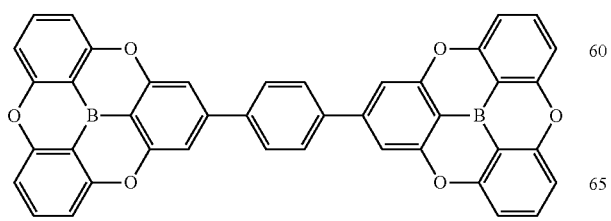
-continued
[Formula 17]
A-28
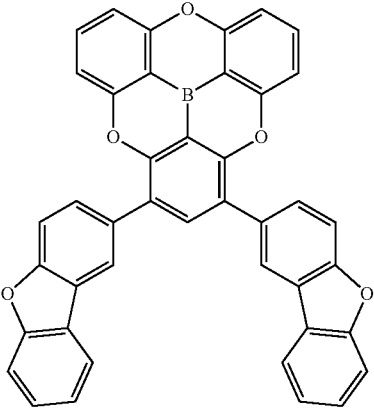
A-29
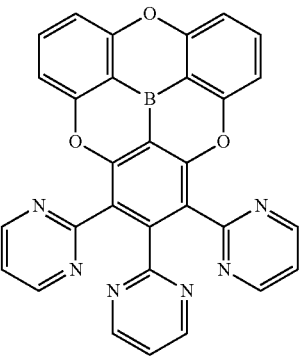
A-30
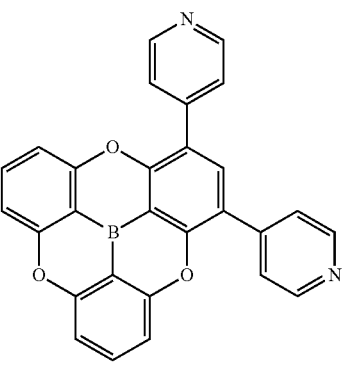
A-31
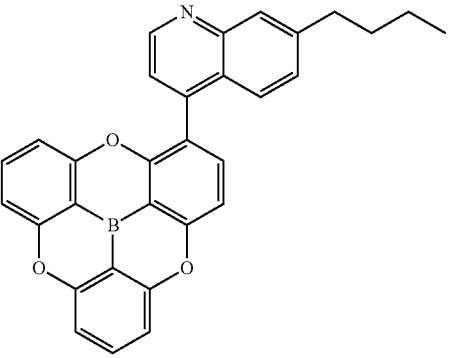

A-32
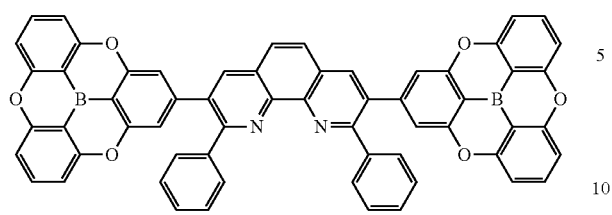
A-33
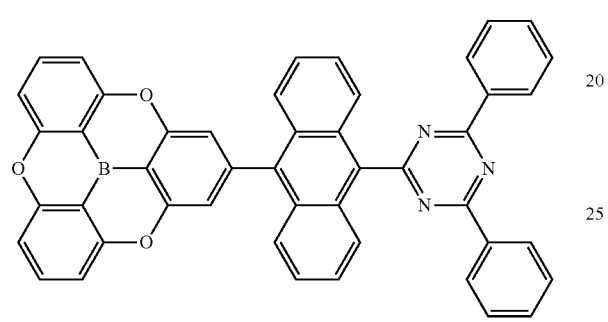
A-34
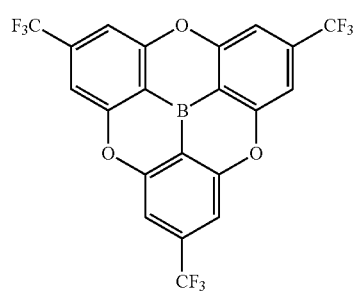
[Formula 18]
A-35
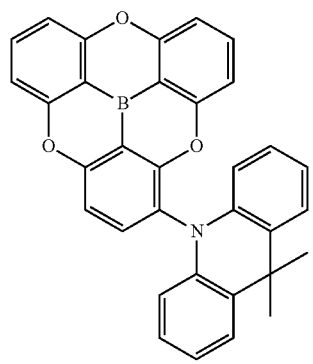
A-36
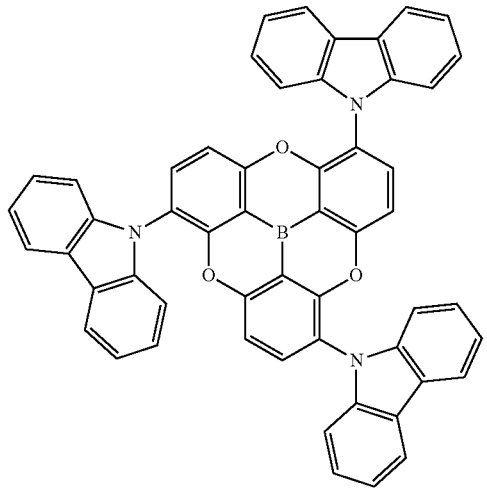
A-37
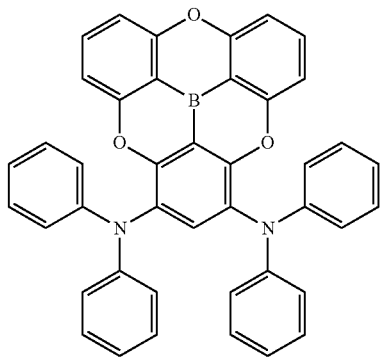
A-38
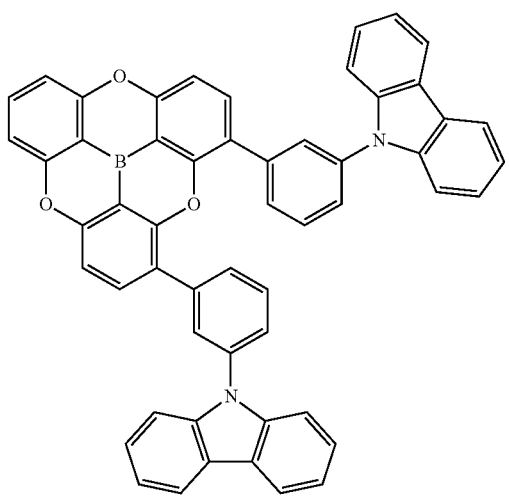

A-39
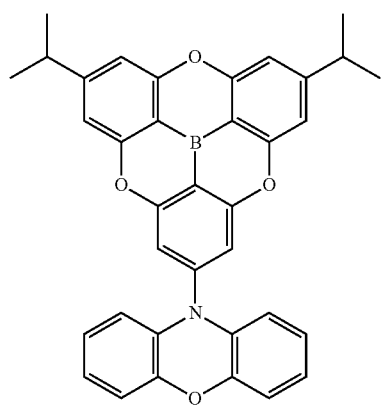
A-40
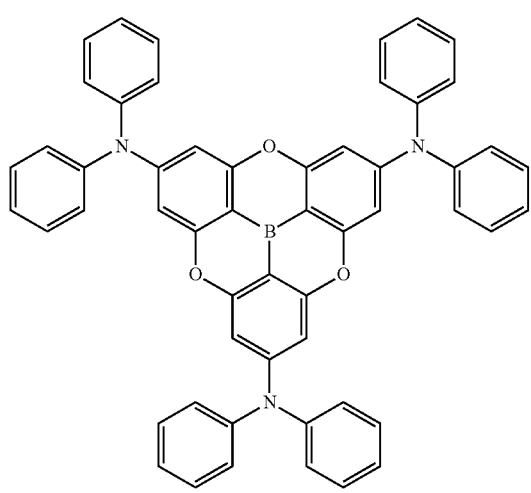
A-41
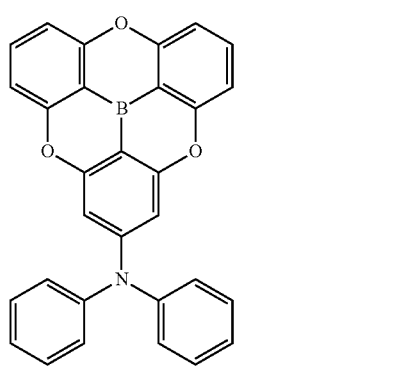
A-42
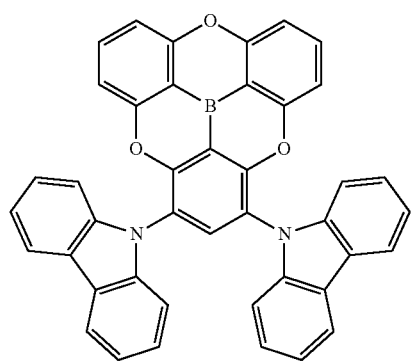
[Formula 19]
A-43
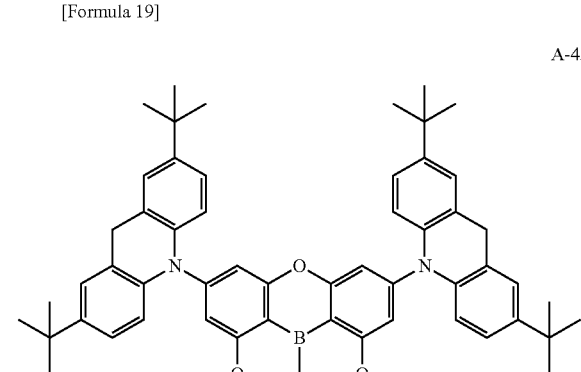
A-44
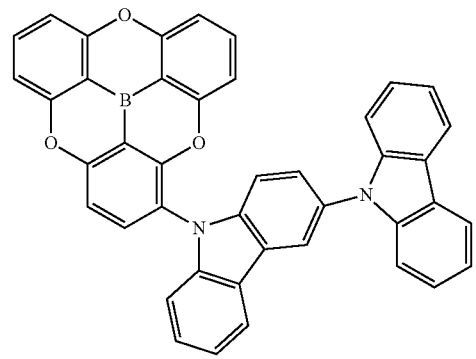
A-45
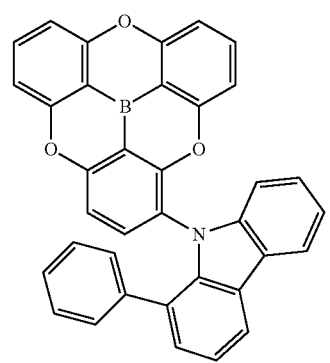

-continued
A-46
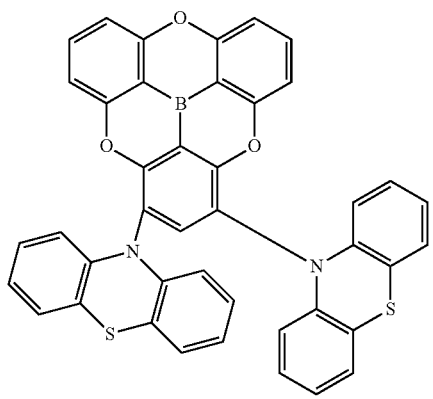
A-47
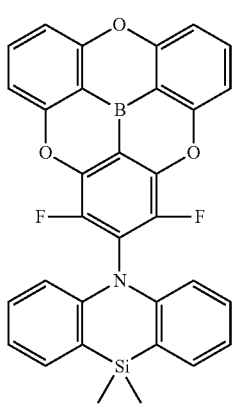
A-48
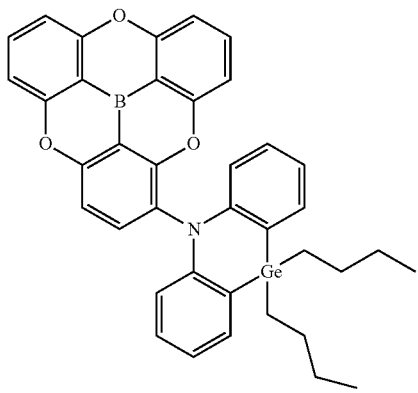
A-49
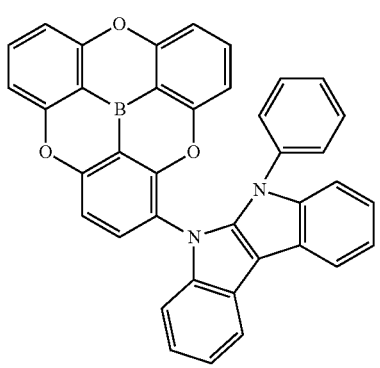
A-50
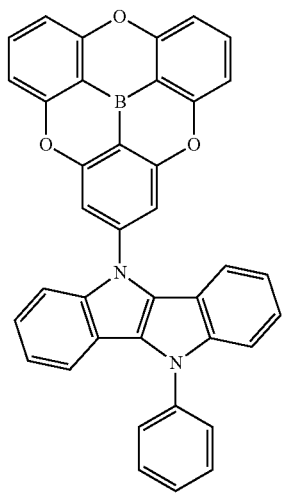
[Formula 20]
A-51
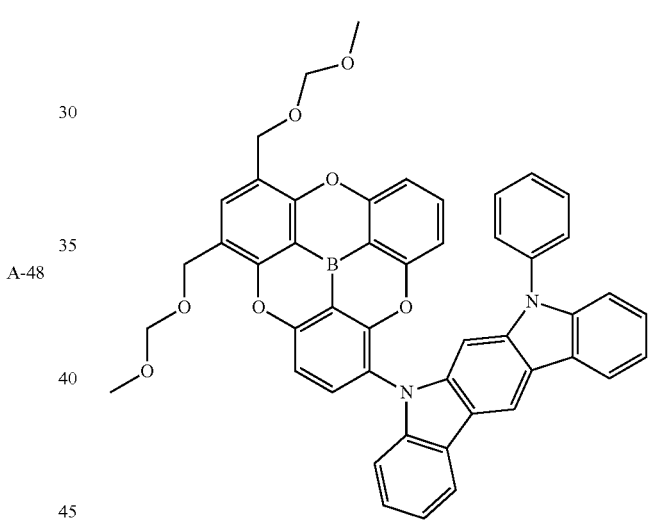
A-52
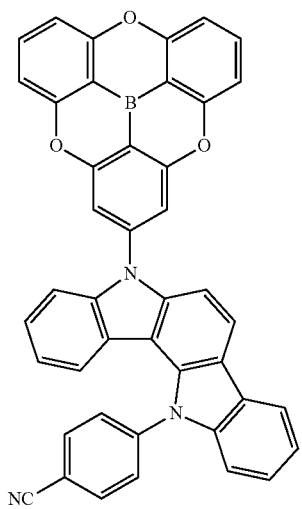

A-53
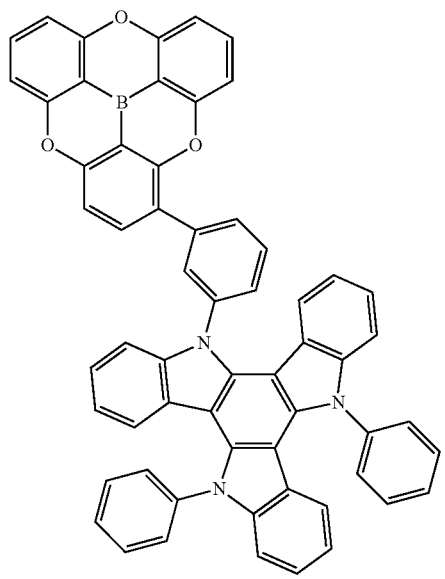
A-54
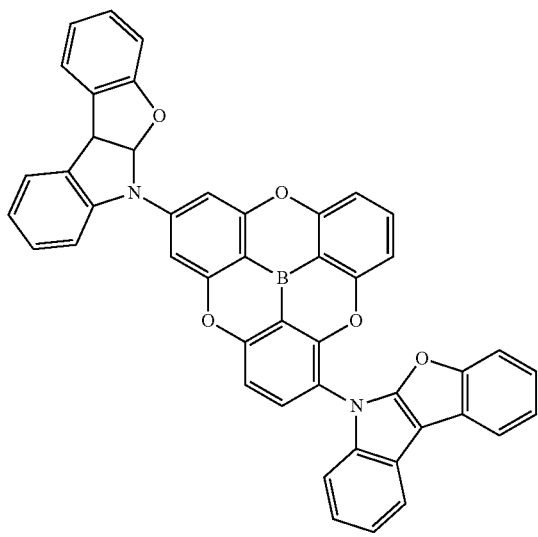
A-55
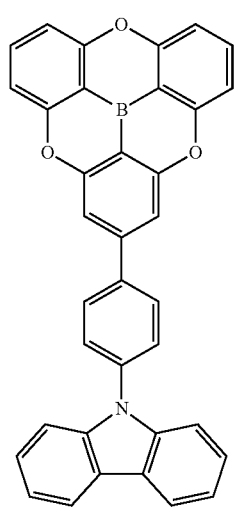
A-56
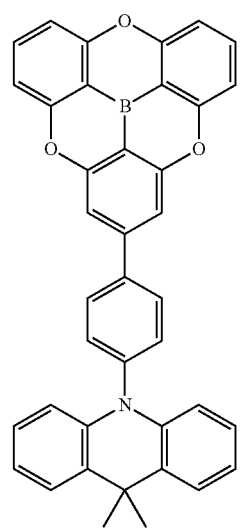
A-57
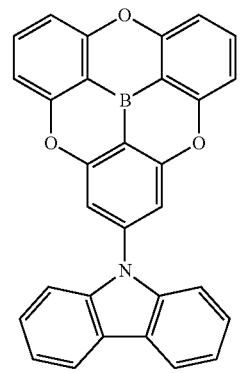
A-58
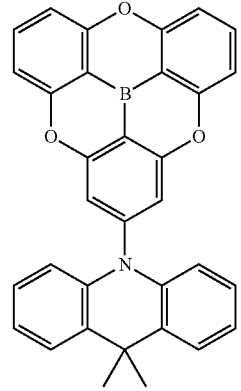

A-59
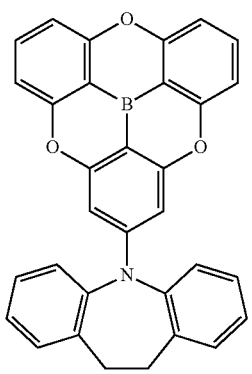
[Formula 21]
A-60
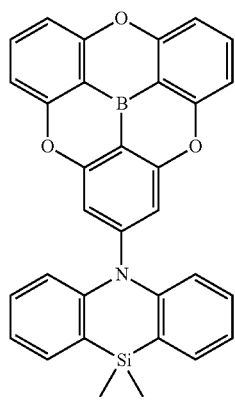
A-61
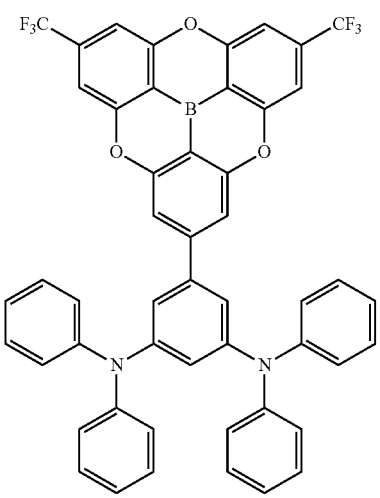
A-62
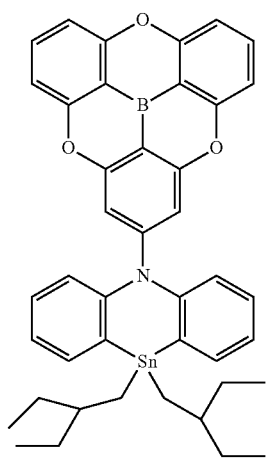
A-63
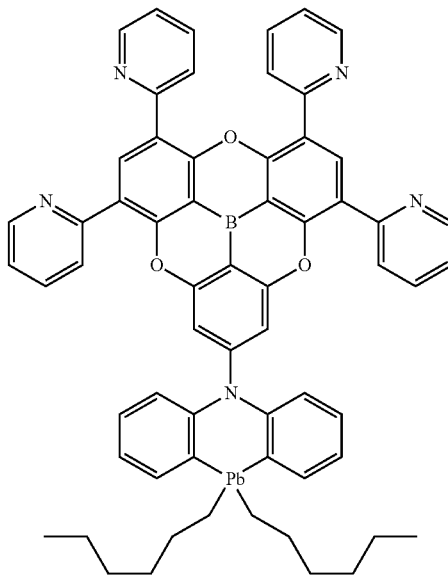
A-64
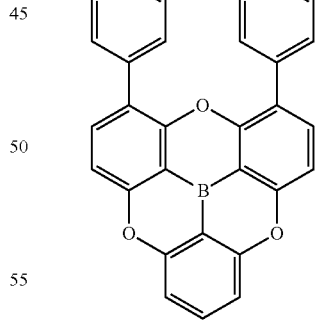
A-65
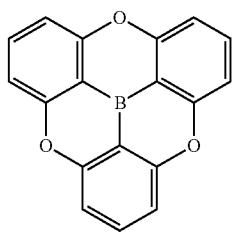

A-66 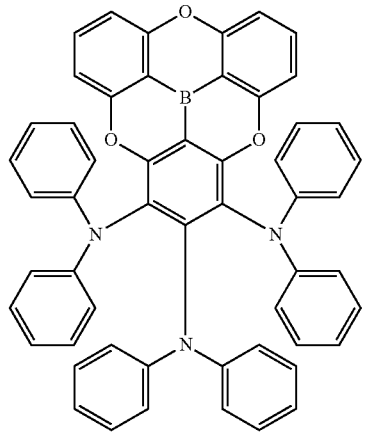
A-67 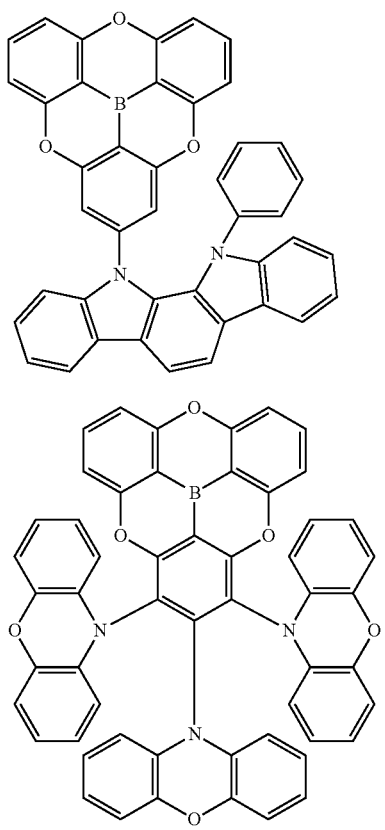
[Formula 22]
A-68 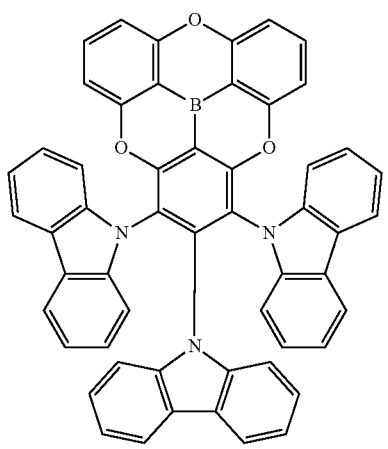
A-69 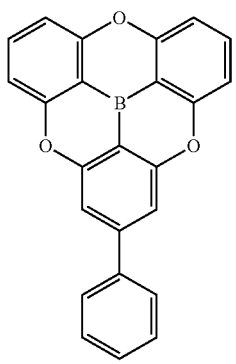
A-70 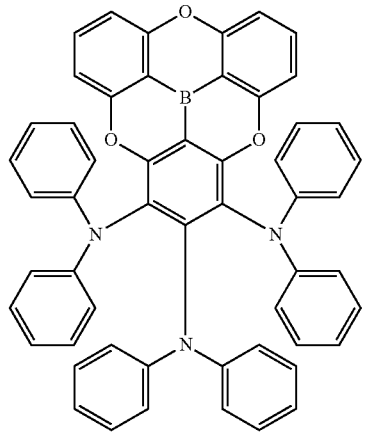
A-71 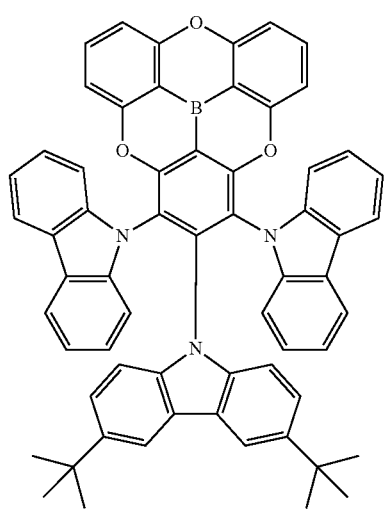
A-72 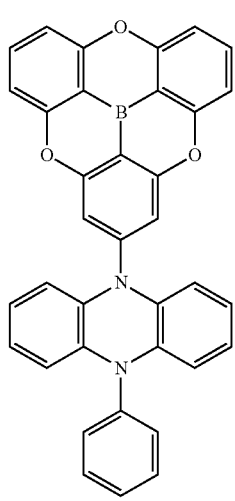

A-73
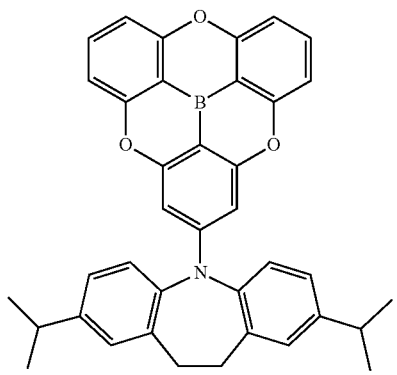
A-74
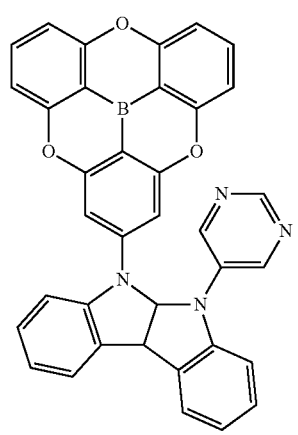
A-75
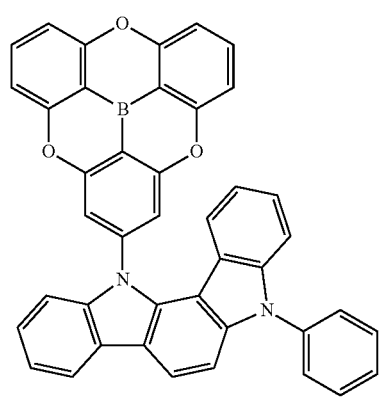
[Formula 23]
A-76
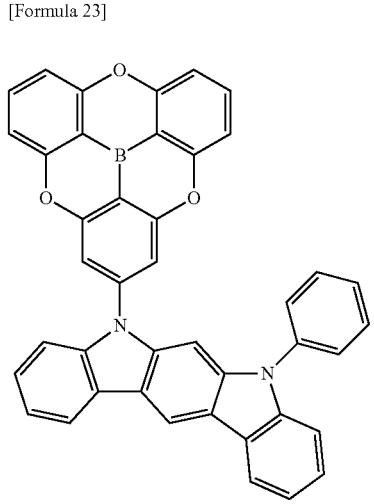
A-77
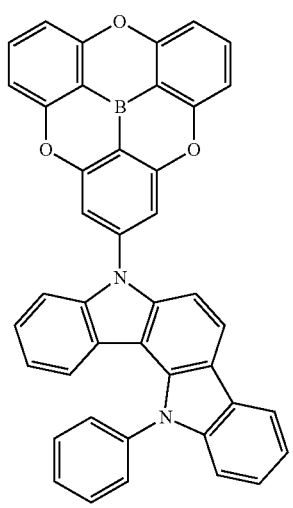
A-78
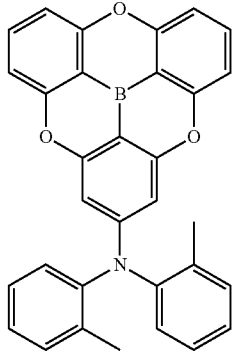

-continued
A-79
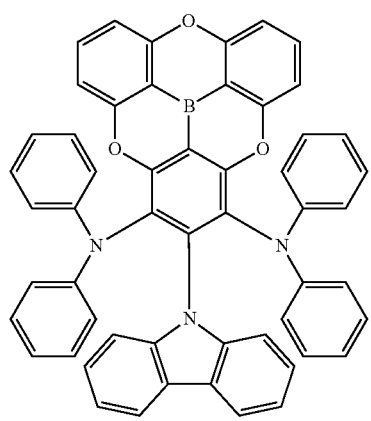
A-80
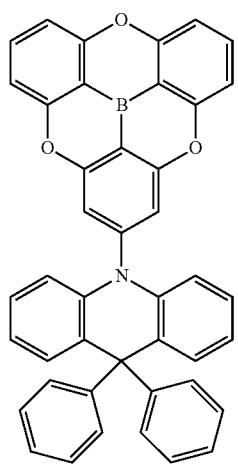
A-81
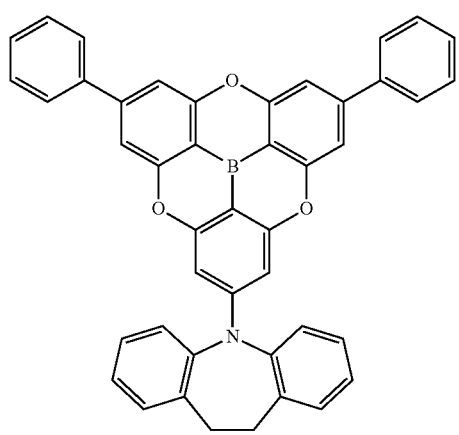
-continued
A-82
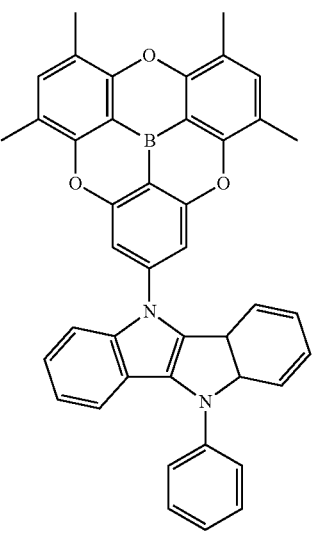
[Formula 24]
A-83
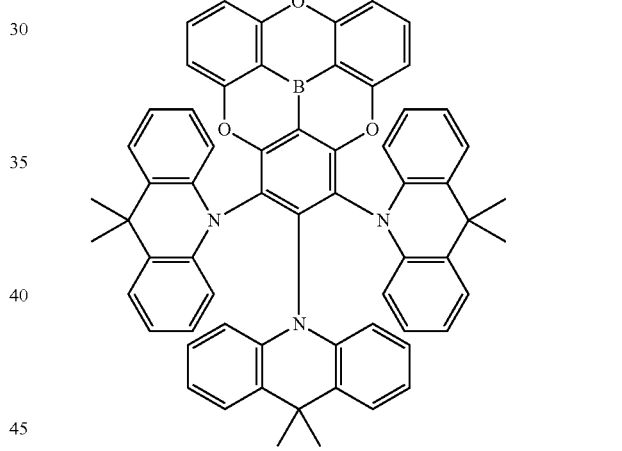
A-84
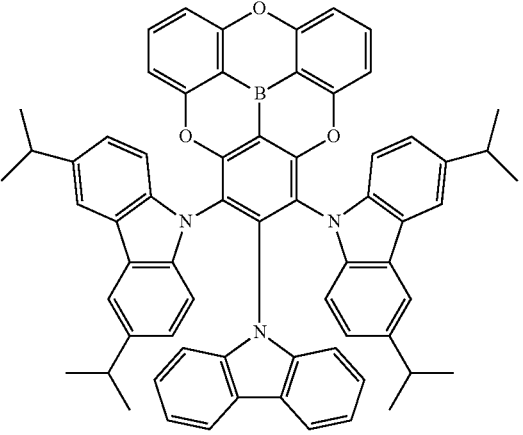

A-85
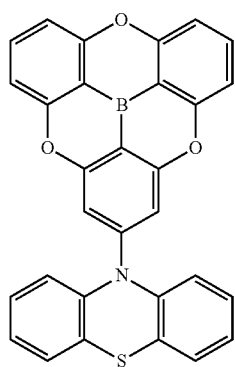
A-86
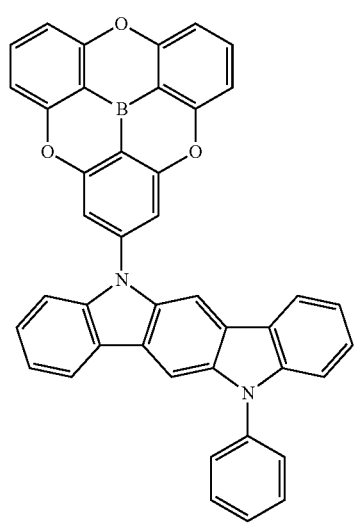
A-87
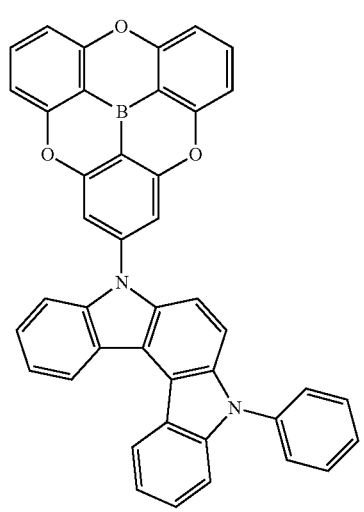
A-88
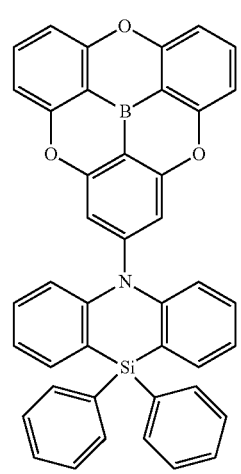
A-89
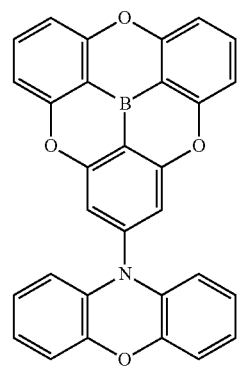
A-90
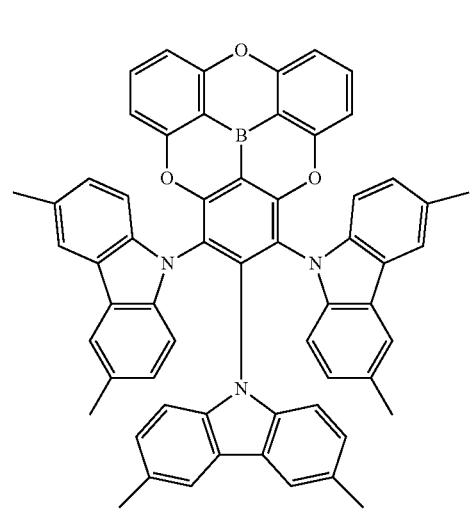

[Formula 25]
A-91
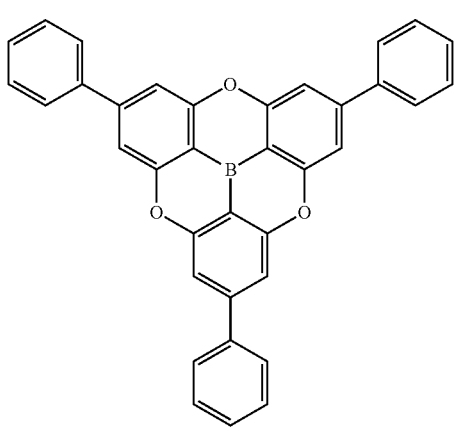
A-94
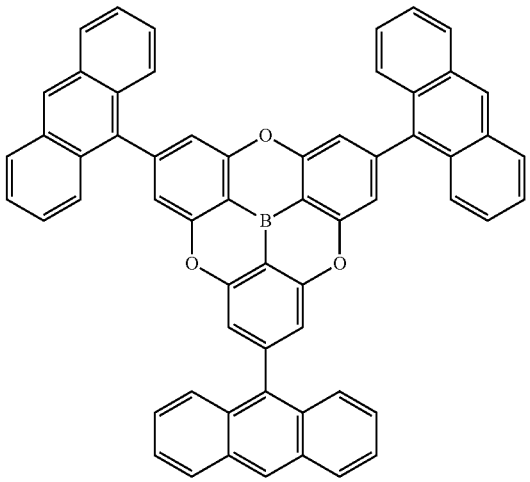
A-92
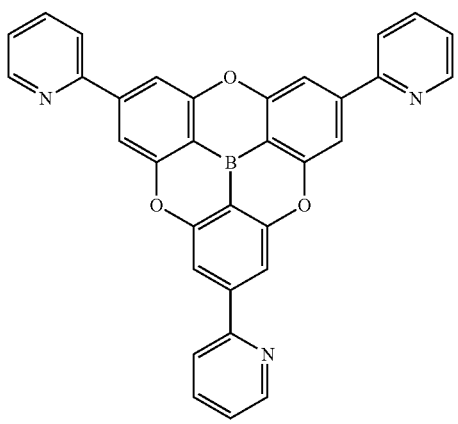
A-95
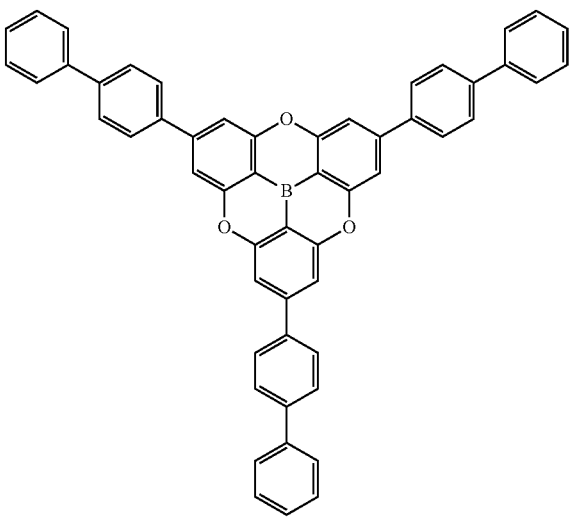
A-93
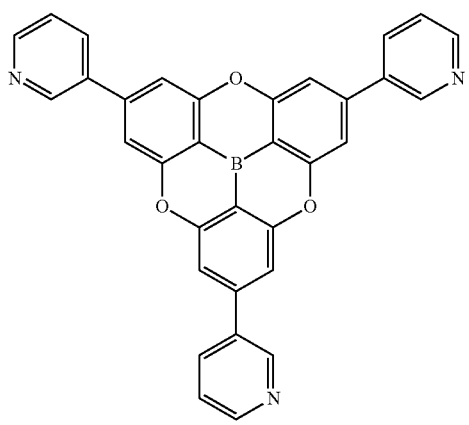
A-96
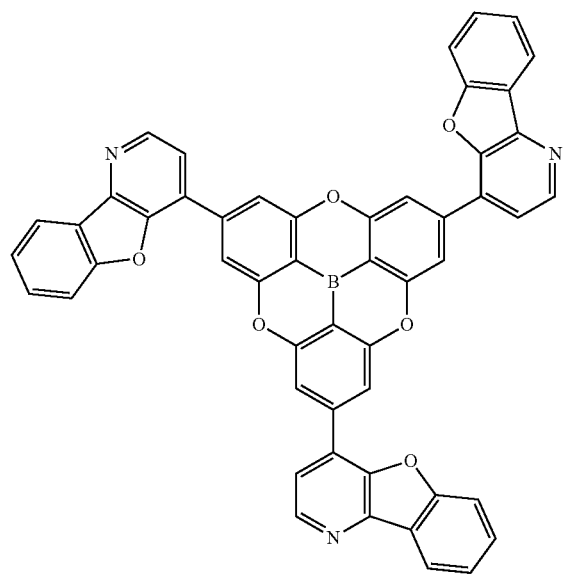

-continued

[Formula 26]

A-97

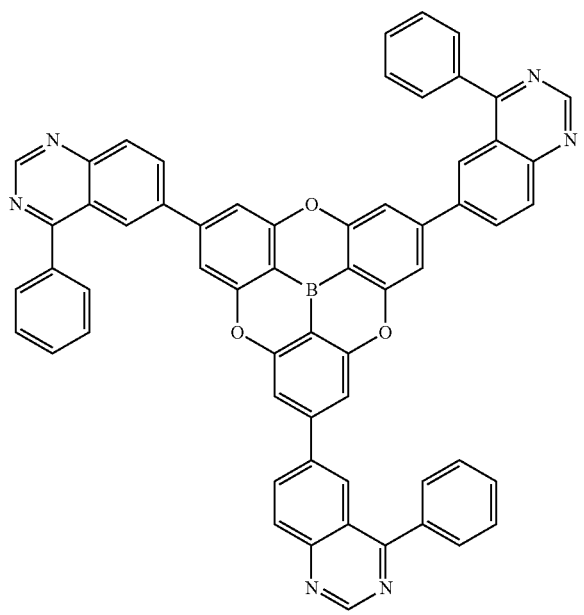

A-98

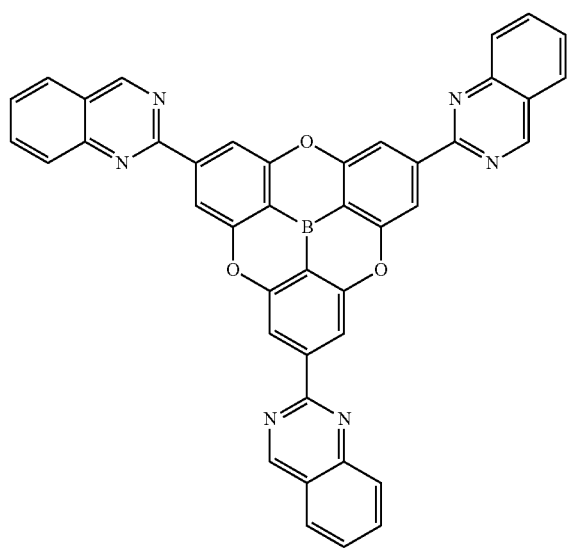

In the present invention, boron compounds are used as π-conjugated compounds. Boron compounds have excellent electron transportability and high emission efficiency, which are properties originally derived from boron. However, boron, which is a group 13 element, is an electron-deficient element having an empty p-orbital. Thus, boron is susceptible to attack by nucleophilic species and unstable. Incorporating boron into a carbon skeleton and carrying out full annulation in three directions around the boron makes the boron difficult to remove from the molecule. As a result, the thermal stability at high temperature can be improved without impairing the electron acceptability carried by boron. Such a boron compound has excellent electron transportability and high emission efficiency.

Further, incorporation of an electron-donating group in the π-conjugated boron compound enables stabilization of a charge separation state on a wide π-conjugate plane, and thus, the compound can be utilized as an acceptor unit for delayed fluorescence materials (TADF light-emitting materials).

The π-conjugated boron compound according to the present invention can be the aforementioned fluorescent compound in organic EL elements. The π-conjugated boron compound of the present invention also can be a host compound of organic EL elements. In this case, the light-emitting layer preferably contains the π-conjugated boron compound of the present invention and at least one of fluorescence-emitting compounds and phosphorescence-emitting compounds, from the viewpoint of high emission efficiency. Further, the π-conjugated boron compound of the present invention can be also used as the aforementioned assist dopant in organic EL elements. In this case, the light-emitting layer preferably contains the π-conjugated boron compound of the present invention, at least one of fluorescence-emitting compounds and phosphorescence-emitting compounds, and a host compound, from the viewpoint of high emission efficiency.

The π-conjugated boron compound according to the present invention, in which the absolute value of ΔEst aforementioned is 0.50 eV or less, is likely to exhibit a TADF property. Accordingly, the π-conjugated boron compound according to the present invention can be used in various application as a delayed fluorescent substance.

Further, the π-conjugated boron compound according to the present invention, which has a bipolar ability and can comply with various energy levels, can be used not only as a fluorescent compound, luminescent host, or assist dopant but also used as a compound suitable for hole transport and electron transport. Accordingly, the π-conjugated boron compound of the present invention is not limited to use in the light-emitting layer of organic EL elements and can be used for a hole injection layer, hole transport layer, electron blocking layer, hole blocking layer, electron transport layer, electron injection layer, intermediate layer described below, or the like.

The π-conjugated boron compound according to the present invention is a triarylborane, which, as clearly seen from the above general formula 1, has a structure obtained by incorporating boron into a carbon skeleton and carrying out full annulation in three directions around the boron and in which the rings around the boron contain single-bonded oxygen atoms or sulfur atoms. Conventional triarylboranes can stably exist only when there exist steric hindrance groups so as to surround the boron. In contrast, with respect to the π-conjugated boron compound according to the present invention, its disk shape and electron injection from three oxygen atoms or sulfur atoms, preferably oxygen atoms have resulted in a compound that is completely flat, is highly stable, and does not decompose even if heated in air. In the present invention, attention has been given on the interaction between tertiary amine, such as triarylamine, and nitrogen-containing aromatic heterocyclic rings, such as pyridine, based on the characteristics of the π-conjugated boron compound of being completely flat and having an electron-deficient empty orbital. Using this interaction and using the π-conjugated boron compound according to the present invention in combination with a hole transport material can improve hole transfer. It has been also found that using the π-conjugated boron compound according to the present invention in combination with an electron transport material improves electron transfer.

Figure 9:
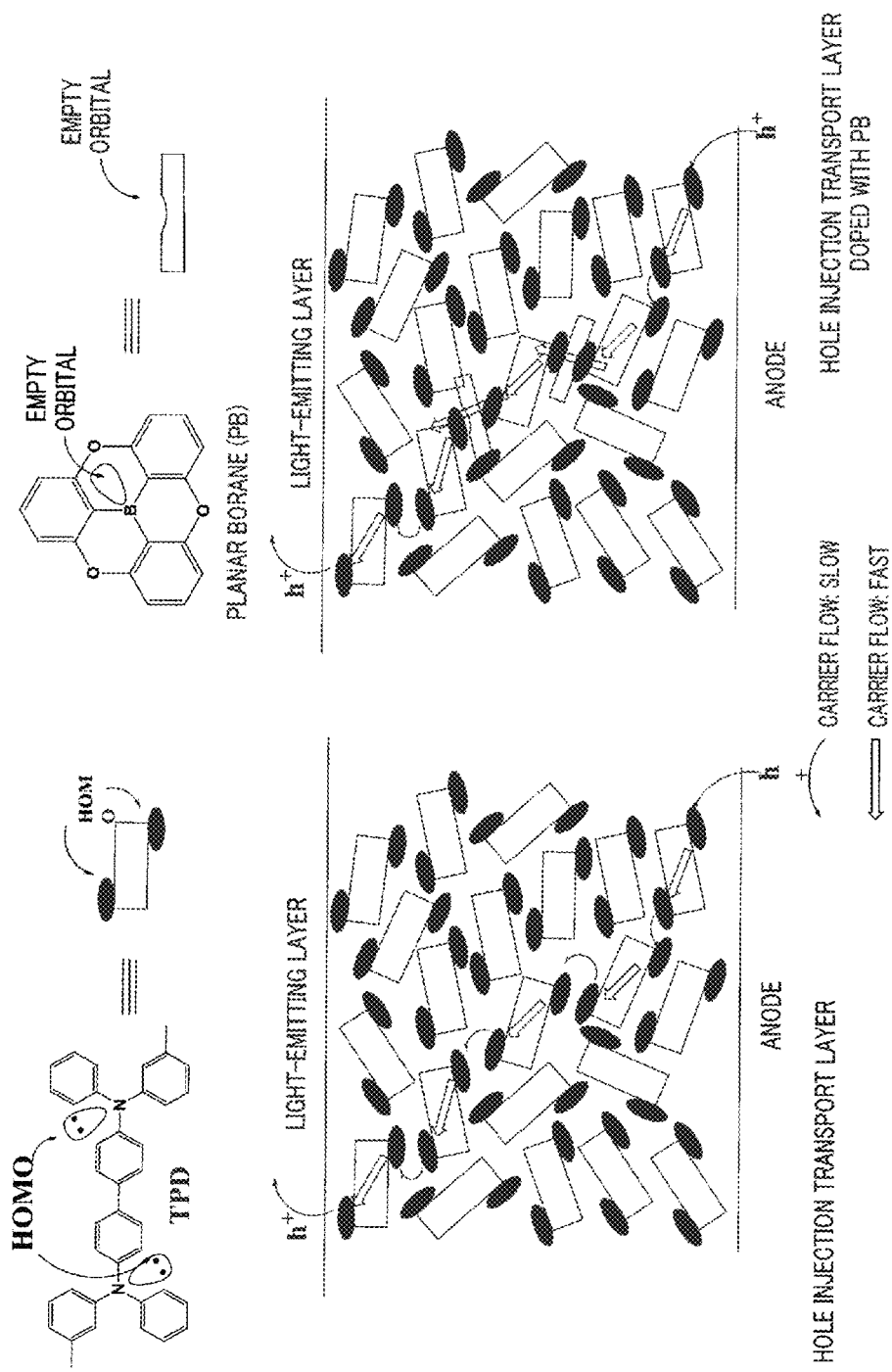
FIG. 9 is a schematic illustration of a hole transfer mechanism modeled after TPD.

A mechanism to improve hole transfer by combining the π-conjugated boron compound according to the present invention with a hole transport material can be considered as follows. A schematic illustration of a hole transfer mechanism modeled after TPD, which is a typical hole transport material, is shown in FIG. 9. As shown in FIG. 9, usually in hole transport, holes are transported by intermolecular hopping among amine moieties in which HOMOs exist. In consideration of a system in which the π-conjugated boron compound according to the present invention (hereinafter, frequently referred also to as "planar borane") is added to the mechanism, interaction between the amine moieties of the hole transport material and the planar borane takes place. Specifically, occurrence of electron transfer from the amine moieties to the planar borane (even in a state in which no electric field is applied) allows overwhelming repulsive force to act to thereby improve the hole transportability, compared with a simple system in which intermolecular hopping occurs among amine moieties.

Figure 10:
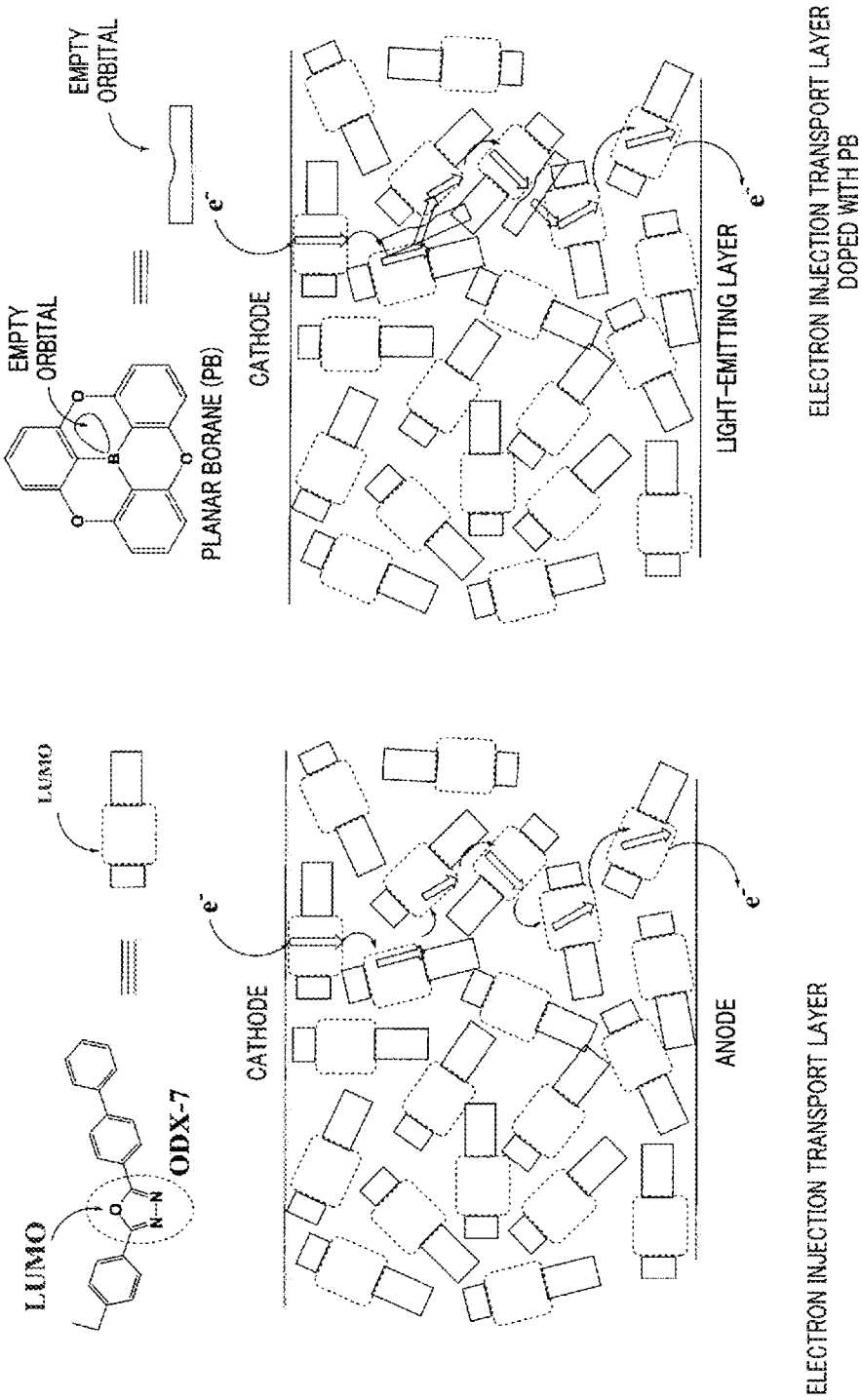
FIG. 10 is a schematic illustration of an electron transfer mechanism modeled after ODX-7.

Next, a mechanism to improve electron transport will be described. A schematic illustration of an electron transfer mechanism modeled after ODX-7, which is a typical electron transport material, is shown in FIG. 10. As shown in FIG. 10, usually in electron transport, electrons are transported by intermolecular hopping among aromatic heterocyclic rings in which LUMOs exist (oxazole moieties in ODX-7). In consideration of a system in which planar borane is added to the mechanism, interaction between the oxazole moieties and planar borane takes place. Specifically, occurrence of electron transfer from the oxazole moieties to the planar borane (even in a state in which no electric field is applied) allows overwhelming repulsive force to act to thereby improve the electron transportability, compared with a simple system in which intermolecular hopping occurs among oxazole moieties.

Figure 11:
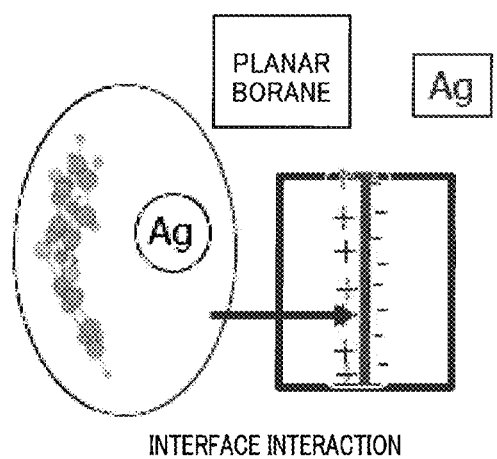
FIG. 11 is a schematic illustration of interface polarization.

Planar borane interact not only with amine compounds and nitrogen-containing aromatic heterocyclic rings but also with metals used in cathodes. Used in cathodes are metals having a small work function (see the description of cathodes described below). Particularly, aluminum, silver, and magnesium-silver alloys are commonly used in cathodes for organic EL elements. Since planar borane interacts also with these metals, when an organic layer containing the π-conjugated boron compound adjoins a cathode, interface polarization due to the interaction occurs on the interface between the cathode and the adjacent layer (see FIG. 11). This causes a decrease in the work function of a metal to enable electron injection to be accelerated.

The π-conjugated boron compound according to the present invention also can be used as a light-emitting thin film containing the π-conjugated boron compound.

1. Organic EL Element

<<Constituent Layers of Organic EL Element>>

The organic EL element of the present invention is an organic electroluminescent element including at least a light-emitting layer between an anode and a cathode, wherein at least one layer of the light-emitting layer contains the π-conjugated boron compound aforementioned. The organic EL element of the present invention may be suitably included in lighting apparatuses and display apparatuses.

Representative element configurations in the organic EL element of the present invention are, but not limited to, as follows.

(1) Anode/Light-emitting layer//Cathode (2) Anode/Light-emitting layer/Electron transport layer/Cathode (3) Anode/Hole transport layer/Light-emitting layer/Cathode (4) Anode/Hole transport layer/Light-emitting layer/Electron transport layer/Cathode (5) Anode/Hole transport layer/Light-emitting layer/Electron transport layer/Electron injection layer/Cathode (6) Anode/Hole injection layer/Hole transport layer/Light-emitting layer/Electron transport layer/Cathode (7) Anode/Hole injection layer/Hole transport layer/(Electron blocking layer/) Light-emitting layer/(Hole blocking layer/) Electron transport layer/Electron injection layer/Cathode Among the above, the configuration (7) is preferably used, but the structure is not limited thereto.

A light-emitting layer of the present invention is composed of a single layer or a plurality of layers. When the light-emitting layer is composed of a plurality of layers, a non-luminescent intermediate layer(s) may be disposed between light-emitting layers.

As required, a hole blocking layer (also referred to as a hole barrier layer) and/or an electron injection layer (also referred to as a cathode buffer layer) may be disposed between the light-emitting layer and a cathode. Further, an electron blocking layer (also referred to as an electron barrier layer) and/or a hole injection layer (also referred to as an anode buffer layer) may be disposed between the light-emitting layer and an anode.

An electron transport layer used for the present invention is a layer having a function of transporting electrons. The electron injection layer and the hole blocking layer are types of the electron transport layer in a broad sense. The electron transport layer may be composed of a plurality of layers.

A hole transport layer of the present invention is a layer having a function of transporting holes. The hole injection layer and the electron blocking layer are types of the hole transport layer in a broad sense. The electron transport layer may be composed of a plurality of layers.

In the representative element configuration described above, the layer from which the anode and the cathode are removed is also referred to as an "organic layer".

(Tandem Structure)

An organic EL element of the present invention may be so-called a tandem structure element in which a plurality of light-emitting units each containing at least one light-emitting layer are layered.

A representative element configuration of the tandem structure is, for example, the following configuration.

Anode/First Light-Emitting Unit/Intermediate Layer/Second Light-Emitting Unit/Intermediate Layer/Third Light-Emitting Unit/Cathode All the first light-emitting unit, second light-emitting unit, and third light-emitting unit described above may be the same or different from each other. Alternatively, two light-emitting units may be the same with the remaining one light-emitting unit different therefrom.

The light-emitting units may be laminated directly or may be laminated through an intermediate layer, which may be referred to as an intermediate electrode, an intermediate conductive layer, a charge generating layer, an electron drawing layer, a connecting layer, or an intermediate insulating layer. Any known material configuration can be used as long as a layer has a function of supplying electrons to an adjacent layer on the anode side and holes to an adjacent layer on the cathode side.

Examples of the material used for the intermediate layer include conductive inorganic compound layers of indium tin oxide (ITO), indium zinc oxide (IZO), $ZnO_2$, TiN, ZrN, HfN, TiOx, VOx, CuI, InN, GaN, $CuAlO_2$, $CuGaO_2$, $SrCu_2O_2$, $LaB_6$, $RuO_2$, and Al, two-layer films of $Au/Bi_2O_3$, multilayer films of $SnO_2/Ag/SnO_2$, $ZnO/Ag/ZnO$, $Bi_2O_3/Au/Bi_2O_3$, $TiO_2/TiN/TiO_2$, and $TiO_2/ZrN/TiO_2$, conductive organic substance layers of fullerenes such as fullerene $C_{60}$ and oligothiophene, and conductive organic compound layers of metal phthalocyanines, metal-free phthalocyanines, metal porphyrins, and metal-free porphyrins. The present invention is not limited thereto.

Examples of a preferable configuration in the light-emitting unit include those formed by removing the anode and the cathode from the representative element configurations (1) to (7) listed above, but the present invention is not limited thereto.

Specific examples of the tandem structure organic EL elements include, for example, the element structure and constituent materials disclosed in the following literature: U.S. Pat. Nos. 6,337,492, 7,420,203, 7,473,923, 6,872,472, 6,107,734, 6,337,492, WO2005/009087, Japanese Patent Application Laid-Open No. 2006-228712, Japanese Patent Application Laid-Open No. 2006-24791, Japanese Patent Application Laid-Open No. 2006-49393, Japanese Patent Application Laid-Open No. 2006-49394, Japanese Patent Application Laid-Open No. 2006-49396, Japanese Patent Application Laid-Open No. 2011-96679, Japanese Patent Application Laid-Open No. 2005-340187, Japanese Patent No. 4711424, Japanese Patent No. 3496681, Japanese Patent No. 3884564, Japanese Patent No. 4213169, Japanese Patent Application Laid-Open No. 2010-192719, Japanese Patent Application Laid-Open No. 2009-076929, Japanese Patent Application Laid-Open No. 2008-078414, Japanese Patent Application Laid-Open No. 2007-059848, Japanese Patent Application Laid-Open No. 2003-272860, Japanese Patent Application Laid-Open No. 2003-045676, WO2005/094130 and the like, but the present invention is not limited thereto.

Hereinafter, the layers constituting the organic EL element of the present invention will be described.

<<Light-Emitting Layer>>

The light-emitting layer used for the present invention is a layer which provides a place of light emission via excitons produced by recombination of electrons and holes injected from the electrodes or the adjacent layers. The luminescent portion may be either in the light-emitting layer or at an interface between the light-emitting layer and the adjacent layer. The configuration of the light-emitting layer used for the present invention is not particularly limited as long as it satisfies the requirements defined by the present invention.

The total thickness of the light-emitting layer(s) is not particularly limited, but is adjusted to be in preferably the range from 2 nm to 5 μm, more preferably the range from 2 nm to 500 nm, still more preferably the range from 5 nm to 200 nm from the viewpoints of homogeneity of layers formed, prevention of application of an unnecessarily high voltage during light emission, and increase in stability of emission colors against drive current.

The thickness of each light-emitting layer used for the present invention is adjusted to be in preferably the range from 2 nm to 1 μm, more preferably the range from 2 nm to 200 nm, still more preferably the range from 3 nm to 150 nm.

The light-emitting layer used for the present invention may be a single layer or may be constituted by a plurality of layers. When the π-conjugated boron compound of the present invention is used for the light-emitting layer, the compound may be singly used or may be used in mixture with a host material, a fluorescent material, a phosphorescent material and the like described below. At least one layer of the light-emitting layers preferably contains a luminescent dopant (also referred to as a luminescent compound, a light-emitting dopant, or simply a dopant) and further contains a host compound (also referred to as a matrix material, a luminescent host compound, or simply a host). The π-conjugated boron compound of the present invention is preferred because at least one layer of the light-emitting layer contains the π-conjugated boron compound of the present invention and a host compound to thereby improve the emission efficiency. At least one layer of the light-emitting layer preferably contains the π-conjugated boron compound of the present invention and at least one of fluorescence-emitting compounds and phosphorescence-emitting compounds because the emission efficiency will be improved. At least one layer of the light-emitting layer preferably contains the π-conjugated boron compound of the present invention, at least one of fluorescence-emitting compounds and phosphorescence-emitting compounds, and a host compound because the emission efficiency will be improved.

(1.1) Luminescent Dopant

As the luminescent dopant, a fluorescence-emitting dopant (also referred to as a fluorescence-emitting compound or fluorescent dopant) and a phosphorescence-emitting dopant (also referred to as a phosphorescence-emitting compound or phosphorescent dopant) are preferably used. In the present invention, the light-emitting layer contains the π-conjugated boron compound according to the present invention as a fluorescence-emitting compound or assist dopant in the range of 0.1 to 50 mass % and preferably particularly in the range of 1 to 30 mass %.

In the present invention, the light-emitting layer contains the luminescent compound in the range of 0.1 to 50 mass % and particularly preferably in the range of 1 to 30 mass %.

The concentration of the luminescent compound in the light-emitting layer may be arbitrarily determined based on the specific luminescent compound employed and the requirements of the device. The concentration of the luminescent compound may be contained at a homogeneous concentration in the thickness direction of the light-emitting layer or may have any concentration distribution.

As the luminescent compound used for the present invention, a plurality of luminescent compounds may be used in combination. A combination of fluorescence-emitting compounds having different structures or a combination of a fluorescence-emitting compound and a phosphorescence-emitting compound may be used. Any emission color can be obtained thereby.

When the light-emitting layer contains the π-conjugated boron compound according to the present invention, in which the absolute value of the energy difference between the lowest excited singlet energy level and the lowest excited triplet energy level (ΔEst) is 0.50 eV or less, a luminescent compound, and a host compound, the π-conjugated boron compound according to the present invention serves as an assist dopant. In contrast, when the light-emitting layer contains the π-conjugated boron compound according to the present invention and a luminescent compound and contains no host compound, the π-conjugated boron compound according to the present invention serves as a host compound. When the light-emitting layer contains only the π-conjugated boron compound according to the present invention, the π-conjugated boron compound according to the present invention serves both as a host compound and a luminescent compound.

The mechanism by which the effects of the present invention are exerted is the same in any case and is based on conversion of triplet excitons generated on the π-conjugated boron compound according to the present invention into single excitons through reverse intersystem crossing (RISC).

Accordingly, the overall exciton energy generated on the π-conjugated boron compound according to the present invention can theoretically undergo fluorescence resonance energy transfer (FRET) to a luminescent compound, resulting in high light emission efficiency.

Thus, when the light-emitting layer contains three components: the π-conjugated boron compound according to the present invention, a luminescent compound, and a host compound, the energy levels $S_1$ and $T_1$ of the π-conjugated boron compound are preferably lower than the energy levels $S_1$ and $T_1$ of the host compound and higher than the energy levels $S_1$ and $T_1$ of the luminescent compound.

Similarly, when the light-emitting layer contains two components: the π-conjugated boron compound according to the present invention and a luminescent compound, the energy levels $S_1$ and $T_1$ of the π-conjugated boron compound are preferably higher than the energy levels $S_1$ and $T_1$ of the luminescent compound.

Figure 2:
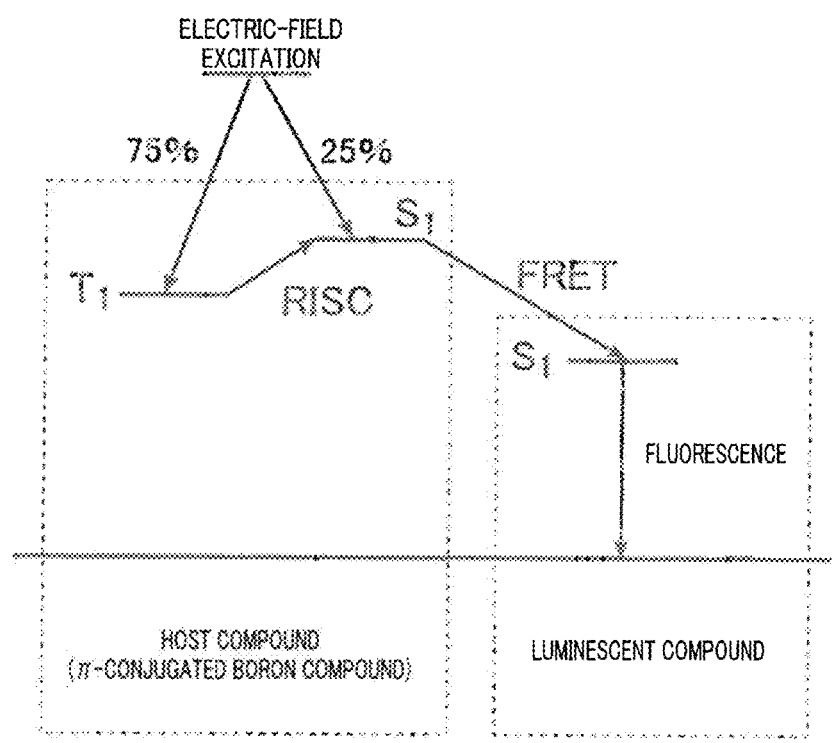
FIG. 2 is a schematic illustration of an energy diagram when the π-conjugated boron compound serves as a host material.

FIG. 1 schematically illustrates the case where the π-conjugated boron compound of the present invention serves as an assist dopant, and FIG. 2 schematically illustrates the case where the compound serves as a host compound. FIGS. 1 and 2 are exemplary. The generation process of triplet excitons generating on the π-conjugated boron compound according to the present invention is not only through electric-field excitation but also through energy transfer or electron transfer in the light-emitting layer or from the interface between the light-emitting layer and a layer adjacent thereto.

Although FIGS. 1 and 2 illustrate the case where the light-emitting material is a fluorescence-emitting compound, the light-emitting material is not limited thereto. A phosphorescence-emitting compound may be used or both a fluorescence-emitting compound and a phosphorescence-emitting compound may be used.

When the π-conjugated boron compound according to the present invention is used as an assist dopant, the light-emitting layer preferably contains a host compound in an amount of 100% or more by mass ratio relative to the π-conjugated boron compound, and a fluorescence-emitting compound and/or a phosphorescence-emitting compound in an amount of 0.1 to 50% by mass ratio relative to the π-conjugated boron compound.

When the π-conjugated boron compound according to the present invention is used as a host compound, the light-emitting layer preferably contains a fluorescence-emitting compound and/or a phosphorescence-emitting compound in an amount of 0.1 to 50% by mass ratio relative to the π-conjugated boron compound.

When the π-conjugated boron compound according to the present invention is used as an assist dopant or a host compound, the emission spectrum of the π-conjugated boron compound according to the present invention and the absorption spectrum of the luminescent compound preferably overlap each other.

Figure 3:
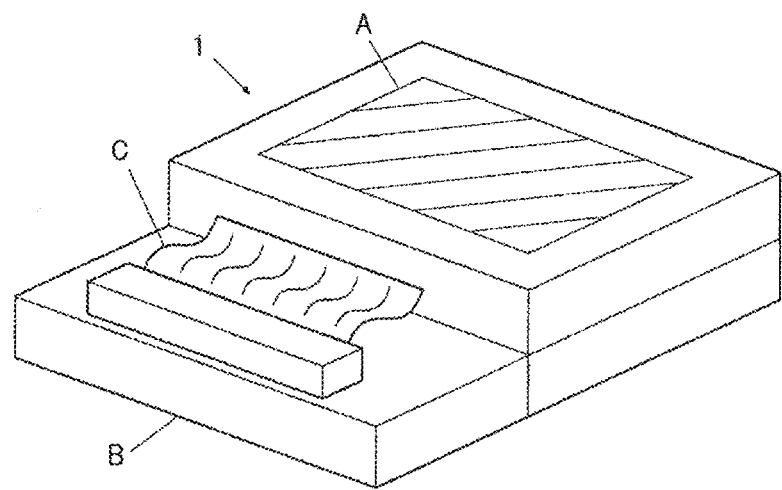
FIG. 3 is a schematic illustration of one exemplary display apparatus constituted by the organic EL element.

Emission colors of an organic EL element of the present invention or the compound used for the present invention are determined by applying results obtained with a CS-1000 Spectroradiometer (produced by Konica Minolta Inc.) to the CIE chromaticity coordinates in FIG. 3.16 on page 108 of "Shinpen Shikisai Kagaku Handobukku (New Edition Handbook of Color Science)" (edited by The Color Science Association of Japan, University of Tokyo Press, 1985).

In the present invention, one or more light-emitting layers preferably contain luminescent dopants having different emission colors so that white light is preferably emitted.

A combination of luminescent dopants emitting white light is not particularly limited, and examples thereof include combinations of: blue and orange; and blue, green and red or the like.

The "white" in an organic EL element of the present invention preferably shows chromaticity in the region of x=0.39±0.09 and y=0.38±0.08 in the CIE 1931 Color Specification System at 1,000 $cd/m^2$, when 2-degree viewing angle front luminance is measured by the method aforementioned.

(1.2) Fluorescence-Emitting Dopant

As the fluorescence-emitting dopant (fluorescent dopant), the π-conjugated boron compound of the present invention may be used. Alternatively, the dopant may be appropriately selected and used from known fluorescent dopants or delayed fluorescent dopants used for light-emitting layers of organic EL elements.

Specific examples of known fluorescent dopants that can be used for the present invention include anthracene derivatives, pyrene derivatives, chrysene derivatives, fluoranthene derivatives, perylene derivatives, fluorene derivatives, arylacetylene derivatives, styrylarylene derivatives, styrylamine derivatives, arylamine derivatives, boron complexes, coumarin derivatives, pyran derivatives, cyanine derivatives, croconium derivatives, squarylium derivatives, oxobenzanthracene derivatives, fluorescein derivatives, rhodamine derivatives, pyrylium derivatives, perylene derivatives, polythiophene derivatives, and rare earth complex compounds. In recent years, luminescent dopants making use of delayed fluorescence have been developed, and these may be used. Specific examples of the luminescent dopants making use of delayed fluorescence are compounds described in, for example, WO 2011/156793, Japanese Patent Application Laid-Open Nos. 2011-213643 and 2010-93181, Japanese Patent No. 5366106 and the like, but the present invention is not limited thereto.

(1.3) Phosphorescence-Emitting Dopant

The phosphorescence-emitting dopant used for the present invention will be described.

The phosphorescence-emitting dopant used for the present invention is a compound in which the light emission from excited triplets can be observed and, specifically, a compound that emits phosphorescence at room temperature (25° C.). The compound is defined as a compound having a phosphorescence quantum efficiency of 0.01 or more at 25° C., and the phosphorescence quantum efficiency is preferably 0.1 or more.

The phosphorescence quantum efficiency described above can be measured by a method described on page 398 of Bunko II of Dai 4 Han Jikken Kagaku Koza 7 (Spectroscopy II of Lecture of Experimental Chemistry vol. 7, 4th edition) (1992, published by Maruzen Co., Ltd.). The phosphorescence quantum efficiency in a solution can be measured by using various solvents. It is only necessary for the phosphorescent dopant used for the present invention to exhibit the above phosphorescence quantum efficiency (0.01 or more) in any of the solvents.

The phosphorescent dopant can be appropriately selected and used from known phosphorescent dopants used for light-emitting layers of organic EL elements. Specific examples of the known phosphorescent dopants usable in the present invention include compounds described in the following literatures.

Nature 395, 151(1998), Appl. Phys. Lett. 78, 1622(2001), Adv. Mater. 19, 739(2007), Chem. Mater. 17, 3532(2005), Adv. Mater. 17, 1059(2005), WO2009/100991, WO2008/101842, WO2003/040257, US Patent Application Laid- Open No. 2006-835469, US Patent Application Laid-Open No. 2006-0202194, US Patent Application Laid-Open No. 2007-0087321, US Patent Application Laid-Open No. 2005-0244673, Inorg. Chem. 40, 1704(2001), Chem. Mater. 16, 2480(2004), Adv. Mater. 16, 2003(2004), Angew. Chem. Int. Ed. 2006, 45, 7800, Appl. Phys. Lett. 86, 153505(2005), Chem. Lett. 34, 592(2005), Chem. Commun. 2906(2005), Inorg. Chem. 42, 1248(2003), WO2009/050290, WO2002/015645, WO2009/000673, US Patent Application Laid-Open No. 2002-0034656, U.S. Pat. No. 7,332,232, US Patent Application Laid-Open No. 2009-0108737, US Patent Application Laid-Open No. 2009-0039776, U.S. Pat. Nos. 6,921,915, 6,687,266, US Patent Application Laid-Open No. 2007-0190359, US Patent Application Laid-Open No. 2006-0008670, US Patent Application Laid-Open No. 2009-0165846, US Patent Application Laid-Open No. 2008-0015355, U.S. Pat. Nos. 7,250,226, 7,396,598, US Patent Application Laid-Open No. 2006-0263635, US Patent Application Laid-Open No. 2003-0138657, US Patent Application Laid-Open No. 2003-0152802, U.S. Pat. No. 7,090,928, Angew. Chem. Int. Ed. 47, 1(2008), Chem. Mater. 18, 5119(2006), Inorg. Chem. 46, 4308(2007), Organometallics 23, 3745(2004), Appl. Phys. Lett. 74, 1361 (1999), WO2002/002714, WO2006/009024, WO2006/056418, WO2005/019373, WO2005/123873, WO2005/123873, WO2007/004380, WO2006/082742, US Patent Application Laid-Open No. 2006-0251923, US Patent Application Laid-Open No. 2005/0260441, U.S. Pat. Nos. 7,393,599, 7,534,505, 7,445,855, US Patent Application Laid-Open No. 2007/0190359, US Patent Application Laid-Open No. 2008/0297033, U.S. Pat. No. 7,338,722, US Patent Application Laid-Open No. 2002-0134984, U.S. Pat. No. 7,279,704, US Patent Application Laid-Open No. 2006-098120, US Patent Application Laid-Open No. 2006-103874, WO2005/076380, WO2010/032663, WO2008/140115, WO2007/052431, WO2011/134013, WO2011/157339, WO2010/086089, WO2009/113646, WO2012/020327, WO2011/051404, WO2011/004639, WO2011/073149, US Patent Application Laid-Open No. 2012-228583, US Patent Application Laid-Open No. 2012-212126, Japanese Patent Application Laid-Open No. 2012-069737, Japanese Patent Application Laid-Open No. 2012-195554, Japanese Patent Application Laid-Open No. 2009-114086, Japanese Patent Application Laid-Open No. 2003-81988, Japanese Patent Application Laid-Open No. 2002-302671, Japanese Patent Application Laid-Open No. 2002-363552 and the like.

Of these, preferable phosphorescent dopants include an organic metal complex having Ir as central metal. More preferably, a complex containing at least one coordination mode of a metal-carbon bond, metal-nitrogen bond, metal-oxygen bond, or metal-sulfur bond.

(2) Host Compound

The host compound used for the present invention is a compound which is mainly responsible for injecting and transporting charges in the light-emitting layer. In an organic EL element, light emission from the host compound itself is not observed substantially.

The host compound in the layer preferably has a mass ratio of 20% or more relative to the compounds contained in the light-emitting layer.

The host compound may be singly used or two or more thereof may be used in combination. Use of a plurality of host compounds enables adjustment of charge transfer, thereby increasing the efficiency of an organic electroluminescent element.

A host compound preferably used for the present invention will be described hereinbelow.

As the host compound, a π-conjugated boron compound of the present invention as described above may be used, and the host compound is not particularly limited. From the viewpoint of a reverse energy transfer, those having excited energy higher than the excited singlet energy of the dopant are preferred, and those having excited triplet energy higher than the excited triplet energy of the dopant are more preferred.

The host compound, in a light-emitting layer, is responsible for transporting carriers and generating excitons. Thus, preferably, the host compound can exist stably in all of the active species of a cation radical state, anion radial state, and excited state and causes no chemical reactions such as decomposition and addition. Further, the host molecule preferably will not move in the layer at an Angstrom level when an electric current is applied.

In particular, when the luminescent dopant to be used in combination exhibits TADF emission, due to the long lifetime of the triplet excited state of the TADF compound, an appropriate design of a molecular structure is required to prevent the host compound from having a lower $T_1$ level such that the host compound has a high $T_1$ energy level; that the host compounds will not form a low $T_1$ state when associated with each other; that the TADF compound and the host compound will not form an exciplex; and that the host compound will not form an electromer by applying an electric field, for example.

In order to satisfy such requirements, it is required that: the host compound itself have a high electron hopping mobility; the host compound have a high hole hopping mobility; and the host compound have small structural change when it is brought into a triplet excited state. Examples of a representative host compound satisfying these requirements preferably include compounds having a high $T_1$ energy level, such as compounds having a carbazole skeleton, azacarbazole skeleton, dibenzofuran skeleton, dibenzothiophene skeleton, or azadibenzofuran skeleton.

The host compound preferably has a high glass transition temperature (Tg) from the viewpoints of having a hole transporting ability and an electron transporting ability, preventing lengthening of an emission wavelength, and additionally stably operating an organic electroluminescent element when the element is driven at high temperature or against heat generated while the element is driven. The compound has a Tg of 90° C. or more, more preferably of 120° C. or more.

The glass transition temperature (Tg) herein is a value obtained using differential scanning colorimetry (DSC) by a method in conformity to JIS-K-7121-2012.

Also as the host compound used for the present invention, the π-conjugated boron compound according to the present invention may be suitably used as aforementioned. This is because the π-conjugated boron compound according to the present invention, which has high $T_1$, can be suitably used for light-emitting materials having a short emission wavelength (i.e., high energy levels $T_1$ and $S_1$).

When a known host compound is used for the organic EL element of the present invention, specific examples thereof include compounds described in the following literatures, but the present invention is not limited thereto. Japanese Patent Application Laid-Open No. 2001-257076, Japanese Patent Application Laid-Open No. 2002-308855, Japanese Patent Application Laid-Open No. 2001-313179, Japanese Patent Application Laid-Open No. 2002-319491, Japanese Patent Application Laid-Open No. 2001-357977, Japanese Patent Application Laid-Open No. 2002-334786, Japanese Patent Application Laid-Open No. 2002-8860, Japanese Patent Application Laid-Open No. 2002-334787, Japanese Patent Application Laid-Open No. 2002-15871, Japanese Patent Application Laid-Open No. 2002-334788, Japanese Patent Application Laid-Open No. 2002-43056, Japanese Patent Application Laid-Open No. 2002-334789, Japanese Patent Application Laid-Open No. 2002-75645, Japanese Patent Application Laid-Open No. 2002-338579, Japanese Patent Application Laid-Open No. 2002-105445, Japanese Patent Application Laid-Open No. 2002-343568, Japanese Patent Application Laid-Open No. 2002-141173, Japanese Patent Application Laid-Open No. 2002-352957, Japanese Patent Application Laid-Open No. 2002-203683, Japanese Patent Application Laid-Open No. 2002-363227, Japanese Patent Application Laid-Open No. 2002-231453, Japanese Patent Application Laid-Open No. 2003-3165, Japanese Patent Application Laid-Open No. 2002-234888, Japanese Patent Application Laid-Open No. 2003-27048, Japanese Patent Application Laid-Open No. 2002-255934, Japanese Patent Application Laid-Open No. 2002-260861, Japanese Patent Application Laid-Open No. 2002-280183, Japanese Patent Application Laid-Open No. 2002-299060, Japanese Patent Application Laid-Open No. 2002-302516, Japanese Patent Application Laid-Open No. 2002-305083, Japanese Patent Application Laid-Open No. 2002-305084, Japanese Patent Application Laid-Open No. 2002-308837, US Patent Application Laid-Open No. 2003-0175553, US Patent Application Laid-Open No. 2006-0280965, US Patent Application Laid-Open No. 2005-0112407, US Patent Application Laid-Open No. 2009-0017330, US Patent Application Laid-Open No. 2009-0030202, US Patent Application Laid-Open No. 2005-0238919, WO2001/039234, WO2009/021126, WO2008/056746, WO2004/093207, WO2005/089025, WO2007/063796, WO2007/063754, WO2004/107822, WO2005/030900, WO2006/114966, WO2009/086028, WO2009/003898, WO2012/023947, Japanese Patent Application Laid-Open No. 2008-074939, Japanese Patent Application Laid-Open No. 2007-254297, EP No. 2034538, WO2011/055933, WO2012/035853 and the like. Hereinafter, as the host compound used in the present invention, specific examples of the host compound include, but not limited to, the compounds represented by H-1 to H230 described in paragraphs [0255] to [0293] of Japanese Patent Application Laid-Open No. 2015-38941 and a compound represented by chemical formula H-231 or H-234 below.

[Formula 27]

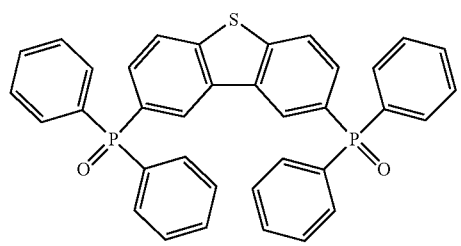

H-231

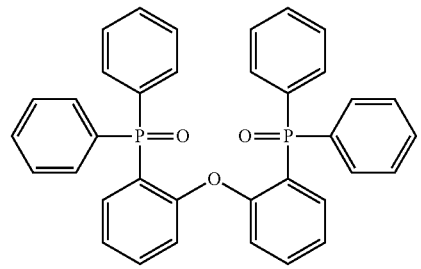

H-232

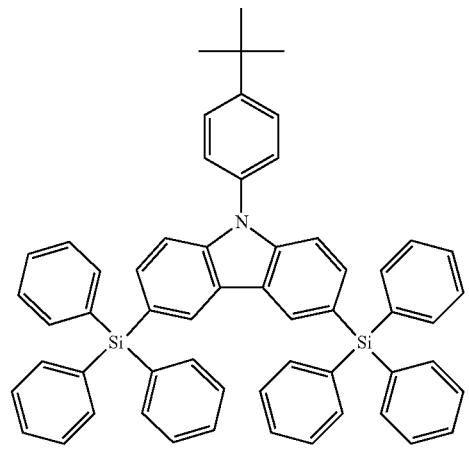

H-233

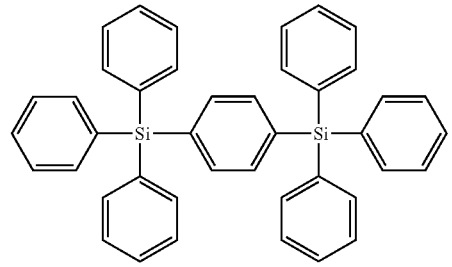

H-234

<<Electron Transport Layer>>

An electron transport layer in the present invention is only required to be composed of a material having a function of transporting an electron and have a function of transferring an injected electron from a cathode to a light-emitting layer.

A total layer thickness of the electron transport layer according to the present invention is not particularly limited. The total thickness is usually in the range of 2 nm to 5 μm, preferably in the range of 2 to 500 nm, more preferably in the range of 5 to 200 nm.

In an organic EL element, it is known that, at the moment of extracting light produced in the light-emitting layer from the electrode, there occurs interference between light directly extracted from the light-emitting layer and light extracted after reflected at the electrode located at the opposite side of the electrode from which the light is extracted. When light is reflected at the cathode, it is possible to use effectively this interference effect by suitably adjusting the total thickness of the electron transport layer in the range of several nm to several μm.

On the other hand, the voltage will be increased when the layer thickness of the electron transport layer is made thick. Therefore, especially when the layer thickness is large, the electron mobility in the electron transport layer is preferably $10^{-5}$ cm$^2$/Vs or more.

As a material used for an electron transport layer (hereinafter, referred to as an electron transport material), it is only required to have either a property of injecting or transporting electrons or a barrier property against holes. Any of the conventionally known compounds can be selected and used.

Examples of the material include nitrogen-containing aromatic heterocycle derivatives (carbazole derivatives, azacarbazole derivatives (formed such that one or more carbon atoms of a carbazole ring are substituted by a nitrogen atom(s)), pyridine derivatives, pyrimidine derivatives, pyrazine derivatives, pyridazine derivatives, triazine derivatives, quinoline derivatives, quinoxaline derivatives, phenanthroline derivatives, azatriphenylene derivatives, oxazole derivatives, thiazole derivatives, oxadiazole derivatives, thiadiazole derivatives, triazole derivatives, benzimidazole derivatives, benzoxazole derivatives, and benzothiazole derivatives), dibenzofuran derivatives, dibenzothiophene derivatives, silole derivatives, and aromatic hydrocarbon ring derivatives (naphthalene derivatives, anthracene derivatives, and triphenylene derivatives).

Further, metal complexes each having a ligand of a quinolinol skeleton or dibnenzoquinolinol skeleton such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, bis(8-quinolinol)zinc (Znq) and the like; and metal complexes each formed such that central metal of each of the above metal complexes is substituted by In, Mg, Cu, Ca, Sn, Ga, or Pb can also be used as an electron transport material.

Further, metal-free or metal phthalocyanine, or a phthalocyanine derivative whose terminal is substituted by an alkyl group, sulfonic acid group or the like can be preferably utilized as an electron transport material. In addition, a distyrylpyradine derivative which was cited as a light emitting material can be used as an electron transport material. Similarly to the case of a hole injection layer and to the case of a hole transfer layer, an inorganic semiconductor such as an n-type-Si and n-type-SiC can be also utilized as an electron transport material.

Polymer materials, in which these materials are introduced in a polymer chain or these materials form the main chain of a polymer, can be also utilized.

Examples of the electron transport material preferably used in combination with the π-conjugated boron compound according to the present invention can include compounds represented by the following formulas.

[Formula 28]

ET-1

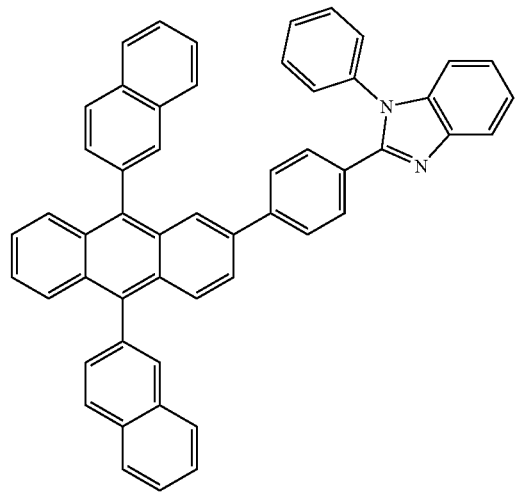

ET-2

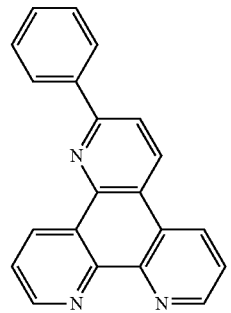

ET-3

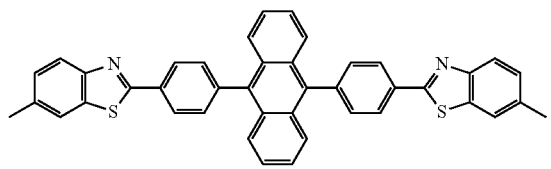

ET-4

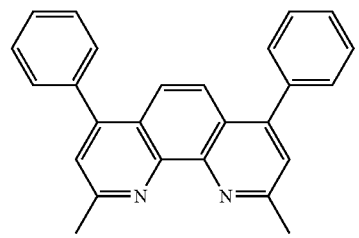

ET-5

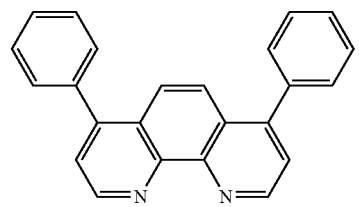

-continued

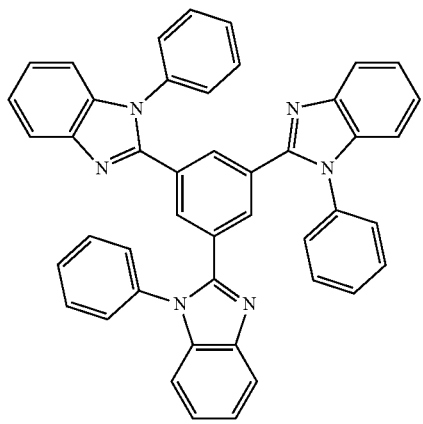
ET-6

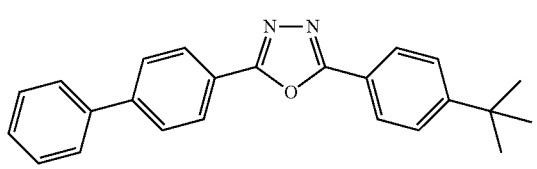
ET-7

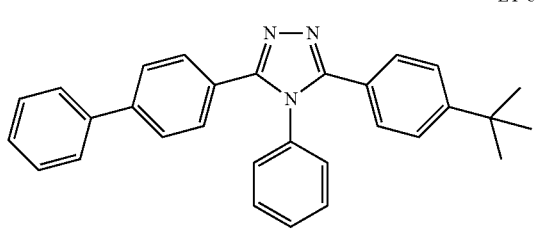
ET-8

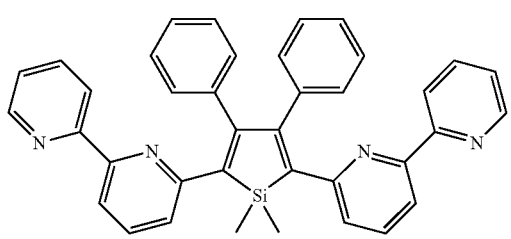
ET-9

In the electron transport layer according to the present invention, the electron transport layer may be doped with a doping material as a guest material so as to form an (electron-rich) electron transport layer having a high n property. Examples of the doping material include n-type dopants, for example, metal compounds such as a metal complex and a metal halide. Specific examples of the electron transport layer having such a configuration include those described in literatures such as Japanese Patent Application Laid-Open Nos. 4-297076, 10-270172, 2000-196140, and 2001-102175; and J. Appl. Phys., 95, 5773 (2004).

Specific examples of the known electron transport materials preferably used for an organic EL element of the present invention include compounds described in the following literatures, but the present invention is not limited thereto.

U.S. Pat. Nos. 6,528,187, 7,230,107, US Patent Application Laid-Open No. 2005-0025993, US Patent Application Laid-Open No. 2004-0036077, US Patent Application Laid-Open No. 2009-0115316, US Patent Application Laid-Open No. 2009-0101870, US Patent Application Laid-Open No. 2009-0179554, WO2003/060956, WO2008/132085, Appl. Phys. Lett. 75, 4(1999), Appl. Phys. Lett. 79, 449(2001), Appl. Phys. Lett. 81, 162(2002), Appl. Phys. Lett. 81, 162(2002), Appl. Phys. Lett. 79, 156(2001), U.S. Pat. No. 7,964,293, US Patent Application Laid-Open No. 2009-030202, WO2004/080975, WO2004/063159, WO2005/085387, WO2006/067931, WO2007/086552, WO2008/114690, WO2009/069442, WO2009/066779, WO2009/054253, WO2011/086935, WO2010/150593, WO2010/047707, EP No. 2311826, Japanese Patent Application Laid-Open No. 2010-251675, Japanese Patent Application Laid-Open No. 2009-209133, Japanese Patent Application Laid-Open No. 2009-124114, Japanese Patent Application Laid-Open No. 2008-277810, Japanese Patent Application Laid-Open No. 2006-156445, Japanese Patent Application Laid-Open No. 2005-340122, Japanese Patent Application Laid-Open No. 2003-45662, Japanese Patent Application Laid-Open No. 2003-31367, Japanese Patent Application Laid-Open No. 2003-282270, WO2012/115034 and the like.

Examples of a more preferably known electron transport material in the present invention include aromatic heterocyclic compounds containing at least one nitrogen atom and compounds containing a phosphorous atom, such as pyridine derivatives, pyrimidine derivatives, pyrazine derivatives, triazine derivatives, dibenzofuran derivatives, dibenzothiophene derivatives, azadibenzofuran derivatives, azadibenzothiophene derivatives, carbazole derivatives, azacarbazole derivatives, benzimidazole derivatives, and arylphosphine oxide derivatives.

The electron transport material may be singly used or two or more thereof may be used in combination.

<<Hole Blocking Layer>>

The hole blocking layer is a layer having a function of the electron transport layer in a broad sense. The hole blocking layer is preferably composed of a material having a function of transporting electrons with a small ability of transporting holes and can increase the recombination probability of electrons and holes by blocking holes while transporting electrons.

The configuration of the electron transport layer described above can be used for the hole blocking layer of the present invention as required.

The hole blocking layer disposed in an organic EL element of the present invention is preferably disposed adjacent to the light-emitting layer on the cathode side.

The thickness of the hole blocking layer according to the present invention is preferably in the range of 3 nm to 100 nm, more preferably in the range of 5 nm to 30 nm.

As the material used for the hole blocking layer, the materials used for the electron transport layer aforementioned are preferably used, and the materials used as the host compound aforementioned are also preferably used for the hole blocking layer.

<<Electron Injection Layer>>

The electron injection layer (also referred to as a "cathode buffer layer") of the present invention is a layer disposed between the cathode and the light-emitting layer for reduction in drive voltage and increase in emission luminance, which is detailed in Part 2, Chapter 2 "Denkyoku Zairyo (Electrode Material)" (pp. 123-166) of "Yuki EL Soshi To Sono Kogyoka Saizensen (Organic EL Element and Front of Industrialization thereof) (Nov. 30, 1998, published by N.T.S Co., Ltd.)".

In the present invention, the electron injection layer may be provided as required and, as described above, may be present between the cathode and the light-emitting layer or between the cathode and the electron transport layer.

The electron injection layer is preferably a very thin film. The thickness thereof is preferably in the range of 0.1 nm to 5 nm depending on the material thereof. The layer may be an inhomogeneous layer (film) in which the constituent material intermittently exists.

The electron injection layer is also detailed in Japanese Patent Application Laid-Open Nos. 6-325871, 9-17574, 10-74586 and the like, and specific examples of a material preferably used for the electron injection layer include metals represented by strontium and aluminum, alkali metal compounds represented by lithium fluoride, sodium fluoride, and potassium fluoride, alkali earth metal compounds represented by magnesium fluoride and calcium fluoride, metal oxides represented by aluminum oxide, and metal complexes represented by lithium 8-hydroxyquinolinate (Liq). The electron transport materials aforementioned may also be used therefor.

The materials used for the electron injection layer described above may be singly used or two or more thereof may be used in combination.

<<Hole Transport Layer>>

The hole transport layer in the present invention is composed of a material having a function of transporting holes and is only required to have a function of transmitting holes injected from the anode to the light-emitting layer.

The total thickness of the hole transport layer according to the present invention is not particularly limited and usually in the range of 5 nm to 5 μm, more preferably in the range 2 nm to 500 nm, still more preferably in the range of 5 nm to 200 nm.

The material used for the hole transport layer (hereinafter, referred to as the hole transport material) is only required to have either a property of injecting or transporting holes or a barrier property against electrons. Any of conventionally known compounds can be selected and used.

Examples thereof include porphyrin derivatives, phthalocyanine derivatives, oxazole derivatives, oxadiazole derivatives, triazole derivatives, imidazole derivatives, pyrazoline derivatives, pyrazolone derivatives, phenylenediamine derivatives, hydrazone derivatives, stilbene derivatives, polyarylalkane derivatives, triarylalkane derivatives, carbazole derivatives, indolocarbazole derivatives, isoindole derivatives, acene-based derivatives such as anthracene and naphthalene, fluorene derivatives, fluorenone derivatives, polyvinyl carbazole, polymers or oligomers in which aromatic amine is introduced to a main chain or a side chain, polysilane, and conductive polymers or oligomers (such as PEDOT/PSS, aniline-based copolymers, polyaniline, and polythiophene).

Examples of the triarylamine derivative include benzidine types represented by α-NPD (4,4'-bis[N-(1-naphthyl)-N-phenylamino]biphenyl), star-burst types represented by MTDATA, compounds having fluorenone or anthracene at a triarylamine linking core portion.

Hexaazatriphenylene derivatives described in Japanese Unexamined Patent Application Publication (Translation of PCT Application) No. 2003-519432, Japanese Patent Application Laid-Open No. 2006-135145 and the like can also be used as the hole transport material.

The hole transport layer doped with impurities, thereby having a high p property can also be used. Examples thereof include those described in Japanese Patent Application Laid-Open Nos. 4-297076, 2000-196140, and 2001-102175, and J. Appl. Phys., 95, 5773 (2004) and the like.

It is also possible to use so-called p-type hole transport materials described in literatures such as Japanese Patent Application Laid-Open No. 11-251067 and Appl. Phys. Lett. 80 (2002), p. 139 by J. Huang et al., and inorganic compounds such as a p-type-Si and a p-type-SiC. Further, an ortho-metalated organic metal complex having Ir or Pt as central metal, represented by Ir(ppy)3, is also preferably used.

The materials described above can be used as the hole transport material, and preferably used are triarylamine derivatives, carbazole derivatives, indolocarbazole derivatives, azatriphenylene derivatives, organic metal complexes, polymer materials or oligomers in which aromatic amine is introduced to a main chain or a side chain and the like.

Specific examples of the known hole transport materials preferably used in an organic EL element of the present invention also include compounds described in the following literatures in addition to the above literatures, but the present invention is not limited thereto.

For example, Appl. Phys. Lett. 69, 2160(1996), J. Lumin. 72-74, 985(1997), Appl. Phys. Lett. 78, 673(2001), Appl. Phys. Lett. 90, 183503(2007), Appl. Phys. Lett. 90, 183503 (2007), Appl. Phys. Lett. 51, 913(1987), Synth. Met. 87, 171(1997), Synth. Met. 91, 209(1997), Synth. Met. 111, 421(2000), SID Symposium Digest, 37, 923(2006), J. Mater. Chem. 3, 319(1993), Adv. Mater. 6, 677(1994), Chem. Mater. 15, 3148(2003), US Patent Application Laid-Open No. 2003-0162053, US Patent Application Laid-Open No. 2002-0158242, US Patent Application Laid-Open No. 2006-0240279, US Patent Application Laid-Open No. 2008-0220265, U.S. Pat. No. 5,061,569, WO2007/002683, WO2009/018009, EP No. 650955, US Patent Application Laid-Open No. 2008-0124572, US Patent Application Laid-Open No. 2007-0278938, US Patent Application Laid-Open No. 2008-0106190, US Patent Application Laid-Open No. 2008-0018221, WO2012/115034, Japanese Unexamined Patent Application Publication (Translation of PCT Application) No. 2003-519432, Japanese Patent Application Laid-Open No. 2006-135145, Japanese Patent Application No. 13-585981 and the like.

Examples of the hole transport material preferably used in combination with the π-conjugated boron compound according to the present invention can include compounds represented by the following formulas.

[Formula 29]

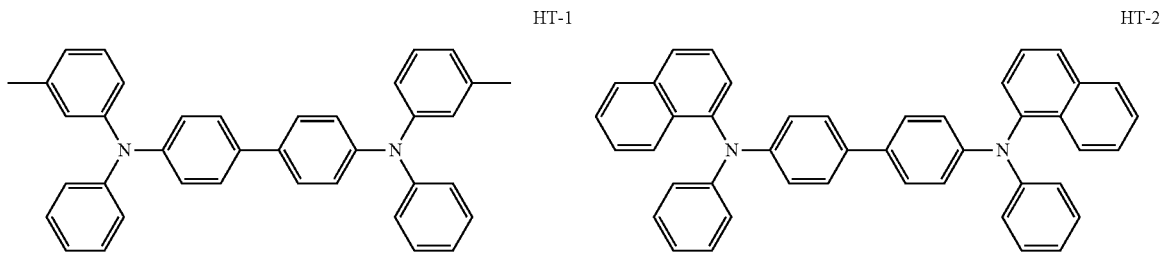

HT-1    HT-2

-continued
HT-3
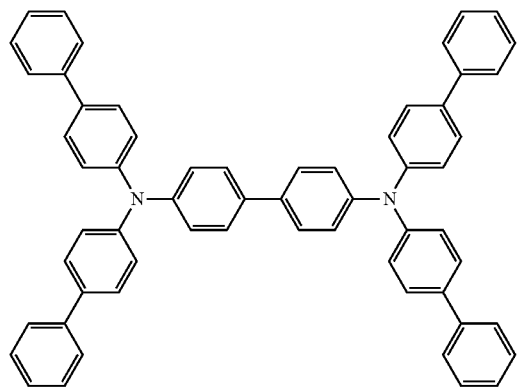
HT-4
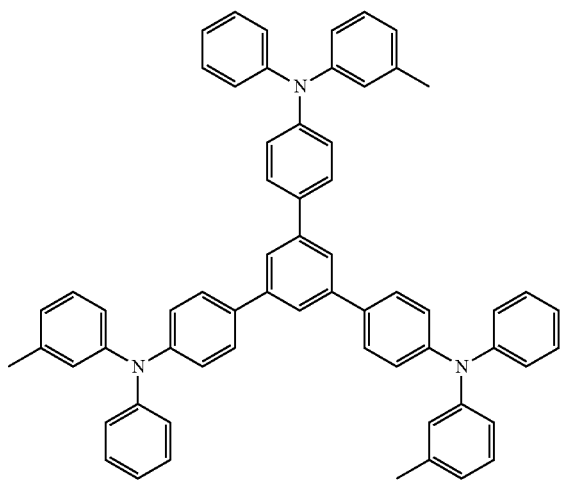
HT-5
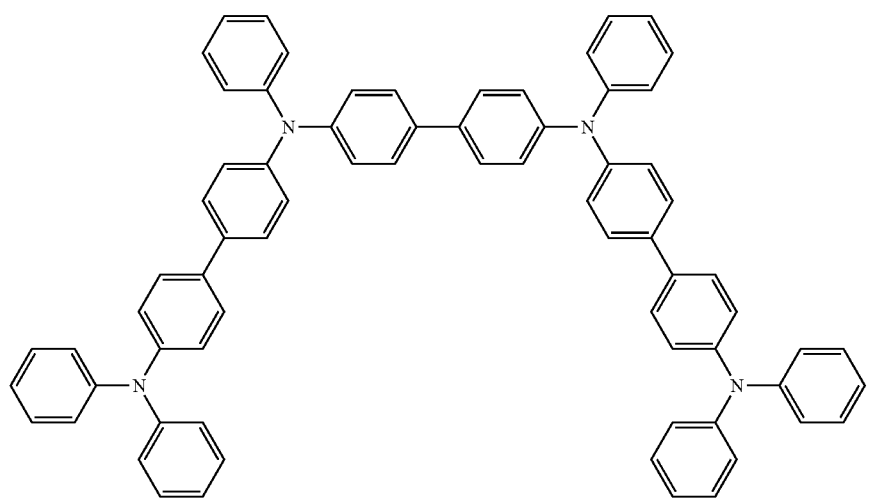
HT-6
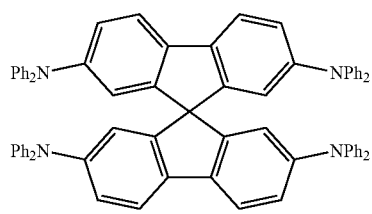
HT-7
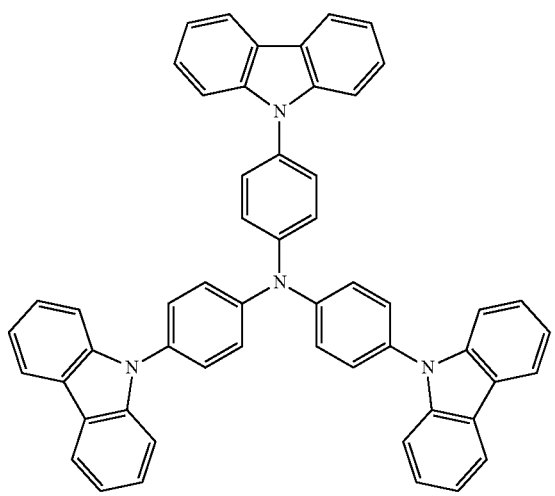

HT-8

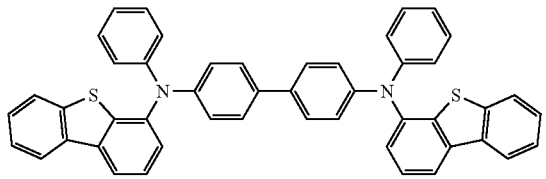

HT-9

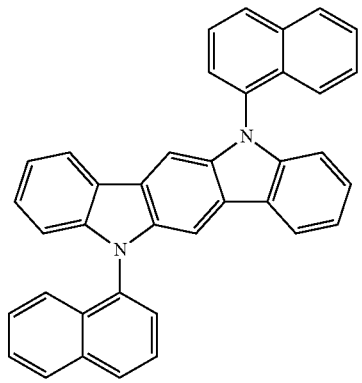

HT-10

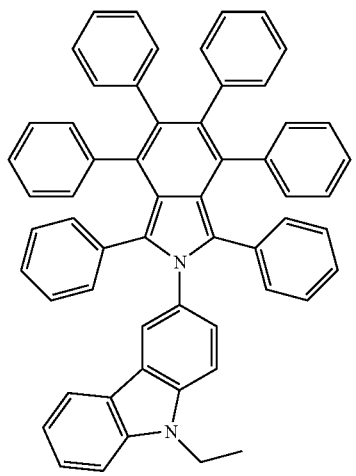

The hole transport materials may be singly used or two or more thereof may be used in combination.

<<Electron Blocking Layer>>

The electron blocking layer is a layer having a function of the hole transport layer in a broad sense. The electron blocking layer is preferably composed of a material having a function of transporting holes with a small ability of transporting electrons and can increase the recombination probability of electrons and holes by blocking electrons while transporting holes.

The configuration of the hole transport layer described above can be used for the electron blocking layer of the present invention as required.

The electron blocking layer disposed in an organic EL element of the present invention is preferably disposed adjacent to the light-emitting layer on the anode side.

The thickness of the electron blocking layer according to the present invention is preferably in the range of 3 nm to 100 nm, more preferably in the range of 5 nm to 30 nm.

As the material used for the electron blocking layer, the materials used for the hole transport layer aforementioned are preferably used, and the host compound aforementioned is also preferably used for the electron blocking layer.

<<Hole Injection Layer>>

The hole injection layer (also referred to as the "anode buffer layer") according to the present invention is a layer disposed between the anode and the light-emitting layer for reduction in drive voltage and increase in emission luminance, which is detailed in Part 2, Chapter 2 "Denkyoku Zairyo (Electrode Material)" (pp. 123-166) of "Yuki EL Soshi To Sono Kogyoka Saizensen (Organic EL Element and Front of Industrialization thereof) (Nov. 30, 1998, published by N.T.S Co., Ltd.)".

In the present invention, the hole injection layer may be provided as required and, as described above, may be present between the anode and the light-emitting layer or between the anode and the hole transport layer.

The hole injection layer is also detailed in documents such as Japanese Patent Application Laid-Open Nos. 9-45479, 9-260062, and 8-288069, and examples of a material used for the hole injection layer include the materials used for the hole transport layer aforementioned.

Of these, preferable are phthalocyanine derivatives represented by copper phthalocyanine, hexaazatriphenylene derivatives described in Japanese Unexamined Patent Application Publication (Translation of PCT Application) No. 2003-519432 and Japanese Patent Application Laid-Open No. 2006-135145 and the like, metal oxides represented by vanadium oxide, amorphous carbon, conductive polymers such as polyaniline (emeraldine) and polythiophene, ortho-metalated complexes represented by a tris(2-phenylpyridine) iridium complex, triarylamine derivatives and the like.

The materials used for the hole injection layer aforementioned may be singly used or two or more thereof may be used in combination.

<<Additives>>

The organic layers aforementioned in the present invention may further include other additives.

Examples of the additives include halogen elements such as bromine, iodine, and chlorine, halogenated compounds, and compounds, complexes, and salts of alkali metals, alkali earth metals, and transition metals such as Pd, Ca, and Na.

The content of the additives can be optionally determined, and is preferably 1,000 ppm or less, more preferably 500 ppm or less, still more preferably 50 ppm or less based on the total mass % of the layer in which the additives are included.

Depending on the purpose of improving the property of transporting electrons or holes or the purpose of facilitating energy transfer of excitons, other ranges may be used.

<<Method for Forming Organic Layers>>

A method for forming organic layers according to the present invention (hole injection layer, hole transport layer, light-emitting layer, hole blocking layer, electron transport layer, electron injection layer, intermediate layer, and the like) will be described.

The method for forming organic layers according to the present invention is not specifically limited. There can be employed conventionally known forming methods such as a vacuum vapor deposition method, wet method (also referred to as a wet process) and the like.

Examples of the wet method include a spin coating method, cast method, ink jetting method, printing method, die coating method, blade coating method, roll coating method, spray coating method, curtain coating method, and LB method (Langmuir Blodgett method). Preferred are processes highly suitable for a roll-to-roll system, such as a die coating method, roll coating method, ink jetting method, spray coating method and the like, from the viewpoint of easy formation of a homogeneous thin film and high productivity.

Examples of the liquid medium that can be used for dissolving or dispersing of the organic EL materials used for the present invention include ketones such as methyl ethyl ketone and cyclohexanone, fatty acid esters such as ethyl acetate, halogenated hydrocarbons such as dichlorobenzene, aromatic hydrocarbons such as toluene, xylene, mesitylene, and cyclohexylbenzene, aliphatic hydrocarbons such as cyclohexane, decalin, and dodecane, and organic solvents such as DMF and DMSO.

Examples of the usable dispersion technique include ultrasonic dispersion, high shearing force dispersion, and medium dispersion.

Further, different layers may be formed through different processes. If a layer is formed by a deposition process, appropriate deposition conditions, which may vary depending on the type of a compound used, are preferably selected as appropriate from generally the following ranges: a boat heating temperature of 50 to 450° C., a vacuum of $10^{-6}$ to $10^{-2}$ Pa, a deposition rate of 0.01 to 50 nm/second, a substrate temperature of −50 to 300° C., and a layer thickness of 0.1 nm to 5 μm, preferably 5 to 200 nm.

Formation of organic layers according to the present invention is preferably continuously carried out from a hole injection layer to a cathode with one time vacuuming. The layers may be taken out on the way, and a different layer forming method may be employed. In this case, the operation is preferably done under a dry inert gas atmosphere.

<<Anode>>

The anode of the organic EL element is preferably formed of, as an electrode material, metal, alloy or conductive compound each having a large work function (4 eV or more, preferably 4.5 eV or more), or a mixture thereof. Specific examples of such an electrode material include metals such as Au, and transparent electroconductive materials such as CuI, indium tin oxide (ITO), $SnO_2$, and ZnO. A material that is amorphous and capable of forming a transparent conductive layer such as IDIXO ($In_2O_3$—ZnO) or the like may be used.

The anode may be formed in such a manner that the electrode material is formed into a thin film by a method as vapor deposition or sputtering, and the film is patterned into a desired pattern by a photolithography method. Alternatively, in the case where the pattern may not require high accuracy (for example, approximately 100 μm or more), the pattern may be formed with a mask having a desired shape on vapor deposition or sputtering of the electrode material.

In the case of using a material capable of being applied as a coating, such as an organic electroconductive compound, a wet film forming method, such as a printing method and coating method, may be used. In the case where emitted light is to be taken out through the anode, the anode preferably has a transmittance of more than 10%, and preferably has a sheet resistance of several hundred Ohms per square or less.

The thickness thereof may be generally selected from the range of 10 nm to 1 μm, preferably of 10 to 200 nm, while depending on the material used.

<<Cathode>>

The cathode is preferably formed of, as an electrode material, a metal (referred to as an electron injection metal), an alloy or a conductive compound each having a small work function (4 eV or less), or a mixture thereof. Specific examples of the electrode material include sodium, sodium-potassium alloys, magnesium, lithium, magnesium-copper mixtures, magnesium-silver mixtures, magnesium-aluminum mixtures, magnesium-indium mixtures, aluminum/aluminum oxide ($Al_2O_3$) mixtures, indium, lithium/aluminum mixtures, aluminum, and rare earth metals. Of these, mixtures of an electron injection metal and a second metal that is a stable metal having a larger work function than the electron injection metal, for example, magnesium/silver mixtures, magnesium/aluminum mixtures, magnesium/indium mixtures, aluminum/aluminum oxide ($Al_2O_3$) mixtures, lithium/aluminum mixtures, aluminum and the like are preferred in respect of the electron injection property and the durability against oxidation and the like.

The cathode can be produced by forming the electrode material into a thin film by a method such as vapor deposition or sputtering. The cathode preferably has a sheet resistance of several hundred Ohms per square or less, and the thickness thereof may be usually selected from the range of from 10 nm to 5 μm, preferably of 50 to 200 nm.

For transmitting the emitted light, any one of the anode and the cathode of the organic EL element is preferably transparent or translucent, thereby enhancing the emission luminance.

After the metal described above has been formed into a film having a thickness of from 1 nm to 20 nm as a cathode, the conductive transparent material mentioned in the description of the anode is formed into a film on the cathode, thereby being able to produce a transparent or translucent cathode. Through the application of this method, an element in which both the anode and cathode have transparency can be produced.

[Supporting Substrate]

The supporting substrate (also referred to as a substrate or a base material hereinafter) that can be used for the organic EL element of the present invention may be composed of glass or plastic, which may be of any type and may be transparent or opaque. For extraction of light from the supporting substrate side, the supporting substrate is preferably transparent. Examples of the transparent supporting substrate preferably used include glass, quartz, and transparent resin films. A particularly preferred supporting substrate is a resin film capable of imparting flexibility to the organic EL element.

Examples of the resin film include films of polyesters such as polyethylene terephthalate (PET) and polyethylene naphthalate (PEN), polyethylene, polypropylene, cellophane, cellulose esters and their derivatives such as cellulose diacetate, cellulose triacetate (TAC), cellulose acetate butyrate, cellulose acetate propionate (CAP), cellulose acetate phthalate, and cellulose nitrate, polyvinylidene chloride, polyvinyl alcohol, poly(ethylene-vinyl alcohol), syndiotactic polystyrene, polycarbonate, norbornene resin, polymethylpentene, polyether ketone, polyimide, polyether sulfone (PES), polyphenylene sulfide, polysulfones, polyether imide, polyether ketone imide, polyamide, fluorine resin, Nylon, poly(methyl methacrylate), acrylic and polyarylates and cycloolefin resins such as ARTON (trade name, manufactured by JSR Corp.), and APEL (trade name, manufactured by Mitsui Chemicals Inc.).

On the surface of the resin film, an inorganic or organic coating film or hybrid coating film composed of the both may be formed. The coating film is preferably a barrier film having a water vapor transmittance (permeability) of 0.01 g/m$^2$·24 h or less (at 25±0.5° C. and 90±2% relative humidity (RH)) measured by a method in accordance with JIS K 7129-1992, and more preferably a high barrier film having an oxygen transmittance of $1\times10^{-3}$ mL/m$^2$·24 h·atm·or less measured by a method in accordance with JIS K 7126-1987 and a water vapor transmittance of $1\times10^{-5}$ g/m$^2$·24 h or less.

As for the material for forming the barrier film, any material that can block infiltration of substances such as moisture and oxygen causing degradation of the element can be used, and examples of the material that can be used include silicon oxide, silicon dioxide, and silicon nitride. In order to improve the fragility of the film, a barrier film is more preferably allowed to have a laminate structure composed of the inorganic layer and organic material layer. The inorganic layer and the organic layer may be laminated in any order, and the both layers are preferably alternately laminated multiple times.

The method for forming the barrier film is not particularly limited, and examples thereof include vacuum deposition, sputtering, reactive sputtering, molecular beam epitaxy, cluster ion-beam deposition, ion plating, plasma polymerization, atmospheric pressure plasma polymerization, plasma CVD, laser CVD, thermal CVD, and coating methods. A particularly preferred method is atmospheric pressure plasma polymerization as described in Japanese Patent Application Laid-Open No. 2004-68143A.

Examples of the opaque supporting substrate include sheets and films of metal such as aluminum and stainless steel, opaque resin substrates, and substrates of ceramic.

The external extraction quantum efficiency of emission of the organic EL element of the present invention at room temperature (25° C.) is preferably 1% or more, more preferably 5% or more.

Herein, the external extraction quantum efficiency (%)= (number of photons emitted from the organic EL element to the exterior)/(number of electrons supplied to the organic EL element)×100.

A hue improving filter such as a color filter or a color conversion filter that converts the color of light emitted by the organic EL element to many colors using a fluorescent compound may be used in combination.

[Sealing]

Examples of the sealing means used in the organic EL element of the present invention include a method in which a sealing member, electrodes, and a supporting substrate are bonded with an adhesive. It is only required to dispose the sealing member so as to cover a displaying area of the organic EL element, and the sealing member may be in the form of a recess or flat plate. Further, the sealing member may have any transparency and electrical insulation.

Examples of the sealing member include glass plates, polymer plates and films, and metal plates and films. Examples of the glass plate include soda-lime glass, barium.strontium-containing glass, lead glass, aluminosilicate glass, borosilicate glass, barium borosilicate glass, and quartz plates. Examples of the polymer plate include polycarbonate, acryl, polyethylene terephthalate, polyether sulfide, and polysulfone plates. The metal plate may be composed of at one or more metals or alloys selected from the group consisting of stainless steel, iron, copper, aluminum, magnesium, nickel, zinc, chromium, titanium, molybdenum, silicon, germanium, and tantalum.

In the present invention, a polymer film or metal film is preferably used, from the viewpoint of reduction in the film thickness of the organic EL element. The polymer film preferably has an oxygen transmittance of $1\times10^{-3}$ mL/m$^2$·24 h·atm or less measured by a method in compliance with JIS K 7126-1987 and a water vapor transmittance of $1\times10^{-3}$ mL/m$^2$·24 h·atm or less (at 25±0.5° C. and 90±2% relative humidity) measured by a method in compliance with JIS K 7129-1992.

The sealing member is formed into a recessed form by, for example, sand blasting or chemical etching.

Specific examples of the adhesive include photo-curable or thermo-curable adhesives having reactive vinyl groups, such as acrylic acid oligomers and methacrylic acid oligomers and moisture curable adhesives such as 2-cyanoacrylate. Examples thereof also include thermally or chemically curable (two-liquid mixing type) adhesives, such as epoxy adhesives. Examples thereof also include hot-melt polyamide, polyester, and polyolefin adhesives. Examples thereof also include UV curable epoxy resin adhesives of cation curing type.

Since the organic EL element may be degraded by heat treatment, the adhesive can be cured preferably at a temperature from room temperature up to 80° C. A drying agent may be dispersed in the adhesive. The adhesive may be applied to the sealing portion with a commercially available dispenser or by printing such as screen printing.

A sealing film can be preferably prepared as a layer of an inorganic or organic compound. The sealing film is formed on outer side of the electrode opposed to the supporting substrate via an organic layer so as to cover the electrode and the organic layer and to be in contact with the supporting substrate. In this case, the sealing film may be formed of any material that can block infiltration of substances such as water and oxygen that causes degradation of the element, and examples of the material that can be used include silicon oxide, silicon dioxide, and silicon nitride.

In order to further improve the fragility of the film, a sealing film is preferably allowed to have a laminate structure composed of the inorganic layer and organic material. The method for forming these films is not particularly limited, and examples thereof include vacuum deposition, sputtering, reactive sputtering, molecular beam epitaxy, cluster ion-beam deposition, ion plating, plasma polymerization, atmospheric pressure plasma polymerization, plasma CVD, laser CVD, thermal CVD, and coating methods.

The gap between the sealing member and the displaying portion of the organic EL element is preferably filled with, in the case of the form of a gas or liquid phase, an inert gas such as nitrogen or argon or an inactive liquid such as fluorinated hydrocarbon or silicone oil. The gap can be in a vacuum state. Alternatively, the gap may be filled with a hygroscopic compound.

Examples of the hygroscopic compound include metal oxides (such as sodium oxide, potassium oxide, calcium oxide, barium oxide, magnesium oxide, and aluminum oxide), sulfates (such as sodium sulfate, calcium sulfate, magnesium sulfate, and cobalt sulfate), metal halides (such as calcium chloride, magnesium chloride, cesium fluoride, tantalum fluoride, cerium bromide, magnesium bromide, barium iodide, and magnesium iodide), and perchlorates (such as barium perchlorate and magnesium perchlorate). The sulfates, metal halides, and perchlorates are suitably used in the form of anhydride.

[Protective Film, Protective Plate]

In order to enhance the mechanical strength of the element, a protective film or plate may be provided on the outer side of the sealing layer or film opposed to the supporting substrate via the organic layer. Particularly when sealing is achieved by the sealing film, the mechanical strength of the sealing film is not sufficiently high. Thus, such a protective film or plate is preferably provided. Examples of the material used for the protective film or plate include glass plates, polymer plates and films, and metal plates and films similar to those used for sealing. From the viewpoint of reduction in the weight and the film thickness, polymer films are preferably used.

[Technique for Improving Light Extraction]

It is generally said that an organic EL element generates light in a layer having a refractive index higher than air (within the refractive index range of about 1.6 to 2.1) and only about 15% to 20% of the light generated in the light-emitting layer can be extracted. This is because incident light on the interface (interface between a transparent substrate and the air) at an angle θ larger than a critical angle is totally reflected and cannot be extracted from the element, or because light is totally reflected at the interface between the transparent electrode or light-emitting layer and the transparent substrate and is guided to the transparent electrode or the light-emitting layer to escape the light to the side surface of the element.

Examples of techniques for improving the light extraction efficiency include a process of forming irregularities on a surface of a transparent substrate to prevent total reflection at the interface between the transparent substrate and the air (e.g., U.S. Pat. No. 4,774,435); a process of providing light-condensing properties to a substrate to improve the efficiency (e.g., Japanese Patent Application Laid-Open No. 63-314795 A); a process of forming a reflection surfaces on the side surfaces of an element (e.g., Japanese Patent Application Laid-Open No. 1-220394 A); a process of introducing a flat layer between a substrate and a luminescent material to form an anti-reflection layer, wherein the flat layer has a refractive index between the substrate and the luminescent material (e.g., Japanese Patent Application Laid-Open No. 62-172691 A); a process of introducing a flat layer between a substrate and a luminescent material, wherein the flat layer has a refractive index lower than that of the substrate (e.g., Japanese Patent Application Laid-Open No. 2001-202827 A); and a process of forming a diffraction grating between any layers of a substrate, transparent electrode layer, and light-emitting layer (including on the substrate surface facing the exterior) (e.g., Japanese Patent Application Laid-Open No. 11-283751 A).

In the present invention, these processes can be used in combination with the organic EL element of the present invention. The process of introducing a flat layer between a substrate and a luminescent material, wherein the flat layer has a refractive index lower than that of the substrate or the luminescent material or the process of forming a diffraction grating between any layers of a substrate, transparent electrode layer, and light-emitting layer (including on the substrate surface facing the exterior) can be suitably employed.

The present invention can provide an element exhibiting higher luminance or more excellent durability by combining those means.

When a low refractive index medium is allowed to have a thickness greater than light wavelength between a transparent electrode and a transparent substrate, the extraction efficiency of light from the transparent electrode to the exterior increases with decrease in the refractive index of the medium.

Examples of materials for the low refractive index layer include aero gel, porous silica, magnesium fluoride, and fluorinated polymer. The refractive index of a transparent substrate usually ranges about 1.5 to 1.7, and thus the refractive index of the low refractive index layer is preferably about 1.5 or less, more preferably 1.35 or less.

The low refractive index medium desirably has a thickness twice or more the wavelength of the light in the medium. This is because when the low refractive index medium has a thickness similar to the wavelength of the light, the electromagnetic waves exuding as evanescent waves penetrate into the substrate, resulting in a reduction in the effect of the low refractive index layer.

The process of introducing a diffraction grating onto the interface at which total reflection occurs or into any media is characterized by being highly effective of improving the light extraction efficiency. In this method, a diffraction grating is introduced between any two layers or in any medium (in the transparent substrate or the transparent electrode) to extract the light generated in the light-emitting layer that cannot exit due to total reflection between the layers and the like, by the use of the property of the diffraction gratings that can change the direction of light to a specific direction different from that of refraction by Bragg diffraction such as primary diffraction or secondary diffraction.

The diffraction grating to be introduced desirably has two-dimensional periodic refractive indices. Because light generated in a light-emitting layer is emitted randomly in all the directions, a general one-dimensional diffraction grating having a periodic refractive index distribution only in the specific direction can diffract only the light traveling in a specific direction and cannot greatly increase the light extraction efficiency.

When the refractive index distribution is allowed to be two-dimensional, light traveling in all directions are diffracted to thereby result in an increase in light extraction efficiency.

The diffraction grating may be introduced between any two layers or in any medium (in the transparent substrate or the transparent electrode), but is desirably introduced near the organic light-emitting layer, which is a site generating light. The period of the diffraction grating is preferably about a half to three times the wavelength of light in the medium. The array of the diffraction grating is preferably two-dimensionally repeated such as a square lattice shape, triangular lattice shape, or honeycomb lattice shape.

[Light-Condensing Sheet]

The organic EL element of the present invention can enhance the luminance in a specific direction by condensing light in this specific direction, for example, in the front direction with respect to the light emitting plane of the element by providing, for example, a micro-lens array structure on the light extraction side of the supporting substrate (substrate) of the element or combining with a so-called light-condensing sheet.

In an example of a micro-lens array, quadrangular pyramids having a side of 30 μm and having a vertex angle of 90 degrees are two-dimensionally arranged on the light extraction side of the substrate. The quadrangular pyramid preferably has a side in the range of 10 μm to 100 μm. A side shorter than this range causes coloration due to the effect of diffraction, while a side longer than this range makes the thickness unfavorably large.

A light-condensing sheet that can be used is one practically used for an LED backlight of a liquid crystal display apparatus, for example. A typical example of the sheet is a brightness enhancing film (BEF) manufactured by SUMITOMO 3M Limited. A prism sheet may have, for example, a shape having triangular stripes with a vertex angle of 90 degrees and a pitch of 50 μm, a shape having a round apex, a shape having randomly changed pitches, or other shapes, formed on a base material.

In order to control the emission angle of light from the organic EL element, a light diffusion plate or film may be used in combination with the light-condensing sheet. For example, a diffusion film (Light-Up) manufactured by KIMOTO Co., Ltd. can be used.

2. Applications of Organic EL Element

The organic EL element of the present invention can be used as an electronic apparatus, such as a display apparatus, a display, or various light-emitting apparatuses.

Examples of the light-emitting apparatus include, but not limited to, lighting apparatuses (lamps for household use and car room lamps), backlights for watches and liquid crystals, light sources for board advertisements, traffic lights, and optical memory media, light sources for electrophotographic copiers, light sources for optical communication instruments, and light sources for optical sensors. In particular, the organic EL element can be effectively used as a backlight for a liquid crystal display apparatus or a lighting source.

In the organic EL element of the present invention, films may be patterned with a metal mask, by ink-jet printing or the like during film deposition. The patterning may be performed on only the electrodes, on the electrodes and the light-emitting layer, or on all layers of the element. In the production of the element, conventionally known methods can be employed.

<Display Apparatus>

The display apparatus including the organic EL element of the present invention may be monochromatic or multichromatic. Herein, a multichromatic display apparatus will now be described.

In the case of a multichromatic display apparatus, a shadow mask is provided only during formation of the light-emitting layer. The film can be formed on one side by a vacuum deposition method, casting method, spin coating method, ink jetting method, printing method or the like.

In the case of patterning only the light-emitting layer, the patterning may be performed by any method. The method is preferably a vacuum deposition method, ink jetting method, spin coating method, or printing method.

The configuration of the organic EL element included in the display apparatus is selected from the exemplary configurations of the organic EL element mentioned above as required.

The method of producing the organic EL element is as shown in one embodiment of the production of the organic EL element of the present invention which has been described above.

When a direct current voltage is applied to the multichromatic display apparatus thus obtained, light emission can be observed by allowing the anode to have a positive (+) polarity and the cathode to have a negative (−) polarity and applying an voltage of about 2 V to 40 V. Application of a voltage of the reverse polarity causes no current to flow and generates no light emission. Alternatively, when an alternating current voltage is applied, light is emitted only in the state of the anode being positive (+) and cathode being negative (−). Meanwhile, the alternating current to be applied may have any wave shape.

The multichromatic display apparatus can be used as a display device, display, or various light emission sources. In a display device or display, full color display can be achieved with three types of organic EL elements that emit blue, red, and green light.

Examples of the display device or display include television sets, personal computers, mobile equipment, AV equipment, teletext displays, and information displays in automobiles. In particular, the display apparatus may be used for displaying still images or moving images. The driving system in the case of using the display apparatus used for playback of moving images may be either a simple matrix (passive matrix) system or an active matrix system.

Examples of the light-emitting apparatus include lamps for household use, car room lamps, backlights for watches and liquid crystals, light sources for board advertisements, traffic lights, and optical memory media, light sources for electrophotographic copiers, light sources for optical communication instruments, and light sources for optical sensors, and the present invention is not limited thereto.

Hereinbelow, an example of the display device having the organic EL element of the present invention will be described with reference to accompanying drawings.

Figure 7:
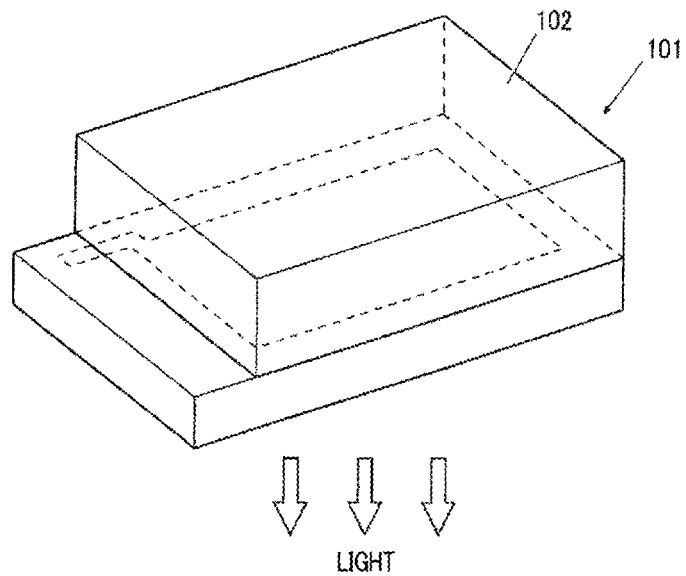
FIG. 7 is a schematic view of a lighting apparatus.

FIG. 3 is a schematic illustration of one exemplary display apparatus constituted by the organic EL element. FIG. 7 is a schematic illustration illustrating a display for, for example, a mobile phone to display image information through light emission of the organic EL element.

Display 1 has display part A having a plurality of pixels, control part B to perform image scanning of display part A based on image information, wiring portion C electrically connecting display part A and control part B and the like.

Control part B is electrically connected to display part A via wiring portion C and sends scanning signals and image data signals to each of pixels based on external image information. The pixels of each scanning line sequentially emit light by the scanning signals and in response to the image data signal to perform image scanning, displaying the image information on display part A.

Figure 4:
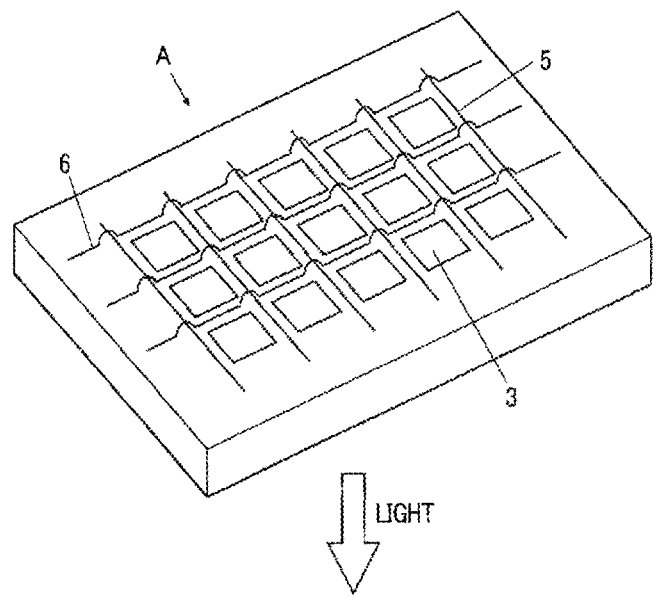
FIG. 4 is a schematic illustration of an active matrix display apparatus.

FIG. 4 is a schematic illustration of an active matrix display apparatus.

Display part A includes wiring portion C including a plurality of scanning lines 5 and data lines 6, and a plurality of pixels 3 on a substrate. The main members of display part A will be described hereinafter.

FIG. 4 illustrates a case in which light emitted from pixels 3 is extracted to the direction shown by the white arrow (downward direction).

Scanning lines 5 and plural data lines 6 in the wiring portion are each made of an electrically conductive material. Scanning lines 5 and data lines 6 intersect at right angles in a grid pattern and are connected to pixels 3 at the intersections (details are not shown).

When a scanning signal is applied from scanning line 5, pixels 3 receive an image data signal from data line 6 and emit light in response to the image data received.

Full color display can be achieved by appropriately disposing pixels that emit light in a red region, pixels that emit light in a green region, and pixels that emit light in a blue region in parallel on the same substrate.

Figure 5:
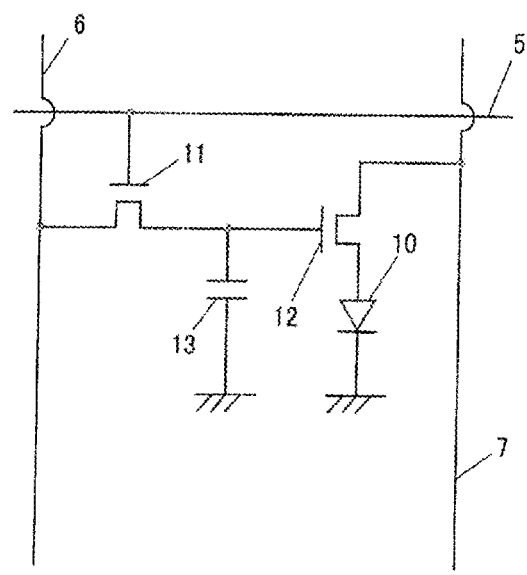
FIG. 5 is a schematic view of a pixel circuit.

Next, the light-emitting process by a pixel will now be described. FIG. 5 is a schematic illustration of a pixel circuit.

The pixel includes organic EL element 10, switching transistor 11, driving transistor 12, condenser 13 and the like. Full color display can be performed by using, as organic EL element 10 for plural pixels, organic EL elements emitting red light, green light, and blue light and disposing the elements in parallel on the same substrate.

In FIG. 5, an image data signal from control part B is applied to the drain of switching transistor 11 via data line 6. A scanning signal from control part B is then applied to the gate of switching transistor 11 via scanning line 5 to turn on driving of switching transistor 11, and the image data signal applied to the drain is transmitted to condenser 13 and gate of driving transistor 12.

Condenser 13 is charged through the transmission of the image data signal depending on the potential of the image data signal, and driving of driving transistor 12 is turned on. In driving transistor 12, the drain is connected to power source line 7 and a source is connected to the electrode of organic EL element 10 to supply a current to organic EL element 10 from power source line 7 depending on the potential of the image data signal applied to the gate.

The scanning signal is transmitted to next scanning line 5 by sequential scanning by control part B to turn off driving of switching transistor 11. However, condenser 13 maintains the charged potential of the image data signal even after the turning-off of driving of switching transistor 11, and thereby the driving state of driving transistor 12 is maintained to continue the light emission by organic EL element 10 until the next scanning signal is applied. Driving transistor 12 is driven in response to the potential of the subsequent image data signal in synchronization with the subsequent scanning signal applied by sequential scanning, resulting in light emission by organic EL element 10.

That is, light emission by organic EL element 10 is performed by providing switching transistor 11 and driving transistor 12 serving as active elements to organic EL element 10 of each of the plurality of pixels and allowing each of organic EL elements 10 of plural pixels 3 to emit light. Such a light emitting process is called an active matrix system.

Light emission from organic EL element 10 herein may have multiple gradations according to multi-valued image data signals having different gradation potentials, or a predetermined intensity of on-off light according to a binary image data signal. The electric potential of condenser 13 may be maintained until the subsequent scanning signal is applied, or may be discharged immediately before the subsequent scanning signal is applied.

In the present invention, the light emitting process is not limited to the active matrix system described above, and may be a passive matrix system, in which light is emitted from the organic EL element in response to the data signal only during scanning of the scanning signals.

Figure 6:
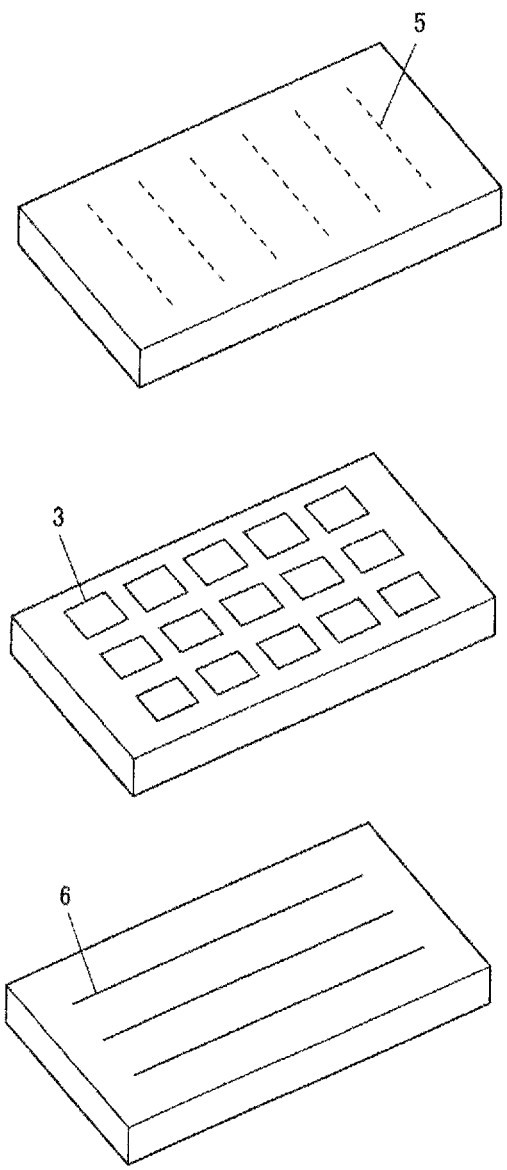
FIG. 6 is a schematic illustration of a passive matrix display apparatus.

FIG. 6 is a schematic illustration of a passive matrix display apparatus. In FIG. 6, a plurality of scanning lines 5 and a plurality of image data lines 6 are provided opposingly via pixels 3 in a grid pattern.

When a scanning signal is applied to scanning line 5 by sequential scanning, pixel 3 connected to applied scanning line 5 emits light in response to the image data signal.

The passive matrix system does not have any active element in pixels 3, resulting in a reduction in manufacturing cost.

Use of the organic EL element of the present invention can provide a display apparatus having improved emission efficiency.

<Lighting Apparatus>

The organic EL element of the present invention can be used also for a lighting apparatus.

The organic EL element of the present invention may be used also as an organic EL element having a resonator configuration. The organic EL element having such a resonator configuration may be intended to be used for, but not limited to, a light source for an optical memory medium, light source for an electrophotographic copier, light source for an optical communication instrument, light source for an optical sensor or the like. Alternatively, the organic EL element may be used for the above-mentioned purposes by laser oscillation.

The organic EL element of the present invention may be used as a lamp such as a lighting source or an exposure light source or may be used as a projector for projecting images or a display apparatus (display) for direct view of still or moving images.

The driving system of the display apparatus used for playback of moving images may be either a passive matrix system or an active matrix system. Furthermore, a full-color display apparatus can be produced by employing two or more organic EL elements of the present invention that emit light of different colors.

The π-conjugated boron compound used for the present invention can be applied to a lighting apparatus including an organic EL element that emits substantially white light. For example, when a plurality of light-emitting materials are used, a plurality of emitted light colors are emitted simultaneously. Mixing the colors can provide white light emission. The combination of the emitted light colors may be a combination containing three maximum light emission wavelengths of three primary colors of blue, green, and red or a combination containing two maximum light emission wavelengths utilizing a relationship of complementary colors such as blue and yellow or bluish green and orange.

In the method of forming the organic EL element of the present invention, a mask is disposed only during formation of a light-emitting layer, hole transport layer, electron transport layer or the like. It is only required that the mask be simply disposed for separate coating by use of the mask, for example. Patterning with the mask or the like is not necessary because the other layers are common. A film, such as an electrode film, can be formed on the entire surface by a vapor deposition method, casting method, spin coating method, ink jetting method, printing method or the like. The productivity is thereby enhanced.

According to this method, the organic EL element itself emits white light, unlike a white light-emitting organic EL apparatus including an array of multiple light-emitting elements disposed in parallel.

[One Embodiment of Lighting Apparatus of Present Invention]

One embodiment of the lighting device including the organic EL element of the present invention will now be described.

The non-light emitting surface of the organic EL element of the present invention is covered with a glass case, and a glass substrate having a thickness of 300 μm is used as a sealing substrate. As a sealing material, an epoxy photo-curable adhesive (LUXTRACK LC0629B manufactured by Toagosei Co., Ltd.) is applied to the periphery, and the product is placed onto the cathode and is attached to the transparent supporting substrate, followed by curing the adhesive by irradiation with UV light through the glass substrate for sealing. Accordingly, a lighting apparatus shown in FIGS. 7 and 8 can be formed.

FIG. 7 is a schematic view of the lighting apparatus. The organic EL element of the present invention (organic EL element 101 in the lighting apparatus) is covered with glass cover 102 (sealing with the glass cover was performed in a glove box under a nitrogen atmosphere (an atmosphere of high purity nitrogen gas having a purity of at least 99.999%) to avoid contact of organic EL element 101 in the lighting apparatus with air).

Figure 8:
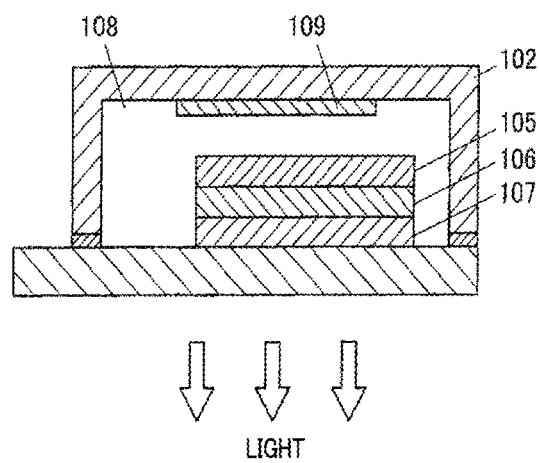
FIG. 8 is a schematic illustration of the lighting apparatus.

FIG. 8 is a cross-sectional view of the lighting apparatus, wherein 105 indicates a cathode, 106 indicates an organic layer, and 107 indicates a glass substrate provided with a transparent electrode. Meanwhile, the inside of glass cover 102 is filled with nitrogen gas 108 and is provided with water absorbent 109.

Use of the organic EL element of the present invention can provide a lighting apparatus having improved emission efficiency.

<Light-Emitting Thin Film>

A light-emitting thin film according to the present invention, which is characteristic of containing the aforementioned π-conjugated boron compound according to the present invention, can be produced in the same manner as in the method for forming organic layers.

The light-emitting thin film according to the present invention can be produced in the same manner as in the method for forming organic layers.

The method for forming the light-emitting thin film of the present invention is not particularly limited. There can be employed conventionally known forming methods such as a vacuum vapor deposition method, wet method (also referred to as a wet process) and the like.

Examples of the wet method include a spin coating method, cast method, ink jetting method, printing method, die coating method, blade coating method, roll coating method, spray coating method, curtain coating method, and LB method (Langmuir Blodgett method). Preferred are processes highly suitable for a roll-to-roll system, such as a die coating method, roll coating method, ink jetting method, spray coating method, from the viewpoint of easy formation of a homogeneous thin film and high productivity.

Examples of the liquid medium that can be used for dissolving or dispersing of the light-emitting material used for the present invention include ketones such as methyl ethyl ketone and cyclohexanone, fatty acid esters such as ethyl acetate, halogenated hydrocarbons such as dichlorobenzene, aromatic hydrocarbons such as toluene, xylene, mesitylene, and cyclohexylbenzene, aliphatic hydrocarbons such as cyclohexane, decalin, and dodecane, and organic solvents such as DMF and DMSO.

Examples of the method for dispersing the light-emitting material include ultrasonic dispersion, high shearing force dispersion, and medium dispersion.

Further, different layers may be formed through different film deposition processes. When a vapor deposition process is used for film deposition, appropriate vapor deposition conditions, which may vary depending on the type of a compound used, are preferably selected as appropriate from generally the following ranges: a boat heating temperature of 50 to 450° C., a vacuum of $10^{-6}$ to $10^{-2}$ Pa, a deposition rate of 0.01 to 50 nm/second, a substrate temperature of −50 to 300° C., and a layer thickness of 0.1 nm to 5 μm, preferably 5 to 200 nm.

In the case where a spin coating method is employed for film deposition, a spin coater is operated in the range of 100 to 1,000 rpm for the range of 10 to 120 seconds under a dry inert gas atmosphere.

EXAMPLES

The present invention will now be described specifically by way of examples, but the present invention is not limited thereto.

Example 1

1. Production of Organic EL Elements

The following compounds were used as electron transport layer material to produce organic EL elements.

[Formula 30]

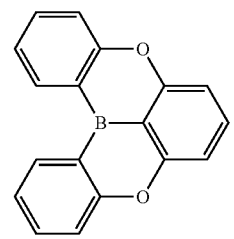

Comparative example 1

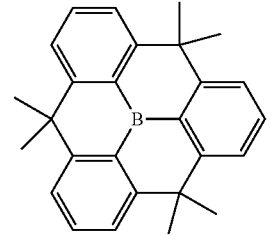

Comparative example 3

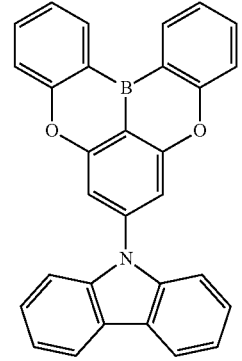

Comparative example 8

Comparative example 11
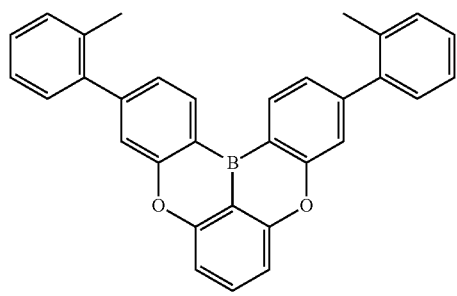
[Formula 31]
A-1
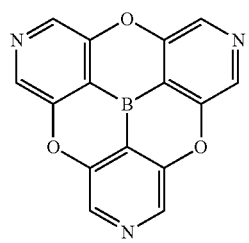
A-10
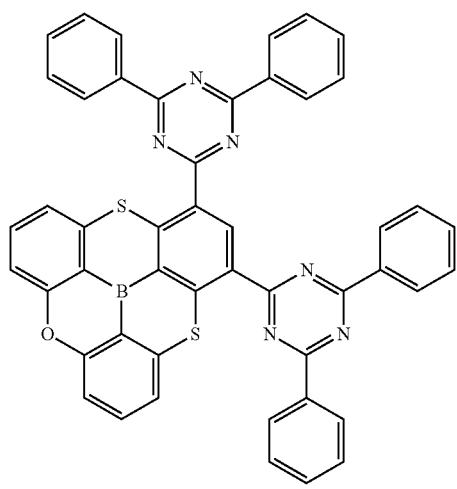
A-26
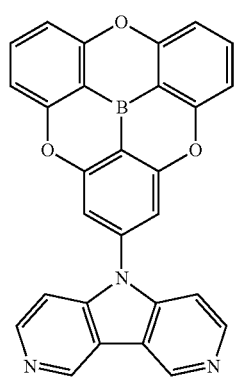
A-28
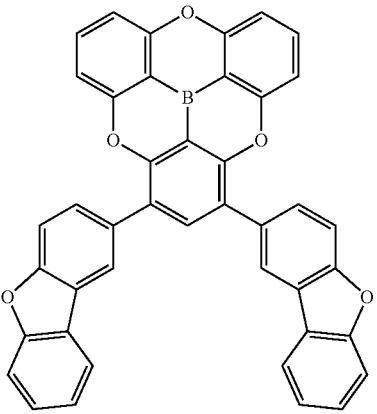
A-39
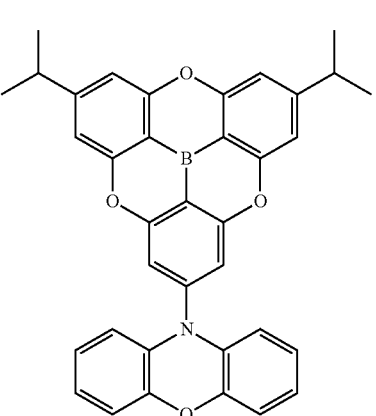
[Formula 32]
A-57
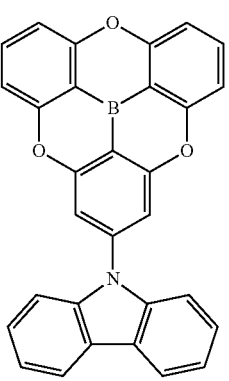

-continued
A-72
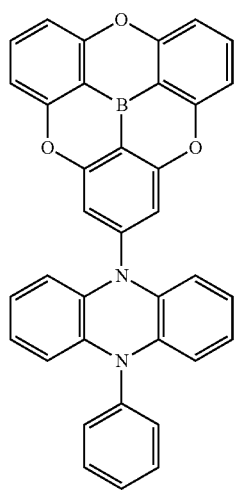
A-75
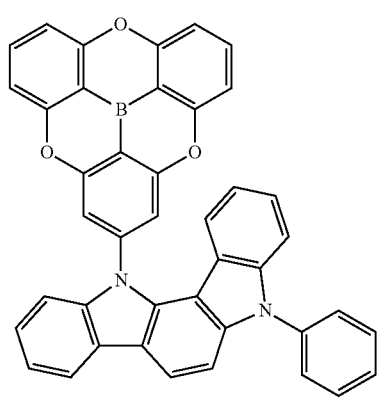
A-73
A-78
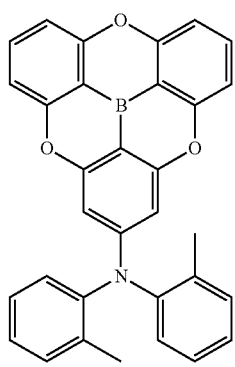
A-74
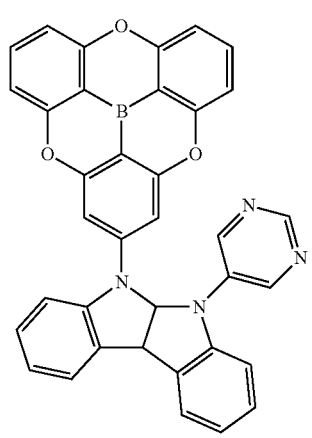
A-79
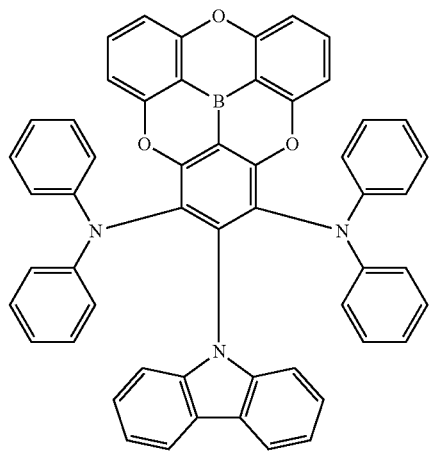

-continued

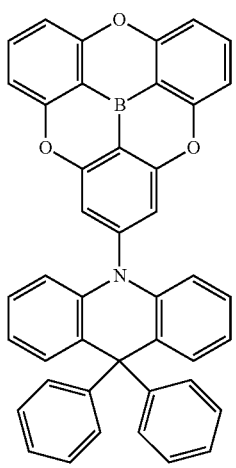

A-80

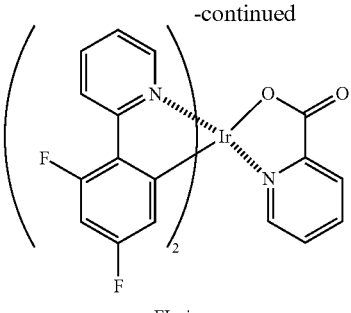

FIrpic (Production of Organic EL Element 1-1)

A substrate formed by depositing indium tin oxide (ITO) to 100 nm as an anode onto a glass substrate having a size of 100 mm×100 mm×1.1 mm (manufactured by AvanStrate Inc., NA-45) was subjected to patterning. Thereafter, the transparent supporting substrate provided with this ITO transparent electrode was ultrasonic cleaned in isopropyl alcohol, was dried with dry nitrogen gas, and was cleaned with UV ozone for 5 minutes.

On this transparent supporting substrate, a thin film was formed by the spin coating method by using a solution of poly(3,4-ethylenedioxythiophene)-polystyrenesulfonate (PEDOT/PSS (hole transport material 1), manufactured by Bayer AG, Baytron PA14083) diluted with pure water to 70%. Then, the thin film was dried at 200° C. for an hour, providing a first hole transport layer having a thickness of 30 nm.

On this first hole transport layer, a thin film was formed by the spin coating method by using a chlorobenzene solution of poly[N,N'-bis(4-butylphenyl)-N,N'-diphenyl-benzidine] (manufactured by American Dye Source, Inc., ADS-254) (hole transport material 2), as a hole transport material. The thin film was heated to dry at 150° C. for an hour, providing a second hole transport layer having a thickness of 40 nm.

This transparent supporting substrate was mounted on a vacuum evaporation apparatus, and the vacuum vessel was evacuated to a degree of vacuum of 4×10$^{-4}$ Pa. Subsequently, HOST-1 as the host compound and bis[2-(4,6-difluorophenyl)pyridinato-C$^2$,N](picolinato)iridium (III) (FIrpic) as the dopant were co-deposited in a ratio of HOST-1:FIrpic=100:6 at deposition rates of 0.1 nm/s and 0.010 nm/s, respectively, on the second hole transport layer, providing a light-emitting layer having a thickness of 30 nm.

[Formula 33]

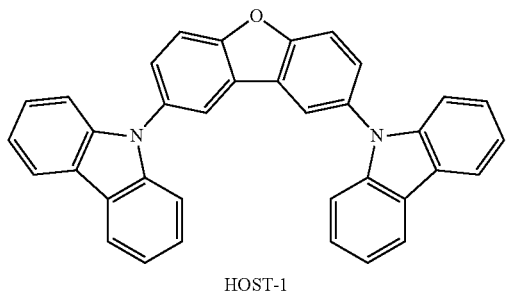

HOST-1

Subsequently, on this light-emitting layer, comparative compound 1, as an electron transport material, was deposited to 30 nm, providing an electron transport layer.

Subsequently, lithium fluoride as an electron injection layer and aluminum as a cathode were deposited to 1.0 nm and 110 nm, respectively, to produce organic EL element 1-1.

<<Production of Organic EL Elements 1-2 to 1-17>>

Organic EL elements 1-2 to 1-17 were each produced in the same manner as organic EL element 1-1 except that the electron transport material was changed to compounds shown in Table 1.

(1) Measurement of Relative Drive Voltage

With respect to each organic EL element produced, front luminance was measured at both the transparent electrode side (i.e., transparent substrate side) and the opposing electrode side (i.e., cathode side) of each organic EL element, and the voltage when the sum thereof reached 1,000 cd/m$^2$ was determined as a drive voltage (V). Luminance was measured by using a spectroradiometer CS-1000 (manufactured by Konica Minolta Sensing Inc.).

The drive voltage obtained above was assigned to the following expression to determine the relative drive voltage of each organic EL element with respect to the drive voltage of organic EL element 1-1.

Relative drive voltage (%)=(Drive voltage of each organic EL element/Drive voltage of organic EL element 1-1)×100

A smaller numeric value obtained indicates that the result is more preferable.

(2) Variation in Relative Emission Luminance Due to Storage at High Temperature

Each organic EL element produced was allowed to emit light with a constant electric current of 2.5 mA/cm$^2$ at a temperature of 100° C. The emission luminance immediately after the light emission started and the emission luminance 100 hours after the light emission started were measured by using a spectroradiometer CS-2000 (manufactured by Konica Minolta, Inc.).

The obtained emission luminance values before and after storage at a high temperature were compared to determine the variation in the emission luminance (a value determined by subtracting the emission luminance after storage at a high temperature from the emission luminance before storage at a high temperature).

The variation in the emission luminance obtained above was assigned to the following expression to determine the relative value of the emission luminance variation of each organic EL element with respect to emission luminance variation of organic EL element 1-1.

Relative emission luminance variation due to storage at a high temperature (%)=(Emission luminance variation pf each organic EL element/Emission luminance variation of organic EL element 1-1)×100

The measurement results obtained by (1) and (2) above are shown in Table 1.

TABLE 1

| Element number | Electron transport layer material | Relative drive voltage (%) | Variation in the relative emission luminance due to storage at a high temperature (%) | Remarks |
|---|---|---|---|---|
| 1-1 | Comparative compound 1 | 100 | 100 | Comparative example |
| 1-2 | Comparative compound 3 | 96 | 92 | Comparative example |
| 1-3 | Comparative compound 11 | 95 | 90 | Comparative example |
| 1-4 | Comparative compound 8 | 98 | 85 | Comparative example |
| 1-5 | A-1 | 89 | 58 | Present invention |
| 1-6 | A-10 | 88 | 53 | Present invention |
| 1-7 | A-26 | 81 | 41 | Present invention |
| 1-8 | A-28 | 83 | 39 | Present invention |
| 1-9 | A-39 | 75 | 32 | Present invention |
| 1-10 | A-72 | 77 | 34 | Present invention |
| 1-11 | A-73 | 74 | 35 | Present invention |
| 1-12 | A-74 | 70 | 30 | Present invention |
| 1-13 | A-75 | 73 | 31 | Present invention |
| 1-14 | A-78 | 75 | 33 | Present invention |
| 1-15 | A-57 | 71 | 32 | Present invention |
| 1-16 | A-79 | 76 | 29 | Present invention |
| 1-17 | A-80 | 72 | 28 | Present invention |

As clearly seen from Table 1, light-emitting elements 1-5 to 1-17 of the present invention including the π-conjugated boron compound of the present invention used in the electron transport layer of the organic EL elements all have a relative drive voltage of 89 or less, and the variation in the relative emission luminance due to storage at a high temperature is limited to 58 or less. Accordingly, it can be seen that the relative drive voltage is lower and the variation in the relative emission luminance due to storage at a high temperature is smaller than those of comparative compound 1, comparative compound 11, and comparative compound 8, which have a portion around the boron where no annulation is carried out, and those of comparative compound 3, in which Y in general formula 1 is not an oxygen atom or sulfur atom but carbon.

Example 2

The following compound were used as the host material to produce organic EL elements.

[Formula 34]

Comparative compound 2

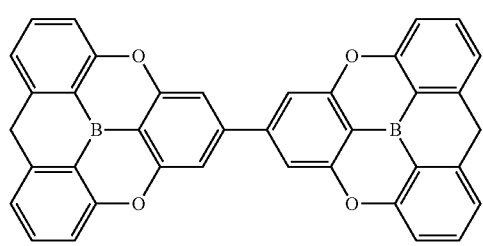

-continued

Comparative compound 4

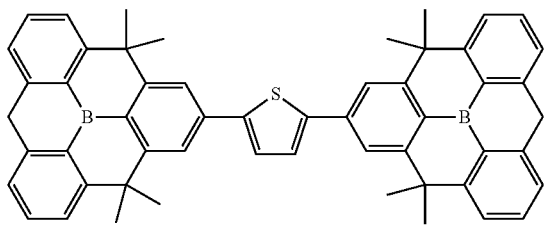

Comparative compound 12

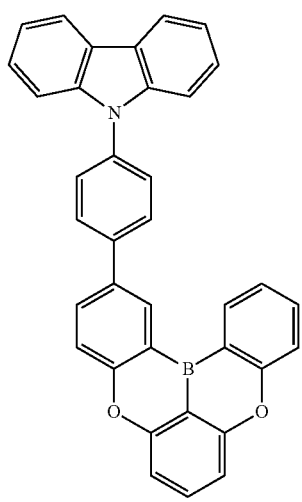

[Formula 35]
A-2
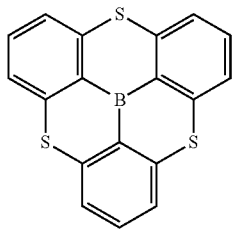
A-11
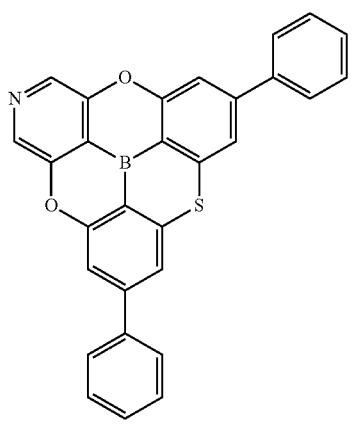
A-21
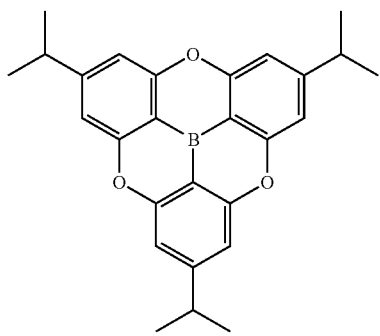
A-20
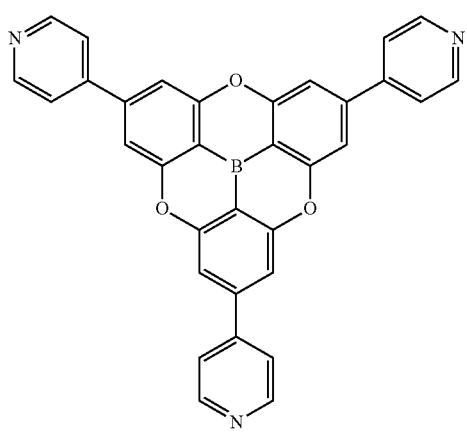
A-36
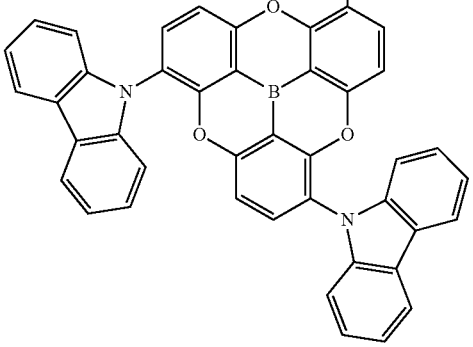
A-37
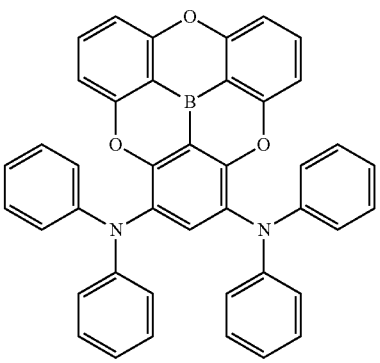
[Formula 36]
A-76
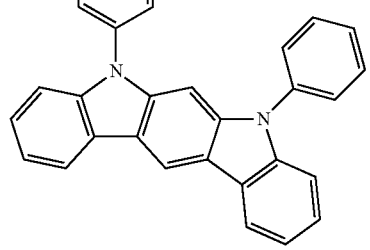

A-80

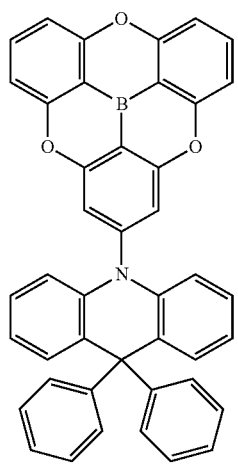

A-81

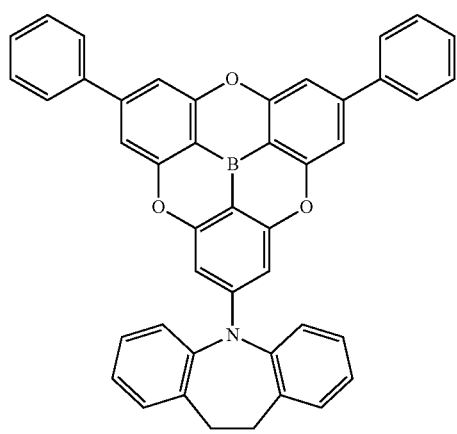

A-82

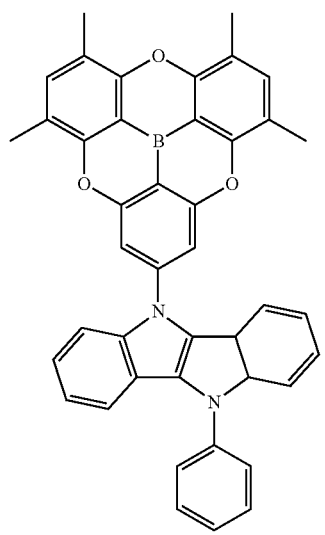

A-83

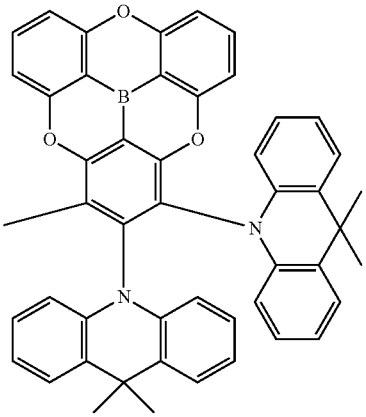

A-84

(Production of Organic EL Element 2-1)

Onto a glass substrate having a size of 50 mm×50 mm×a thickness of 0.7 mm, indium tin oxide (ITO) was deposited into a thickness of 150 nm. Then, the substrate obtained was subjected to patterning to form an ITO transparent electrode, which was an anode. The transparent substrate provided with the ITO transparent electrode was ultrasonic cleaned in isopropyl alcohol, was dried with dry nitrogen gas, and then, was cleaned with UV ozone for 5 minutes. This transparent substrate obtained was fixed to a substrate holder of a commercially available vacuum evaporation apparatus.

Materials for individual layers, in optimum amounts for producing an element, were placed into individual resistive-heating boats in the vacuum evaporation apparatus. The resistive-heating boats used were composed of molybdenum or tungsten.

After the vacuum evaporation apparatus was evacuated to a degree of vacuum of $1 \times 10^{-4}$ Pa, a resistive-heating boat containing HI-1 was energized and heated to deposit HI-1 onto the ITO transparent electrode at a deposition rate of 0.1 nm/s, thereby forming a hole injection layer having a thickness of 15 nm.

[Formula 37]

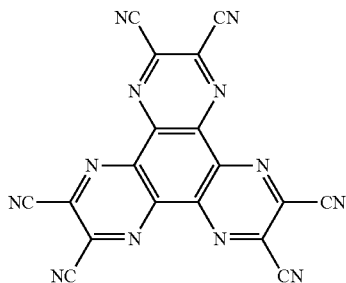

HI-1

Subsequently, hole transport material 1, which was 4,4'-bis[N-(1-naphthyl)-N-phenylamino]biphenyl (α-NPD), was deposited thereon at a deposition rate of 0.1 nm/s, thereby forming a hole transport layer having a thickness of 30 nm.

Then, resistive-heating boats each containing comparative compound 2 as a host material and GD-1 as a luminescent compound were energized and heated to co-deposit comparative compound 2 at a deposition rate of 0.1 nm/s and GD-1 at 0.010 nm/s onto the hole transport layer, thereby forming a light-emitting layer having a thickness of 40 nm.

[Formula 38]

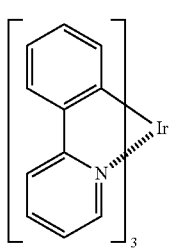

GD-1

Subsequently, HB-1 was deposited thereon at a deposition rate of 0.1 nm/s, thereby forming a first electron transport layer having a thickness of 5 nm.

[Formula 39]

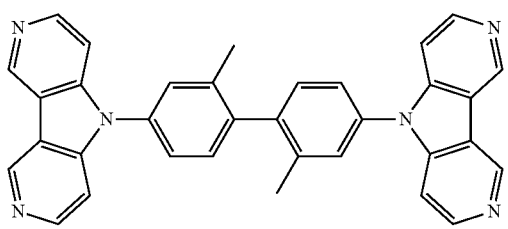

HB-1

Furthermore, an electron transport material having the following structure was deposited thereon at a deposition rate of 0.1 nm/s, thereby forming a second electron transport layer having a thickness of 45 nm.

[Formula 40]

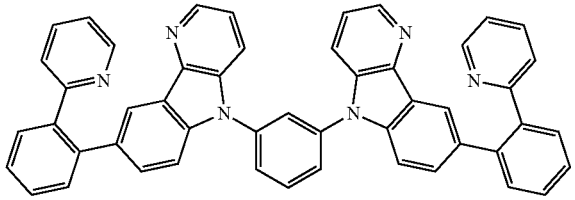

Thereafter, lithium fluoride was deposited into a thickness of 0.5 nm, and then aluminum was deposited to 100 nm thereon to form a cathode, thereby producing organic EL element 2-1.

(Production of Organic EL Elements 2-2 to 2-15)

The light-emitting layer was formed in the same manner as organic EL element 2-1 except that the host material was changed as shown in Table 2 to produce Organic EL elements 2-2 to 2-15.

(1) Relative Emission Efficiency Measurement

The organic EL element obtained was allowed to emit light with a constant electric current of 2.5 mA/cm² at room temperature (about 25° C.). Then, the emission luminance of the organic EL element immediately after the light emission started was measured by using a spectroradiometer CS-2000 (manufactured by Konica Minolta, Inc.) to calculate the emission efficiency.

The emission efficiency obtained was assigned to the following expression to determine the relative emission efficiency with respect to the emission efficiency of organic EL element 2-1.

Relative emission efficiency (%)=(Emission efficiency of each organic EL element/Emission efficiency luminance of organic EL element 2-1)×100

A larger the numeric value obtained indicates that the result is more preferable.

(2) Measurement of Variation in Relative Emission Luminance Due to Storage at High Temperature Each organic EL element produced was allowed to emit light with a constant electric current of 2.5 mA/cm² at a temperature of 100° C. The emission luminance immediately after the light emission started and the emission luminance 100 hours after the light emission started were measured by using a spectroradiometer CS-2000 (manufactured by Konica Minolta, Inc.).

The obtained emission luminance values before and after storage at a high temperature were compared to determine the variation in the emission luminance (a value determined by subtracting the emission luminance after storage at a high temperature from the emission luminance before storage at a high temperature).

The variation in the emission luminance obtained above was assigned to the following expression to determine the relative value of the emission luminance variation of each organic EL element with respect to emission luminance variation of organic EL element 2-1.

Relative emission luminance variation due to storage at a high temperature (%)=(Emission luminance variation pf each organic EL element/Emission luminance variation of organic EL element 2-1)×100

The measurement results obtained by (1) and (2) above are shown in Table 2.

TABLE 2

| Element number | Host material | Relative emission efficiency (%) | Variation in the relative emission luminance due to storage at a high temperature (%) | Remarks |
| --- | --- | --- | --- | --- |
| 2-1 | Comparative compound 2 | 100 | 100 | Comparative example |
| 2-2 | Comparative compound 4 | 103 | 90 | Comparative example |
| 2-3 | Comparative compound 12 | 105 | 83 | Comparative example |
| 2-4 | A-2 | 110 | 65 | Present invention |
| 2-5 | A-11 | 112 | 62 | Present invention |
| 2-6 | A-21 | 118 | 50 | Present invention |
| 2-7 | A-20 | 120 | 46 | Present invention |
| 2-8 | A-36 | 129 | 34 | Present invention |
| 2-9 | A-37 | 127 | 31 | Present invention |
| 2-10 | A-80 | 123 | 37 | Present invention |
| 2-11 | A-81 | 124 | 35 | Present invention |
| 2-12 | A-82 | 126 | 32 | Present invention |
| 2-13 | A-76 | 124 | 33 | Present invention |
| 2-14 | A-83 | 134 | 26 | Present invention |
| 2-15 | A-84 | 139 | 20 | Present invention |

As clearly seen from Table 2, light-emitting elements 2-4 to 2-15 of the present invention including the π-conjugated boron compound of the present invention used as a host in the light-emitting layer of the organic EL elements all have relative emission luminance of 110 or more, and the variation in the emission luminance due to storage at a high temperature is limited to 65 or less. Accordingly, it can be seen that the emission efficiency is higher and the variation in the relative emission luminance due to storage at a high temperature is smaller than those of comparative compound 1 and comparative compound 12, which have a portion around the boron where no annulation is carried out, and those of comparative compound 4, in which Y in general formula 1 is not an oxygen atom or sulfur atom but a carbon atom.

Example 3

The following compounds were used as the luminescent compound to produce organic EL elements.

[Formula 41]

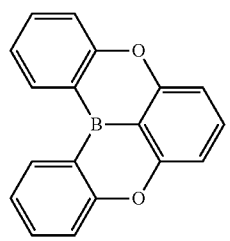

Comparative compound 1

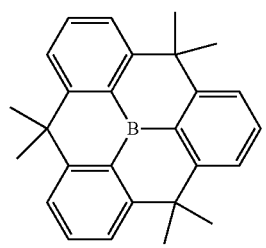

Comparative compound 3

[Formula 42]

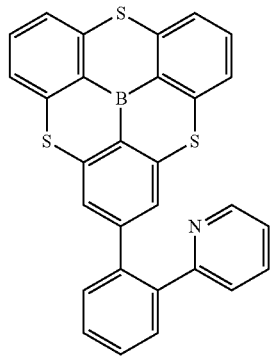

A-12

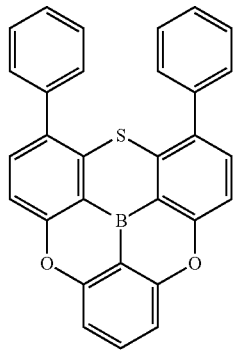

A-13

A-30
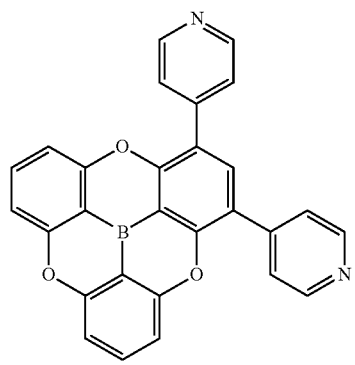
A-27
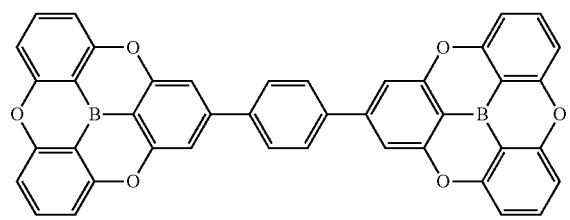
A-41
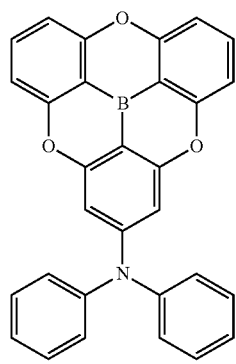
A-42
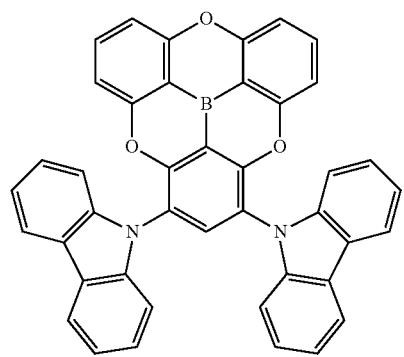
A-49
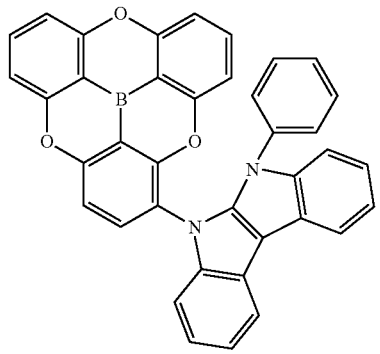
A-59
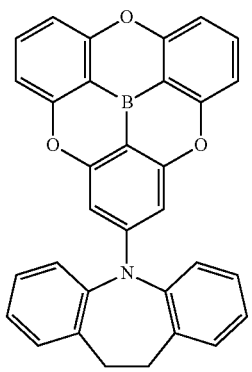
A-57
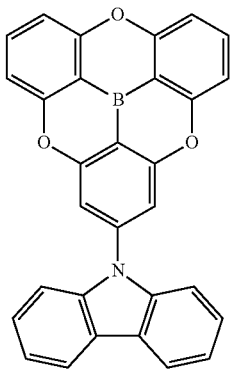
A-56
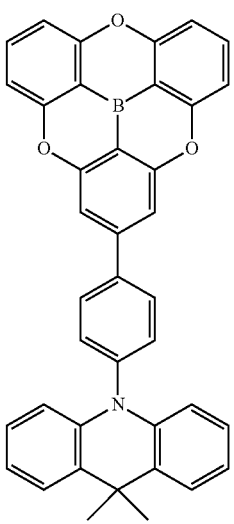

-continued

A-64
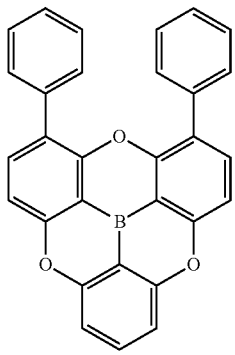

A-68
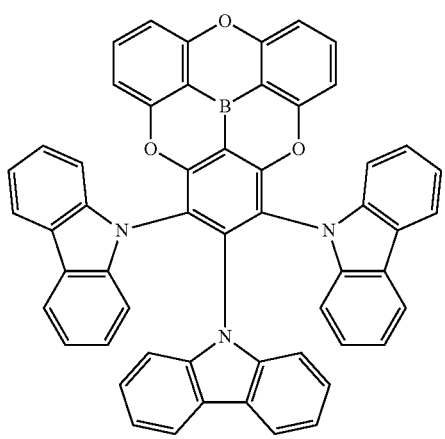

A-70
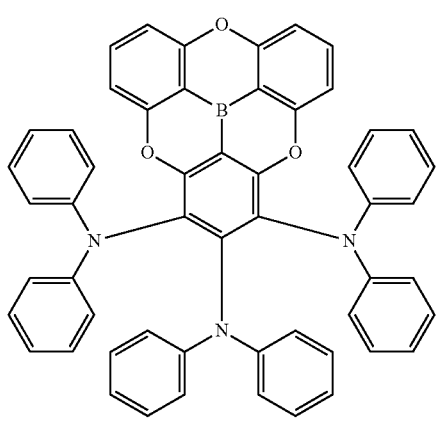

-continued

A-77
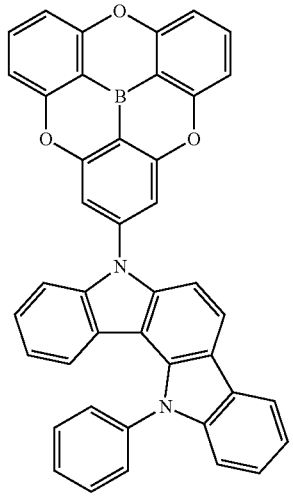

A-85

ΔEst of the above compounds was determined by calculation according to the following method.

(Calculation of $\Delta E_{ST}$)

The structure optimization calculation was carried out with software for molecular orbital calculation by using B3LYP as a functional and 6-31G (d) as a basis function. Gaussian 09 available from Gaussian Inc., USA (Revision C. 01, M. J. Frisch, et al., Gaussian, Inc., 2010) was used as the software for molecular orbital calculation. Excited state calculation by means of the time-dependent density functional theory (Time-Dependent DFT) was further carried out. Thereby, energy levels $E(S_1)$ and $E(T_1)$ of each compound were determined. The values obtained were assigned to the following expression to calculate ΔEst.

$$\Delta Est = |E(S_1) - E(T_1)|$$

(Production of Organic EL Element 3-1)

Onto a glass substrate having a size of 50 mm×50 mm×a thickness of 0.7 mm, indium tin oxide (ITO) was deposited into a thickness of 150 nm. Then, the substrate obtained was subjected to patterning to form an ITO transparent electrode, which was an anode. The transparent substrate provided with the ITO transparent electrode was ultrasonic cleaned in isopropyl alcohol, was dried with dry nitrogen gas, and then, was cleaned with UV ozone for 5 minutes. This transparent substrate obtained was fixed to a substrate holder of a commercially available vacuum evaporation apparatus.

Materials for individual layers, in optimum amounts for producing an element, were placed into individual vapor deposition crucibles in the vacuum evaporation apparatus.

The vapor deposition crucibles used were composed of a material for resistance heating, such as molybdenum or tungsten.

After the vacuum evaporation apparatus was evacuated to a degree of vacuum of $1 \times 10^{-4}$ Pa, the vapor deposition crucible containing 1,4,5,8,9,12-hexaazatriphenylene hexacarbonitrile (HAT-CN) was energized and heated to deposit HAT-CN onto the ITO transparent electrode at a deposition rate of 0.1 nm/s, thereby forming a hole injection/transport layer having a thickness of 10 nm.

Subsequently, 4,4'-bis[N-(1-naphthyl)-N-phenylamino] biphenyl (α-NPD) was deposited onto the hole injection layer at a deposition rate of 0.1 nm/s, thereby forming a hole transport layer having a thickness of 40 nm.

1,3-bis(N-carbazolyl)benzene (mCP) as the host material and comparative compound 1 as the luminescent compound were co-deposited at a deposition rate of 0.1 nm/s so as to achieve 94 vol % and 6 vol % each, thereby forming a light-emitting layer having a thickness of 30 nm.

Subsequently, 2,9-dimethyl-4,7-diphenyl-1,10-phenanthroline (BCP) was deposited at a deposition rate of 0.1 nm/s, thereby forming an electron transport layer having a thickness of 30 nm.

Additionally, lithium fluoride was deposited into a thickness of 0.5 nm, and then aluminum was further deposited to 100 nm thereon, thereby forming a cathode.

The non-light emitting surface side of the element obtained was covered with a can-shaped glass case under an atmosphere of high purity nitrogen gas having a purity of at least 99.999% and electrode extraction wiring was installed thereto, thereby producing the organic EL element 3-1.

(Production of Organic EL Elements 3-2 to 3-17)

Organic EL elements 3-2 to 3-17 were produced in the same manner as organic EL element 3-1 except that the luminescent compound was changed as shown in Table 3.

(1) Relative Emission Efficiency Measurement

The organic EL element obtained was allowed to emit light with a constant electric current of 2.5 mA/cm² at room temperature (about 25° C.). Then, the emission luminance of the organic EL element immediately after the light emission started was measured by using a spectroradiometer CS-2000 (manufactured by Konica Minolta, Inc.). The emission luminance obtained was assigned to the following expression to determine the relative emission luminance with respect to the emission luminance of organic EL element 3-1.

Relative emission efficiency (%)=(Emission efficiency of each organic EL element/Emission efficiency of organic EL element 3-1)×100

The larger the numeric value obtained, the more preferable the results.

(2) Measurement of Variation in Relative Emission Luminance Due to Storage at High Temperature Each organic EL element produced above was allowed to emit light with a constant electric current of 2.5 mA/cm² at a temperature of 100° C. The emission luminance immediately after the light emission started and the emission luminance 100 hours after the light emission started were measured by using a spectroradiometer CS-2000 (manufactured by Konica Minolta, Inc.).

The obtained emission luminance values before and after storage at a high temperature were compared to determine the variation in the emission luminance (a value determined by subtracting the emission luminance after storage at a high temperature from the emission luminance before storage at a high temperature).

The variation in the emission luminance obtained above was assigned to the following expression to determine the relative value of the emission luminance variation of each organic EL element with respect to emission luminance variation of organic EL element 3-1.

Relative emission luminance variation due to storage at a high temperature (%)=(Emission luminance variation pf each organic EL element/Emission luminance variation of organic EL element 2-1)×100

The measurement results obtained by (1) and (2) above are shown in Table 3, together with ΔEst of the luminescent compounds.

TABLE 3

| Element number | Luminescent compound | ΔEst (eV) | Relative emission efficiency (%) | Variation in the relative emission luminance due to storage at a high temperature (%) | Remarks |
| --- | --- | --- | --- | --- | --- |
| 3-1 | Comparative compound 1 | 0.52 | 100 | 100 | Comparative example |
| 3-2 | Comparative compound 3 | 0.76 | 106 | 94 | Comparative example |
| 3-3 | A-12 | 0.54 | 115 | 68 | Present invention |
| 3-4 | A-13 | 0.51 | 118 | 69 | Present invention |
| 3-5 | A-30 | 0.64 | 127 | 55 | Present invention |
| 3-6 | A-64 | 0.51 | 125 | 47 | Present invention |
| 3-7 | A-27 | 0.59 | 132 | 48 | Present invention |
| 3-8 | A-41 | 0.51 | 140 | 45 | Present invention |
| 3-9 | A-42 | 0.20 | 148 | 33 | Present invention |
| 3-10 | A-57 | 0.01 | 152 | 38 | Present invention |
| 3-11 | A-56 | 0.30 | 153 | 36 | Present invention |
| 3-12 | A-85 | 0.02 | 139 | 44 | Present invention |
| 3-13 | A-59 | 0.12 | 143 | 42 | Present invention |
| 3-14 | A-49 | 0.48 | 140 | 34 | Present invention |
| 3-15 | A-77 | 1.17 | 145 | 36 | Present invention |
| 3-16 | A-70 | 0.28 | 154 | 25 | Present invention |
| 3-17 | A-68 | 0.15 | 158 | 22 | Present invention |

As clearly seen from Table 3, light-emitting elements 3-3 to 3-17 of the present invention including the π-conjugated boron compound of the present invention used as the luminescent compound in the light-emitting layer of the organic EL elements all have relative emission efficiency of 115 or more, and the variation in the relative emission luminance due to storage at a high temperature is limited to 69 or less. Accordingly, it can be seen that the emission efficiency is higher and the variation in the relative emission luminance due to storage at a high temperature is smaller than those of comparative compound 1, which has a portion around the boron where no annulation is carried out, and those of comparative compound 3, in which Y in general formula 1 is not an oxygen atom or sulfur atom but carbon.

It also can be seen that organic EL element 3-6 including compound A-64, in which all of Y in general formula 1 are an oxygen atom, as the luminescent compound, has higher emission efficiency and a smaller variation in the relative emission luminance due to storage at a higher temperature than that those of organic EL element 3-4 including compound A-13, which has a structure similar to that of compound A-64 and in which one of Y moieties is substituted with a sulfur atom, as the luminescent compound.

Example 4

The following compounds were used as the electron transport layer material to produce electron-only devices.

[Formula 43]

Comparative compound 5

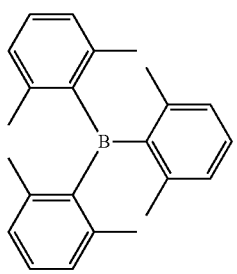

Comparative compound 6

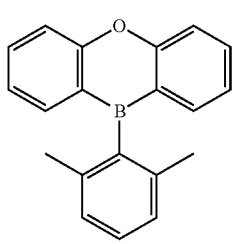

Comparative compound 7

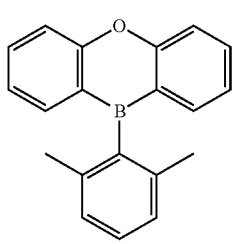

[Formula 44]

Comparative compound 1

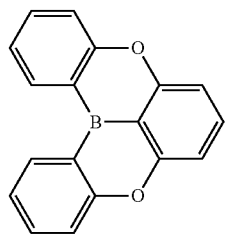

A-65

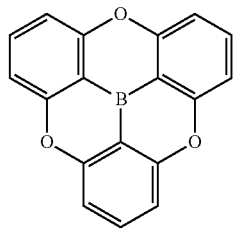

A-69

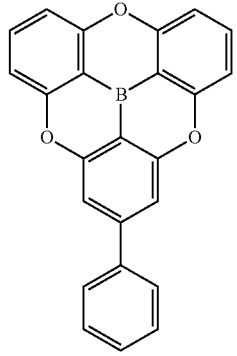

A-60

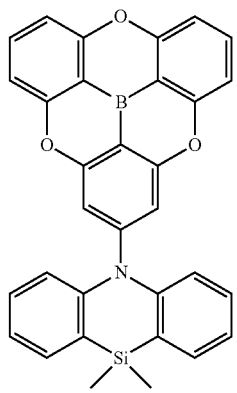

A-57

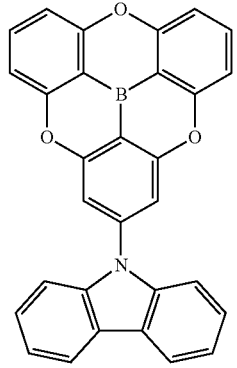

-continued

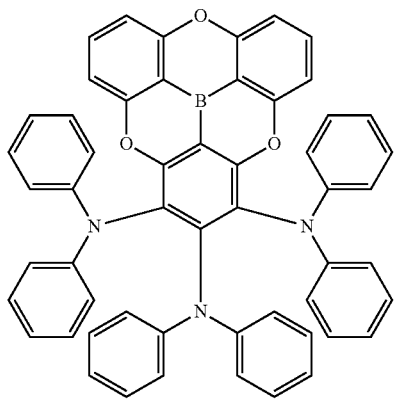

A-70

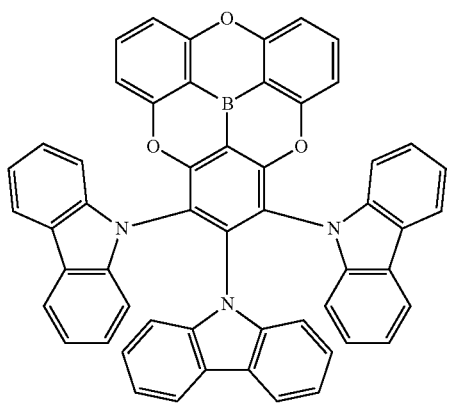

A-68

[Formula 45]

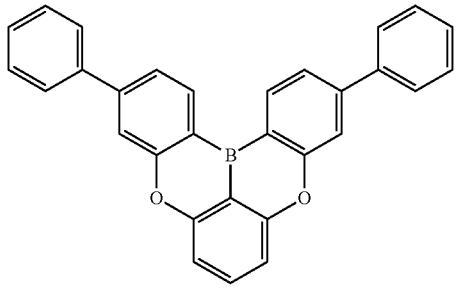

Comparative compound 10

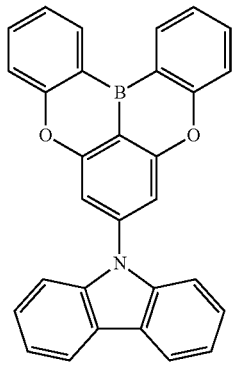

Comparartive compound 8

-continued

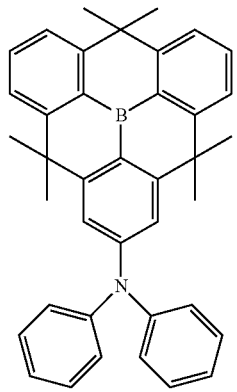

Comparative compound 9

(Production of Organic EL Element 4-1)

Onto a glass substrate having a size of 50 mm×50 mm×a thickness of 0.7 mm, indium tin oxide (ITO) was deposited into a thickness of 150 nm. Then, the substrate obtained was subjected to patterning to form an ITO transparent electrode, which was an anode. The transparent substrate provided with the ITO transparent electrode was ultrasonic cleaned in isopropyl alcohol, was dried with dry nitrogen gas, and then, was cleaned with UV ozone for 5 minutes. This transparent substrate obtained was fixed to a substrate holder of a commercially available vacuum evaporation apparatus.

Materials for individual layers, in optimum amounts for producing an element, were placed into individual resistive-heating boats in the vacuum evaporation apparatus. The resistive-heating boats used were composed of molybdenum or tungsten.

After the vacuum evaporation apparatus was evacuated to a degree of vacuum of $1\times10^{-4}$ Pa, a resistive-heating boat containing calcium was energized and heated to deposit calcium onto the ITO transparent electrode, thereby forming a layer made of calcium having a thickness of 5.0 nm.

Subsequently, on this light-emitting layer, comparative compound 5, as an electron transport material, was deposited to 120 nm, providing an electron transport layer.

Subsequently, lithium fluoride as an electron injection layer and aluminum as a cathode were deposited to 0.5 nm and 100 nm respectively to produce organic EL element 4-1.

<<Production of Organic EL Elements 4-2 to 4-10>>

Organic EL elements 4-2 to 4-10 were each produced in the same manner as organic EL element 4-1 except that the electron transport material was changed to compounds shown in Table 4.

(1) Measurement of Relative Drive Voltage

With respect to each electron-only device produced, front luminance was measured at both the transparent electrode side (i.e., transparent substrate side) and the opposing electrode side (i.e., cathode side) of each electron-only device, and the voltage when the sum of the front luminance values reached 1,000 cd/m² was determined as a drive voltage (V). Luminance was measured by using a spectroradiometer CS-1000 (manufactured by Konica Minolta Sensing Inc.)

The drive voltage obtained above was assigned to the following expression to determine the relative drive voltage of each electron-only device with respect to the drive voltage of organic EL element 4-1.

Relative drive voltage (%)=(Drive voltage of each electron-only device/Drive voltage of electron-only device 4-1)×100

A smaller numeric value obtained indicates that the result is more preferable.

(2) Measurement of Variation in Relative Emission Luminance Due to Storage at High Temperature Each electron-only device produced above was allowed to emit light with a constant electric current of 2.5 mA/cm² at a temperature of 80° C. The emission luminance immediately after the light emission started and the emission luminance 100 hours after the light emission started were measured by using a spectroradiometer CS-2000 (manufactured by Konica Minolta, Inc.).

The obtained emission luminance values before and after storage at a high temperature were compared to determine the variation in the emission luminance (a value determined by subtracting the emission luminance after storage at a high temperature from the emission luminance before storage at a high temperature).

The variation in the emission luminance obtained above was assigned to the following expression to determine the relative value of the emission luminance variation of each electron-only device with respect to emission luminance variation of organic EL element 4-1.

Relative emission luminance variation due to storage at a high temperature (%)=(Emission luminance variation of each electron-only device/Emission luminance variation of electron-only device 4-1)×100

The measurement results obtained by (1) and (2) above are shown in Table 4.

TABLE 4

| Element number | Electron transport layer material | Relative drive voltage (%) | Variation in the drive voltage due to storage at a high temperature (%) | Remarks |
|---|---|---|---|---|
| 4-1 | Comparative compound 5 | 100 | 302 | Comparative example |
| 4-2 | Comparative compound 6 | 52 | 84 | Comparative example |
| 4-3 | Comparative compound 7 | 33 | 53 | Comparative example |
| 4-4 | Comparative compound 1 | 25 | 31 | Comparative example |
| 4-5 | A-65 | 18 | 20 | Present invention |
| 4-6 | A-69 | 14 | 17 | Present invention |
| 4-7 | A-60 | 11 | 16 | Present invention |
| 4-8 | A-57 | 13 | 15 | Present invention |
| 4-9 | A-70 | 7 | 9 | Present invention |
| 4-10 | A-68 | 5 | 6 | Present invention |

As clearly seen from Table 4, light-emitting elements 4-5 to 4-10 of the present invention including the π-conjugated boron compound of the present invention used in the electron transport layer of the electron-only devices all have a relative drive voltage of 18 or less, and the variation in the relative emission luminance due to storage at a high temperature is limited to 20 or less.

From these results, it can be seen that the π-conjugated boron compound of the present invention has a lower relative drive voltage and a smaller variation in the relative emission luminance due to storage at a high temperature than those of comparative compound 5 and comparative compound 6, to which a shielding effect is imparted by introducing methyl groups and phenyl groups into aryl groups around the boron, those of comparative compound 7, which is a phenoxaborin derivative obtained by crosslinking by means of an oxygen atom in one direction around the boron, and those of comparative compound 1, which has a double phenoxaborin skeleton around the boron.

Example 5

The following compound were used as the host material to produce organic EL elements.

[Formula 46]

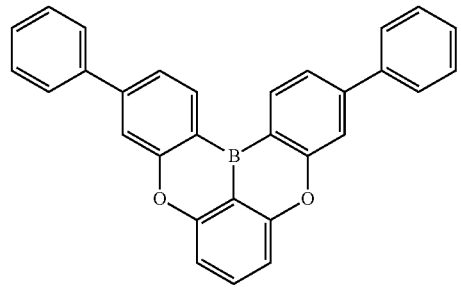

Comparative compound 10

-continued

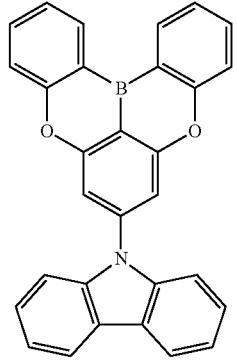

Comparative compound 8

Comparative compound 9
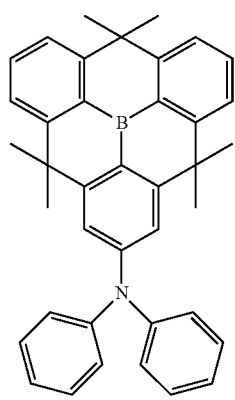
[Formula 47]
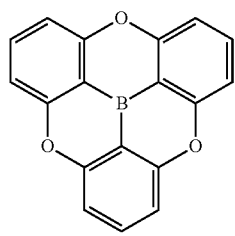
A-65
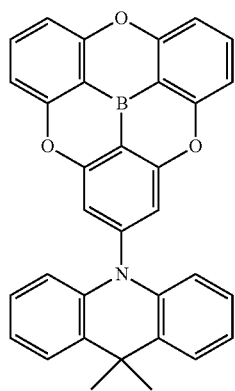
A-58
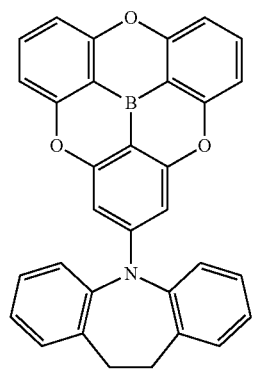
A-59
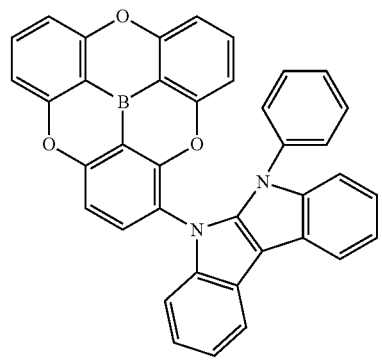
A-49
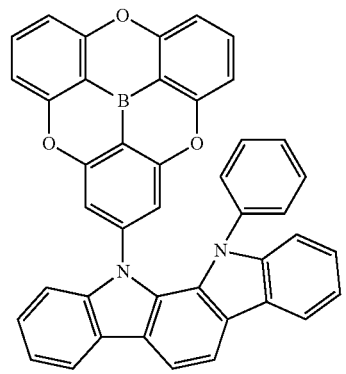
A-66
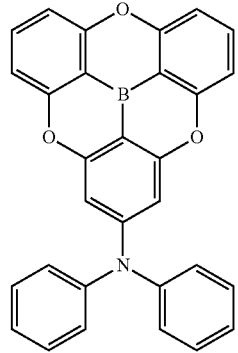
A-41
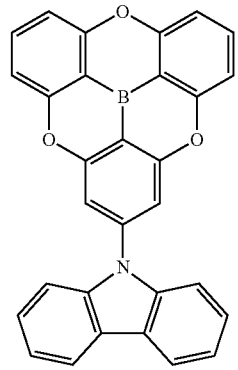
A-57

-continued

A-70

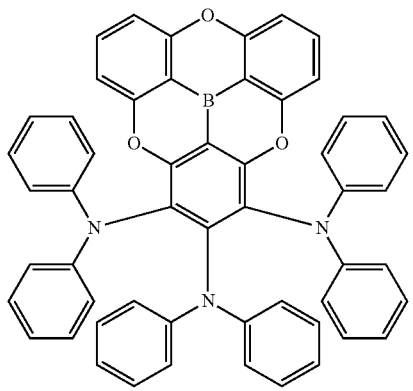

A-71

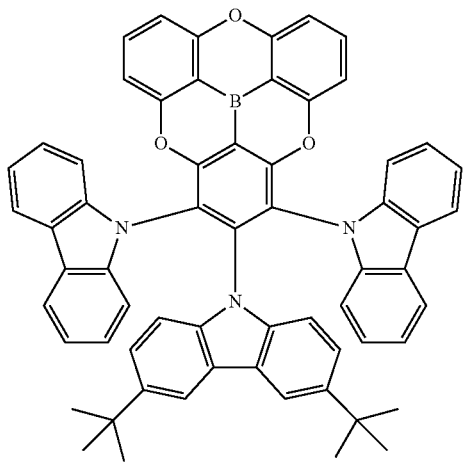

(Production of Organic EL Element 5-1)

Onto a glass substrate having a size of 50 mm×50 mm and a thickness of 0.7 mm, indium tin oxide (ITO) was deposited into a thickness of 150 nm as an anode, which was subjected to patterning. Subsequently, the transparent substrate provided with the ITO transparent electrode was ultrasonic cleaned in isopropyl alcohol, was dried with dry nitrogen gas, and was cleaned with UV ozone for 5 minutes. This transparent substrate was fixed to a substrate holder of a commercially available vacuum evaporation apparatus.

Materials for individual layers, in optimum amounts for producing an element, were placed into individual resistive-heating boats in the vacuum evaporation apparatus. The resistive-heating boats used were composed of molybdenum or tungsten.

After the apparatus was evacuated to a degree of vacuum of $1\times10^{-4}$ Pa, a resistive-heating boat containing HAT-CN was energized and heated to deposit HAT-CN onto the ITO transparent electrode at a deposition rate of 0.1 nm/s, thereby forming a hole injection layer having a thickness of 10 nm.

Subsequently, α-NPD was deposited thereon at a deposition rate of 0.1 nm/s, thereby forming a hole transport layer having a thickness of 25 nm.

Then, resistive-heating boats each containing comparative compound 8, which was a host compound for comparison, and FIrpic were energized and heated to co-deposit comparative compound 8 at a deposition rate of 0.1 nm/s and FIrpic at 0.010 nm/s onto the hole transport layer, thereby forming a light-emitting layer having a thickness of 35 nm.

Subsequently, HB-1 was deposited thereon at a deposition rate of 0.1 nm/s, thereby forming a first electron transport layer having a thickness of 5 nm.

Furthermore, an electron transport material was deposited thereon at a deposition rate of 0.1 nm/s, thereby forming a second electron transport layer having a thickness of 40 nm.

Thereafter, lithium fluoride was deposited into a thickness of 0.5 nm, and then aluminum was deposited to 100 nm thereon to form a cathode, thereby producing organic EL element 5-1.

(Production of Organic EL Elements 5-2, 5-3, 5-5, 5-7, 5-9 to 5-12, 5-14, 5-16, and 5-18)

Organic EL elements 5-2, 5-3, 5-5, 5-7, 5-9 to 5-12, 5-14, 5-16, and 5-18 were produced in the same manner as organic EL element 5-1 except that the host material was changed from comparative compound 8 to those shown in Table 5.

(Production of Organic EL Element 5-4, 5-6, 5-8, 5-13, 5-15, 5-17, and 5-19)

Organic EL elements 5-4, 5-6, 5-8, 5-13, 5-15, 5-17, and 5-19 were produced in the same manner as organic EL element 5-1 except that the host compound was changed as shown in Table 5 and FIrpic was replaced by Dopant-1.

[Formula 48]

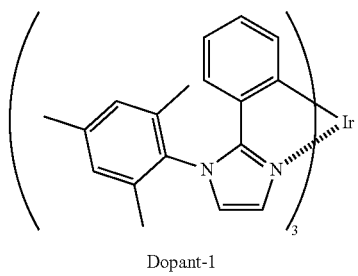

Dopant-1

TABLE 5

| Element number | Host material | Dopant material | Relative emission luminance (%) | Variation in the emission luminance due to storage at a high temperature (%) | Remarks |
| --- | --- | --- | --- | --- | --- |
| 5-1 | Comparative compound 8 | FIrpic | 100 | 100 | Comparative example |
| 5-2 | Comparative compound 10 | FIrpic | 95 | 98 | Comparative example |
| 5-3 | Comparative compound 9 | FIrpic | 105 | 97 | Comparative example |
| 5-4 | Comparative compound 9 | Dopant-1 | 108 | 93 | Comparative example |
| 5-5 | A-65 | FIrpic | 116 | 89 | Present invention |

TABLE 5-continued

| Element number | Host material | Dopant material | Relative emission luminance (%) | Variation in the emission luminance due to storage at a high temperature (%) | Remarks |
|---|---|---|---|---|---|
| 5-6 | A-65 | Dopant-1 | 121 | 87 | Present invention |
| 5-7 | A-58 | Firpic | 125 | 78 | Present invention |
| 5-8 | A-58 | Dopant-1 | 128 | 70 | Present invention |
| 5-9 | A-59 | Firpic | 120 | 65 | Present invention |
| 5-10 | A-49 | Firpic | 122 | 52 | Present invention |
| 5-11 | A-66 | Firpic | 121 | 51 | Present invention |
| 5-12 | A-41 | Firpic | 128 | 40 | Present invention |
| 5-13 | A-41 | Dopant-1 | 129 | 33 | Present invention |
| 5-14 | A-57 | Firpic | 131 | 39 | Present invention |
| 5-15 | A-57 | Dopant-1 | 139 | 31 | Present invention |
| 5-16 | A-70 | Firpic | 145 | 32 | Present invention |
| 5-17 | A-70 | Dopant-1 | 149 | 30 | Present invention |
| 5-18 | A-71 | Firpic | 154 | 28 | Present invention |
| 5-19 | A-71 | Dopant-1 | 155 | 25 | Present invention |

As clearly seen from Table 5, light-emitting elements 5-5 to 5-19 of the present invention including the π-conjugated boron compound of the present invention used as the host material in the light-emitting layer of the organic EL elements all have relative emission efficiency of 116 or more, and the variation in the relative emission luminance due to storage at a high temperature is limited to 89 or less. Accordingly, it can be seen that the relative drive voltage is lower and the variation in the relative emission luminance due to storage at a high temperature is smaller than those of comparative compound 8 and comparative compound 10, which have a portion around the boron where no annulation is carried out, and those of comparative compound 9, in which Y in general formula 1 is not an oxygen atom or sulfur atom but carbon.

Example 6

The following compounds were used for the electron transport layer to produce organic EL elements.

[Formula 49]

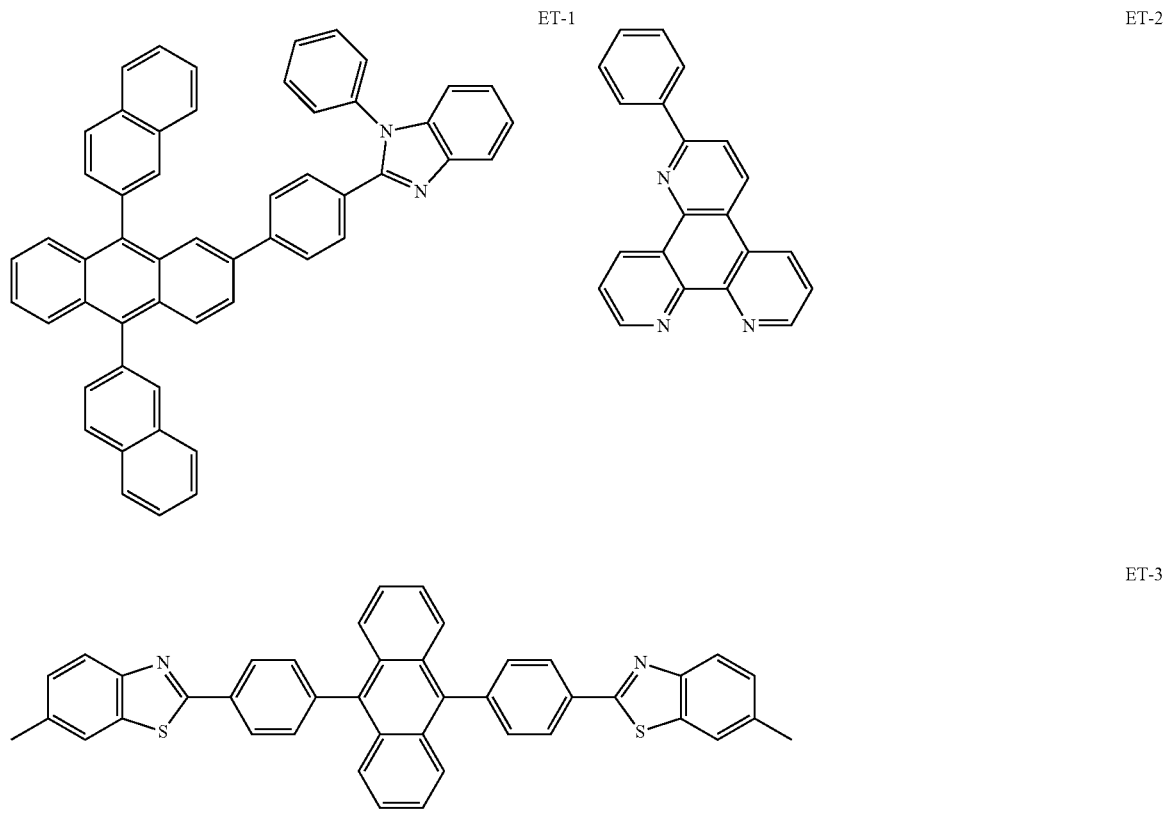

ET-4
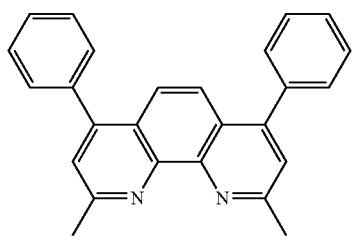
ET-5
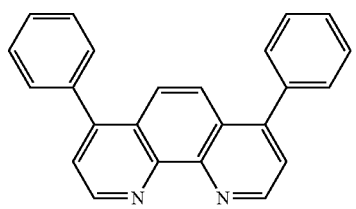
ET-6
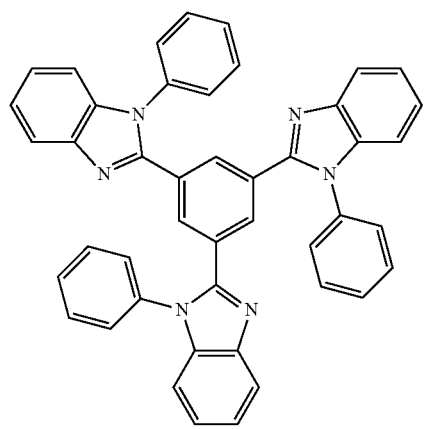
ET-7
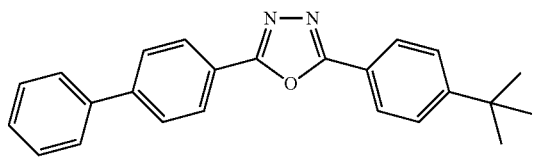
ET-8
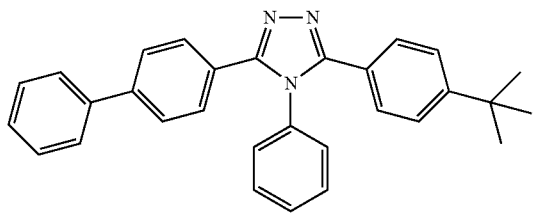
ET-9
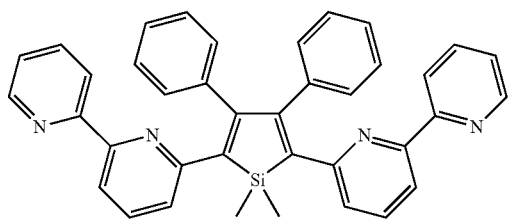
[Formula 50]
Comparative compound 2
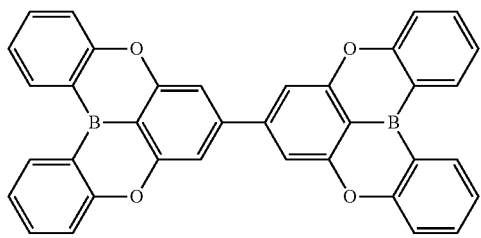
Comparative compound 4
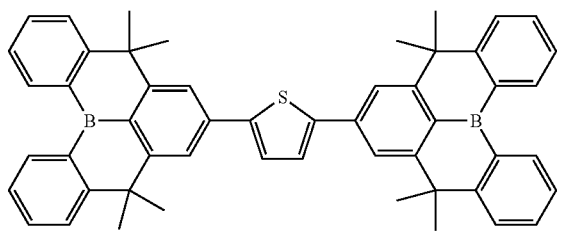
[Formula 51]
A-1
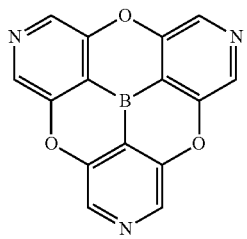
A-2
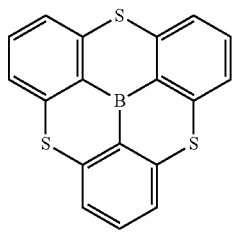

-continued
A-21
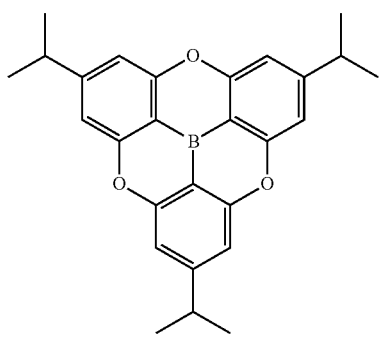
A-26
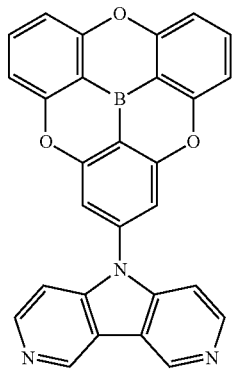
A-28
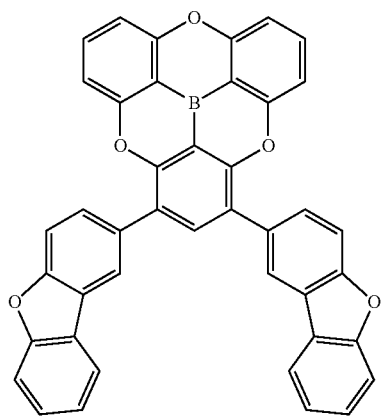
A-34
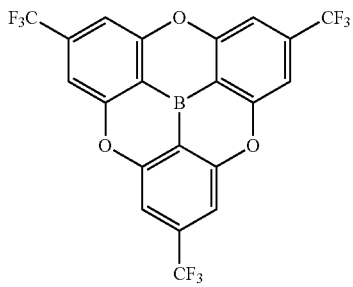
A-36
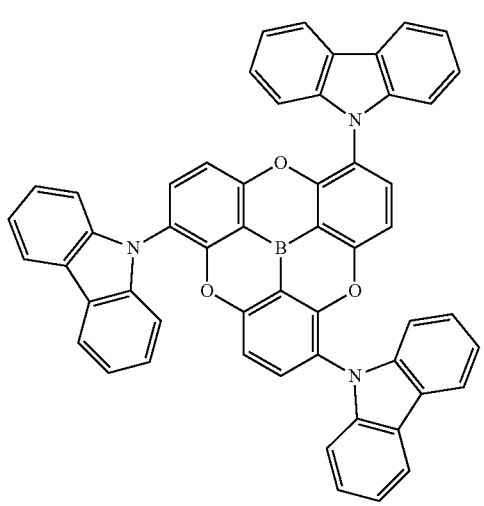
A-60
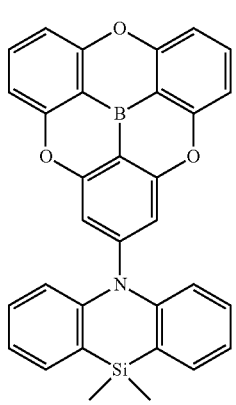

-continued
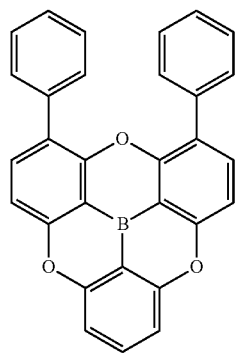
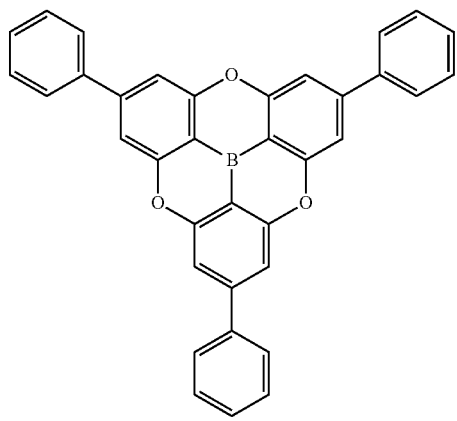
A-64 A-91
[Formula 52]
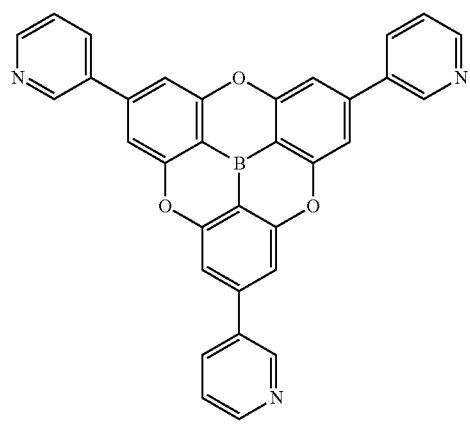
A-93
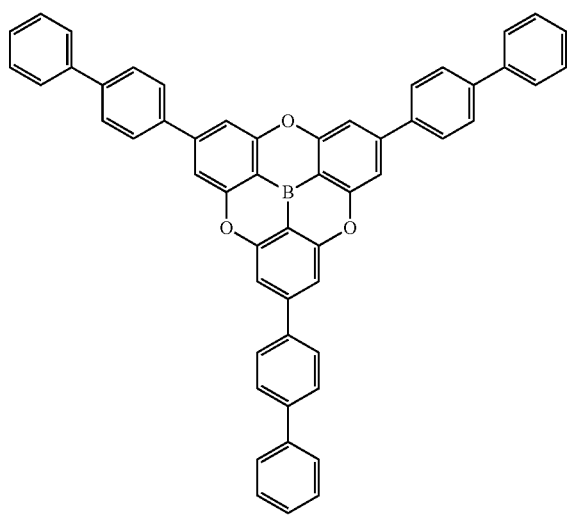
A-95
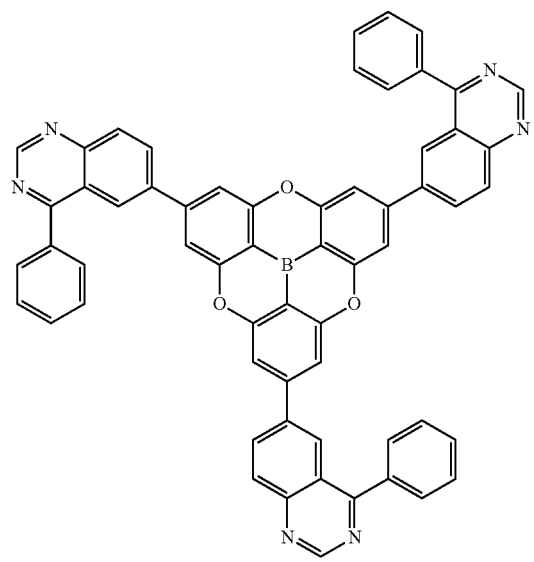
A-97
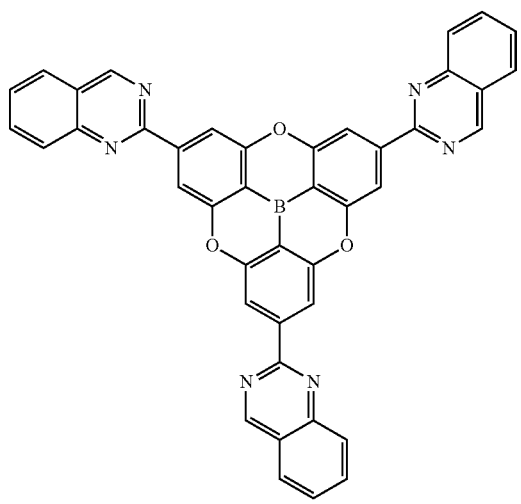
A-98

<<Production of Organic EL Elements 6-1 to 6-18>>

Organic EL elements 6-1 to 6-18 were each produced in the same manner as organic EL element 1-1 except that the electron transport material was changed to compounds shown in Table 6.

(1) Measurement of Relative Drive Voltage

With respect to each organic EL element produced, front luminance was measured at both the transparent electrode side (i.e., transparent substrate side) and the opposing electrode side (i.e., cathode side) of each organic EL element, and the voltage when the sum thereof reached 1,000 cd/m$^2$ was determined as a drive voltage (V). Luminance was measured by using a spectroradiometer CS-1000 (manufactured by Konica Minolta Sensing Inc.)

The drive voltage obtained above was assigned to the following expression to determine the relative drive voltage of each organic EL element with respect to the drive voltage of organic EL element 6-1.

Relative drive voltage (%)=(Drive voltage of each organic EL element/Drive voltage of organic EL element 6-1)×100

A smaller numeric value obtained indicates that the result is more preferable.

(2) Color Shift

The initial emission spectrum of each organic EL element produced was measured to determine the x value and y value in the CIE chromaticity coordinates. Further, the x value and y value were determined from the emission spectrum after driving (when the luminance reached 50%). The difference between the initial x and y values and the x and y values after driving was determined from the distance on the chromaticity coordinates and evaluated as a relative value based on the distance of organic EL element 6-1 as 100.

TABLE 6

| Element number | Electron transport material | π-conjugated compound | Relative drive voltage (%) | Color shift (%) | Remarks |
|---|---|---|---|---|---|
| 6-1 | ET-1 | — | 100 | 100 | Comparative example |
| 6-2 | ET-7 | — | 103 | 90 | Comparative example |
| 6-3 | ET-1 | A-28 | 75 | 80 | Present invention |
| 6-4 | ET-1 | A-1 | 69 | 77 | Present invention |
| 6-5 | ET-2 | A-2 | 70 | 75 | Present invention |
| 6-6 | ET-3 | A-21 | 71 | 78 | Present invention |
| 6-7 | ET-4 | A-26 | 68 | 79 | Present invention |
| 6-8 | ET-5 | A-34 | 67 | 75 | Present invention |
| 6-9 | ET-5 | A-36 | 70 | 74 | Present invention |
| 6-10 | ET-6 | A-60 | 70 | 77 | Present invention |
| 6-11 | ET-6 | A-64 | 69 | 80 | Present invention |
| 6-12 | ET-7 | A-91 | 68 | 75 | Present invention |
| 6-13 | ET-7 | A-93 | 69 | 72 | Present invention |
| 6-14 | ET-8 | A-95 | 71 | 79 | Present invention |
| 6-15 | ET-9 | A-97 | 72 | 77 | Present invention |
| 6-16 | ET-9 | A-98 | 69 | 77 | Present invention |
| 6-17 | ET-1 | Comparative compound 2 | 90 | 117 | Comparative example |
| 6-18 | ET-7 | Comparative compound 4 | 88 | 110 | Comparative example |

As clearly seen from Table 6, organic EL elements 6-3 to 6-16 of the present invention including the π-conjugated boron compound of the present invention together with the electron transport material used in the electron transport layer of the organic EL elements all have a relative drive voltage of 75 or less, and their color shift is suppressed. Accordingly, it can be seen that the relative drive voltage is lower and the color shift is less than those of comparative compound 2, which has a portion around the boron where no annulation is carried out, and those of comparative compound 4, in which Y in general formula 1 is not an oxygen atom or sulfur atom but a carbon atom.

Example 7

The following compounds were used for the hole transport layer to produce organic EL elements.

[Formula 53]
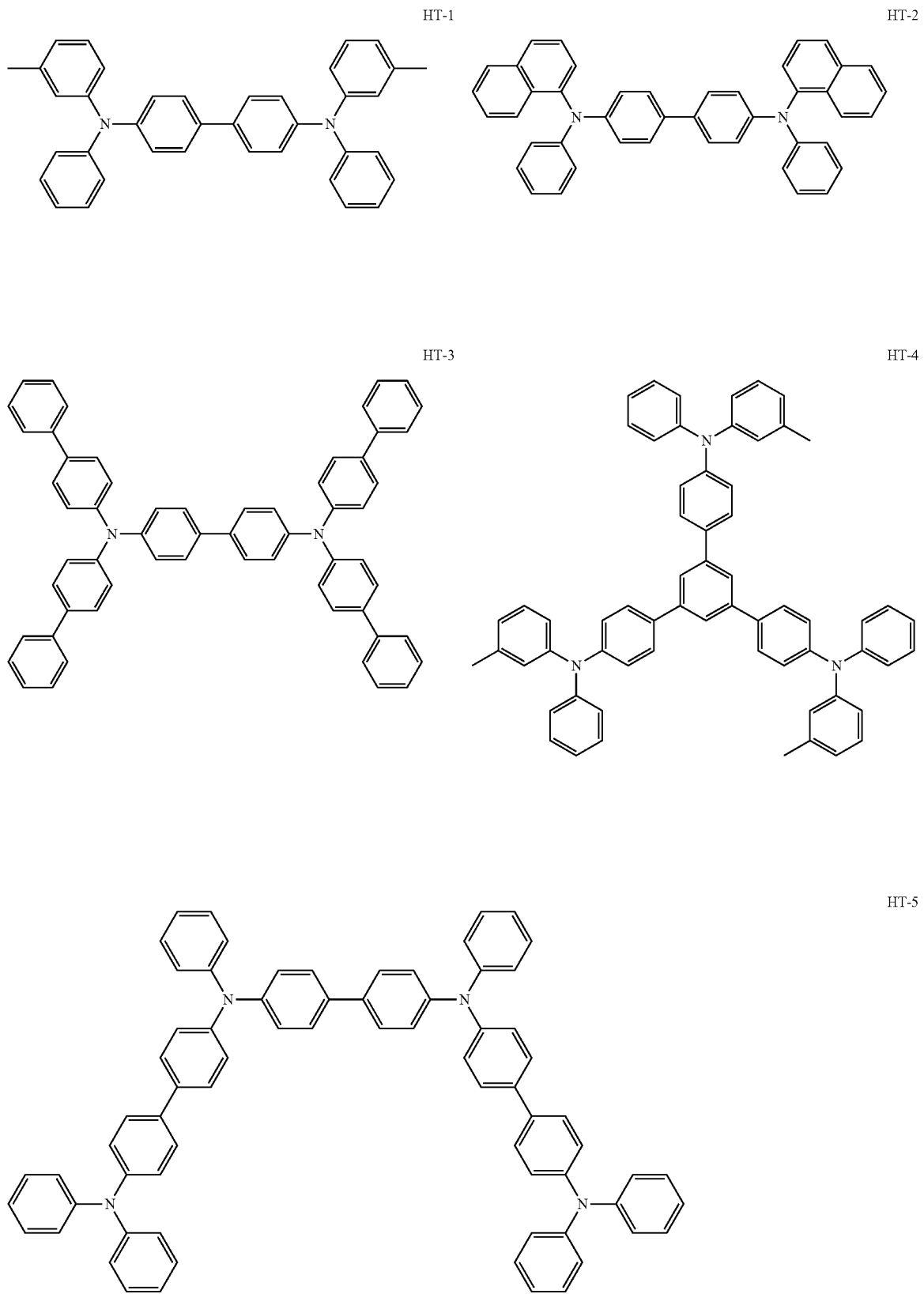

-continued
HT-6
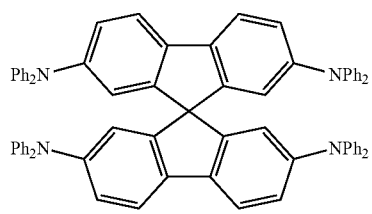
HT-7
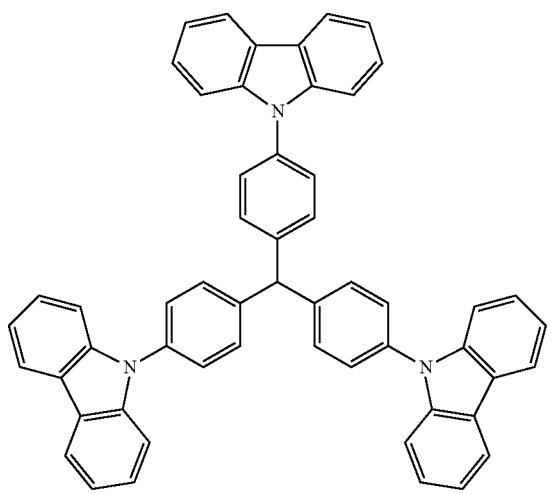
HT-8
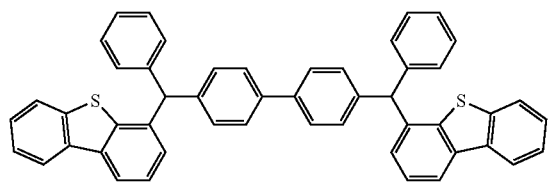
HT-9
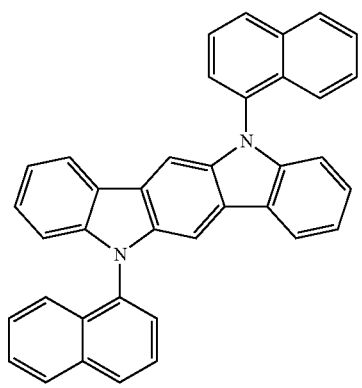
HT-10
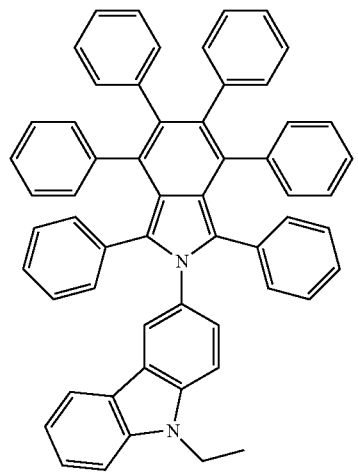

[Formula 54]
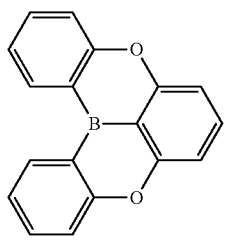
[Formula 55]
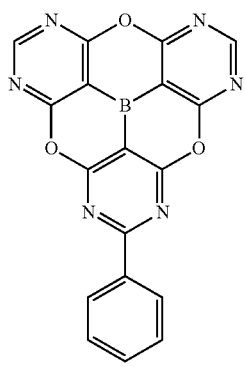
-continued
Comparative compound 3
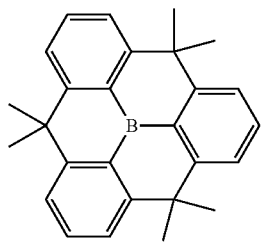
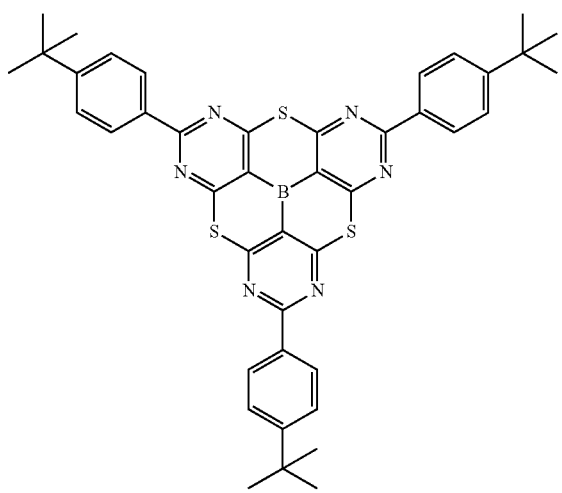
A-3
A-5
A-6
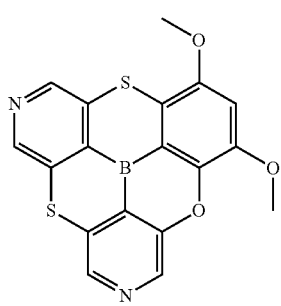
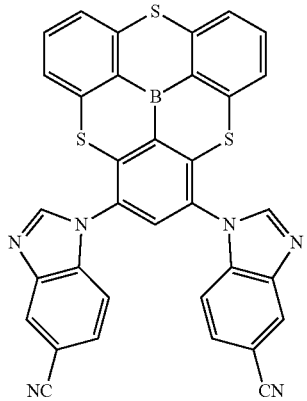
A-17
A-20
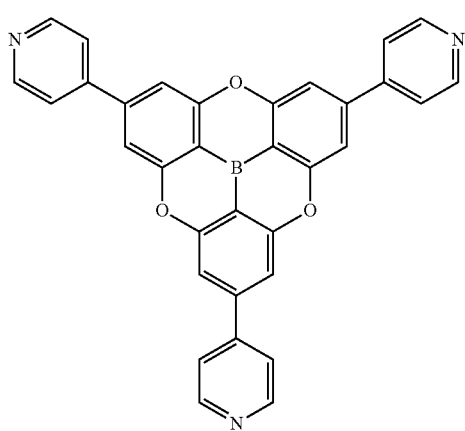
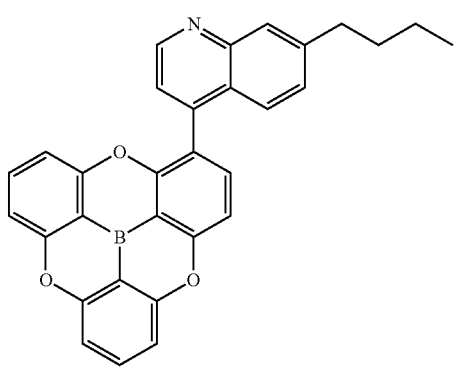
A-31

-continued
A-39 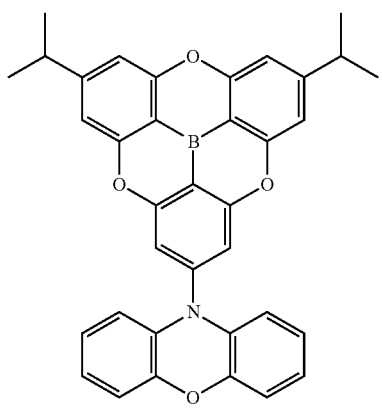
A-48 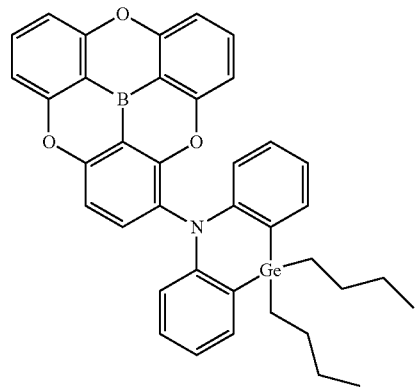
A-58 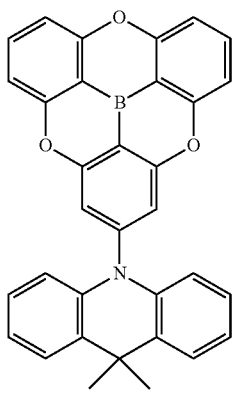
A-69 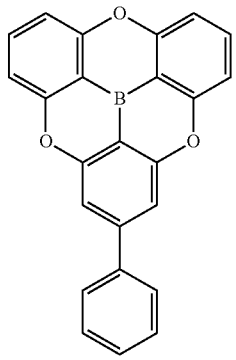
A-79 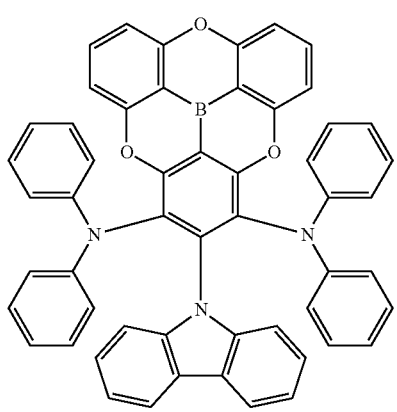

[Formula 56]

A-92

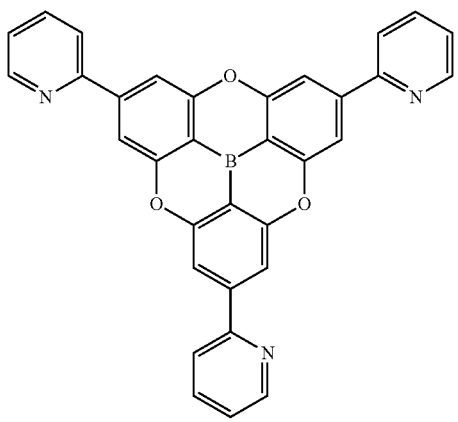

A-96

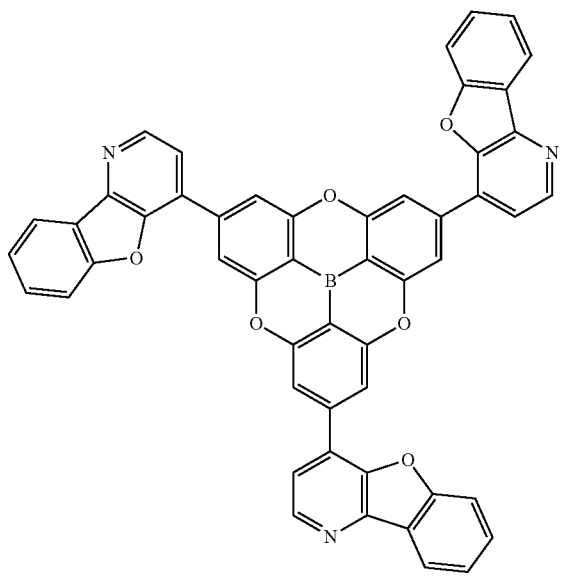

A-98

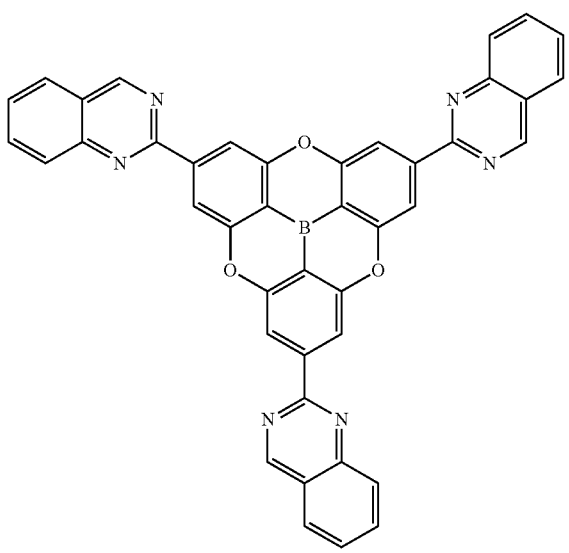

<<Production of Organic EL Elements 7-1 to 7-18>>

Organic EL elements 7-1 to 7-18 were each produced in the same manner as organic EL element 1-1 except that the hole transport material was changed to compounds shown in Table 7.

(1) Measurement of Relative Drive Voltage

With respect to each organic EL element produced, front luminance was measured at both the transparent electrode side (i.e., transparent substrate side) and the opposing electrode side (i.e., cathode side) of each organic EL element, and the voltage when the sum thereof reached 1,000 cd/m$^2$ was determined as a drive voltage (V). Luminance was measured by using a spectroradiometer CS-1000 (manufactured by Konica Minolta Sensing Inc.)

The drive voltage obtained above was assigned to the following expression to determine the relative drive voltage of each organic EL element with respect to the drive voltage of organic EL element 7-1.

Relative drive voltage (%)=(Drive voltage of each organic EL element/Drive voltage of organic EL element 7-1)×100

A smaller numeric value obtained indicates that the result is more preferable.

(2) Color Shift

The initial emission spectrum of each organic EL element produced was measured to determine the x value and y value in the CIE chromaticity coordinates. Further, the x value and y value were determined from the emission spectrum after driving (when the luminance reached 50%). The difference between the initial x and y values and the x and y values after driving was determined from the distance on the chromaticity coordinates and shown as a relative value based on the distance of organic EL element 7-1 as 100.

TABLE 7

| Element number | Hole transport layer | | Relative drive voltage (%) | Color shift (%) | Remarks |
|---|---|---|---|---|---|
| | Hole transport material | π-conjugated compound | | | |
| 7-1 | HT-2 | — | 100 | 100 | Comparative example |
| 7-2 | HT-5 | — | 105 | 102 | Comparative example |
| 7-3 | HT-1 | A-3 | 80 | 77 | Present invention |
| 7-4 | HT-1 | A-5 | 81 | 79 | Present invention |
| 7-5 | HT-2 | A-6 | 83 | 75 | Present invention |
| 7-6 | HT-2 | A-17 | 79 | 74 | Present invention |
| 7-7 | HT-3 | A-20 | 81 | 76 | Present invention |
| 7-8 | HT-4 | A-31 | 82 | 75 | Present invention |
| 7-9 | HT-5 | A-39 | 78 | 75 | Present invention |
| 7-10 | HT-5 | A-48 | 75 | 78 | Present invention |
| 7-11 | HT-6 | A-58 | 77 | 81 | Present invention |
| 7-12 | HT-7 | A-69 | 79 | 75 | Present invention |
| 7-13 | HT-8 | A-79 | 81 | 77 | Present invention |
| 7-14 | HT-9 | A-92 | 80 | 81 | Present invention |
| 7-15 | HT-10 | A-96 | 81 | 76 | Present invention |
| 7-16 | HT-9 | A-98 | 81 | 79 | Present invention |
| 7-17 | HT-2 | Comparative compound 1 | 95 | 120 | Comparative example |
| 7-18 | HT-5 | Comparative compound 3 | 94 | 118 | Comparative example |

As clearly seen from Table 7, organic EL elements 7-3 to 7-16 of the present invention including the π-conjugated boron compound of the present invention together with the hole transport material used in the hole transport layer of the organic EL elements all have a relative drive voltage of 75 or less, and their color shift is suppressed. Accordingly, it can be seen that the relative drive voltage is lower and the color shift is less than those of comparative compound 1, which has a portion around the boron where no annulation is carried out, and those of comparative compound 3, in which Y in general formula 1 is not an oxygen atom or sulfur atom but a carbon atom.

Example 8

The following compounds were used as the electron injection layer to produce organic EL elements.

[Formula 57]

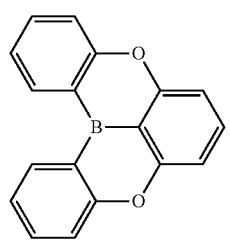

Comparative compound 1

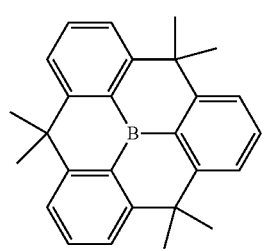

Comparative compound 3

-continued

[Formula 58]

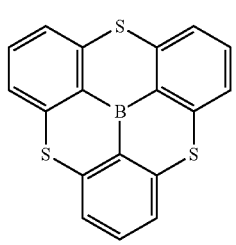

A-1

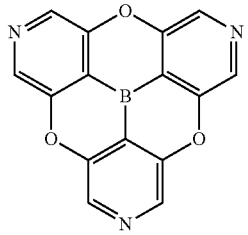

A-2

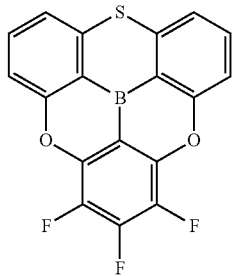

A-16

A-20
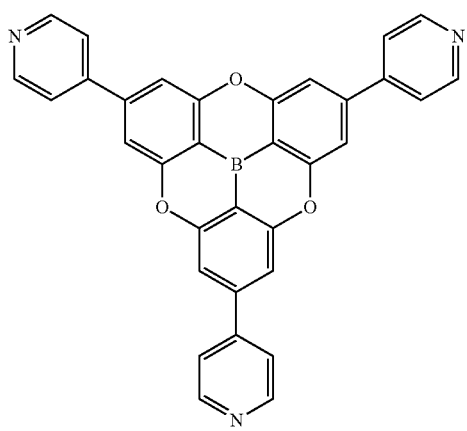
A-57
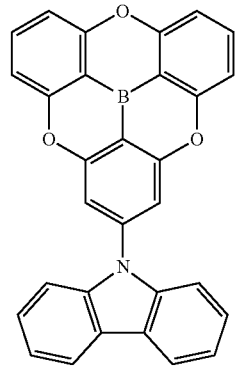
A-21
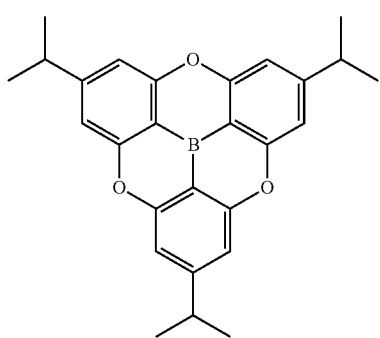
[Formula 59]
A-92
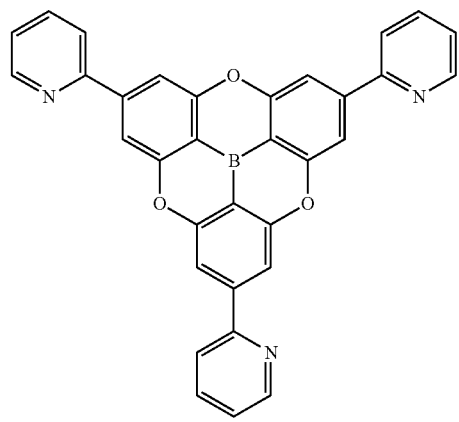
A-22
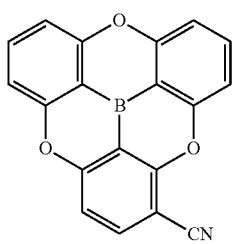
A-34
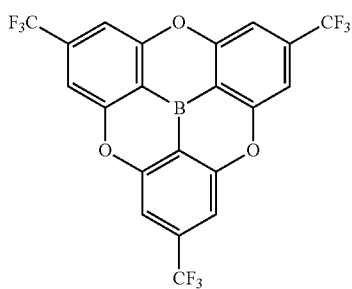
A-93
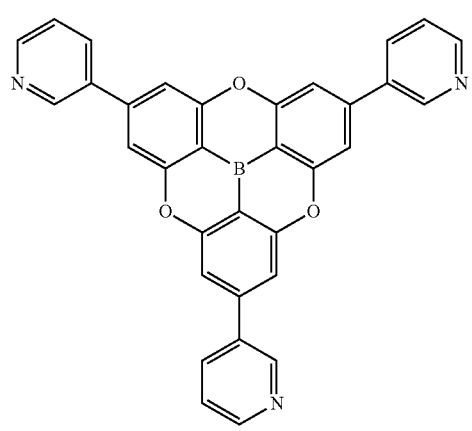

-continued

A-95

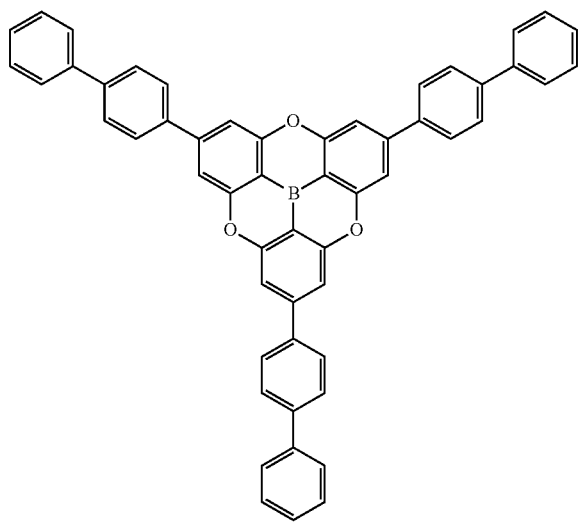

A-96

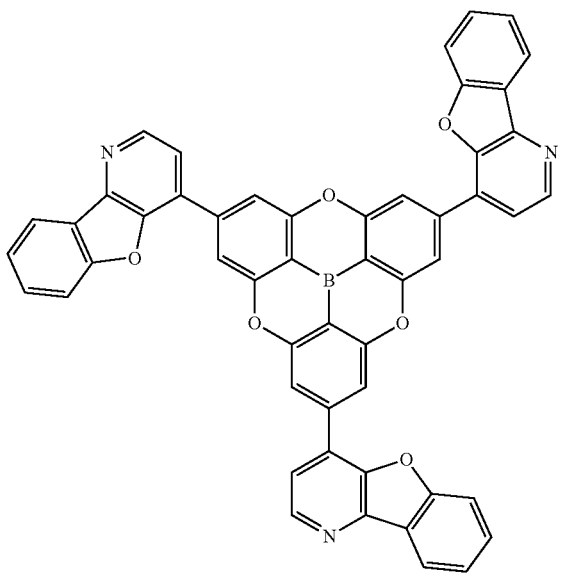

-continued

A-97

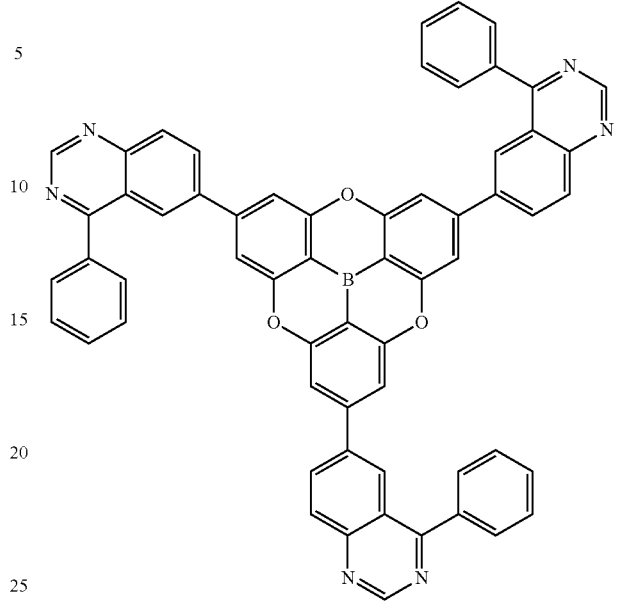

<<Production of Organic EL Elements 8-1 to 8-16>>

Organic EL elements 8-1 to 8-16 were each produced in the same manner as organic EL element 1-1 except that the electron injection layer and the cathode were changed to compounds shown in Table 8.

(1) Measurement of Relative Drive Voltage

With respect to each organic EL element produced, front luminance was measured at both the transparent electrode side (i.e., transparent substrate side) and the opposing electrode side (i.e., cathode side) of each organic EL element, and the voltage when the sum thereof reached 1,000 cd/m$^2$ was determined as a drive voltage (V). Luminance was measured by using a spectroradiometer CS-1000 (manufactured by Konica Minolta Sensing Inc.)

The drive voltage obtained above was assigned to the following expression to determine the relative drive voltage of each organic EL element with respect to the drive voltage of organic EL element 8-1.

Relative drive voltage (%)=(Drive voltage of each organic EL element/Drive voltage of organic EL element 8-1)×100

A smaller numeric value obtained indicates that the result is more preferable.

(2) Measurement of Variation in Relative Emission Luminance due to Storage at High Temperature Each organic EL element produced was allowed to emit light with a constant electric current of 2.5 mA/cm$^2$ at a temperature of 100° C. The emission luminance immediately after the light emission started and the emission luminance 100 hours after the light emission started were measured by using a spectroradiometer CS-2000 (manufactured by Konica Minolta, Inc.).

The obtained emission luminance values before and after storage at a high temperature were compared to determine the variation in the emission luminance (a value determined by subtracting the emission luminance after storage at a high temperature from the emission luminance before storage at a high temperature).

The variation in the emission luminance obtained above was assigned to the following expression to determine the relative value of the emission luminance variation of each organic EL element with respect to emission luminance variation of organic EL element 8-1.

Relative emission luminance variation due to storage at a high temperature (%)=(Emission luminance variation pf each organic EL element/Emission luminance variation of organic EL element 8-1)×100

TABLE 8

| Element number | Electron injection layer | Cathode | Relative drive voltage (%) | Variation in the relative emission luminance due to storage at a high temperature (%) | Remarks |
|---|---|---|---|---|---|
| 8-1 | Comparative compound 1 | Al | 100 | 100 | Comparative example |
| 8-2 | Comparative compound 3 | Ag | 105 | 90 | Comparative example |
| 8-3 | A-1 | Al | 78 | 50 | Present invention |
| 8-4 | A-2 | Al | 74 | 58 | Present invention |
| 8-5 | A-92 | Al | 73 | 61 | Present invention |
| 8-6 | A-95 | Al | 70 | 55 | Present invention |
| 8-7 | A-21 | Ag | 80 | 46 | Present invention |
| 8-8 | A-57 | Ag | 75 | 40 | Present invention |
| 8-9 | A-96 | Ag | 76 | 42 | Present invention |
| 8-10 | A-93 | Ag | 73 | 41 | Present invention |
| 8-11 | A-22 | Ag | 71 | 50 | Present invention |
| 8-12 | A-20 | Ag | 80 | 51 | Present invention |
| 8-13 | A-16 | MgAg | 77 | 42 | Present invention |
| 8-14 | A-34 | MgAg | 75 | 55 | Present invention |
| 8-15 | A-97 | MgAg | 74 | 50 | Present invention |
| 8-16 | A-93 | MgAg | 77 | 43 | Present invention |

As clearly seen from Table 8, organic EL elements 8-3 to 8-16 of the present invention including the π-conjugated boron compound of the present invention used in the electron injection layer all have a relative drive voltage of 80 or less, and the variation in the relative emission luminance due to storage at a high temperature is limited to 61 or less. Accordingly, it can be seen that the relative drive voltage is lower and the variation in the relative emission luminance due to storage at a high temperature is smaller than those of comparative compound 1, which has a portion around the boron where no annulation is carried out, and those of comparative compound 3, in which Y in general formula 1 is not an oxygen atom or sulfur atom but a carbon atom.

This application claims the benefit of Japanese Patent Application No. 2015-146543 filed on Jul. 24, 2015 and Japanese Patent Application No. 2015-250261 filed on Dec. 22, 2015, the disclosure of which including the specification and drawings is incorporated herein by reference in its entirety.

INDUSTRIAL APPLICABILITY

According to the present invention, an organic electroluminescent element having improved emission efficiency and stability under storage at a high temperature can be provided.

REFERENCE SIGNS LIST

1 Display
3 Pixel
5 Scanning line
6 Data lines
7 Power source line
10 Organic EL element
11 Switching transistor
12 Driving transistor
13 Condenser
101 Organic EL element in lighting apparatus
102 Glass cover
105 Cathode
106 Organic layer
107 Glass substrate provided with transparent electrode
108 Nitrogen gas
109 Water absorbent
A Display part
B Control part
C Wiring portion

The invention claimed is:

1. An organic electroluminescent element comprising an anode, a cathode, and at least one organic layer sandwiched between the anode and the cathode,
   wherein at least one of the organic layer comprises a π-conjugated boron compound represented by general formula 1:

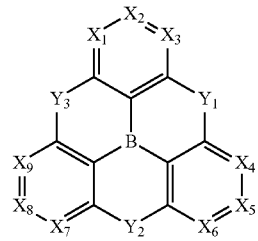

wherein:
X$_1$ to X$_9$ each independently represents —CW or a nitrogen atom,
at least one of X$_1$ to X$_9$ represents —CW,
W represents a hydrogen atom or a substituent, and at least one of W represents an optionally substituted alkyl group, an optionally substituted alkoxy groups, an optionally substituted amino group, an optionally substituted aromatic ring group, or an optionally substituted aromatic heterocyclic group, and $Y_1$ to $Y_3$ each independently represents an oxygen atom or a sulfur atom.

2. The organic electroluminescent element according to claim 1, wherein, in general formula 1, $X_1$ to $X_9$ are —CW, and $Y_1$ to $Y_3$ are oxygen atom.

3. The organic electroluminescent element according to claim 1, wherein the W is an electron-donating group.

4. The organic electroluminescent element according to claim 3, wherein the electron-donating group represented by the W is represented by general formula 2:

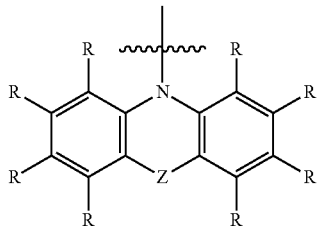

wherein:
Z represents $CR_1R_2$, $SiR_3R_4$, an oxygen atom, a sulfur atom, or $NR_5$, and
$R_1$ to $R_5$ and R each independently represents a hydrogen atom or a substituent.

5. The organic electroluminescent element according to claim 3, wherein the electron-donating group represented by the W is represented by general formula 3:

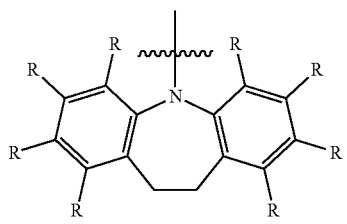

wherein:
each R independently represents a hydrogen atom or a substituent.

6. The organic electroluminescent element according to claim 3, wherein the electron-donating group represented by the W is represented by general formula 4:

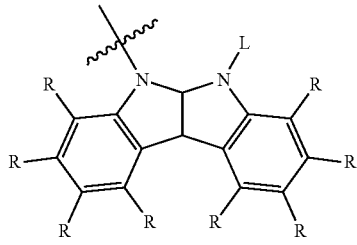

wherein:
each R independently represents a hydrogen atom or a substituent, and
L represents a substituent.

7. The organic electroluminescent element according to claim 3, wherein the electron-donating group represented by the W is represented by general formula 5:

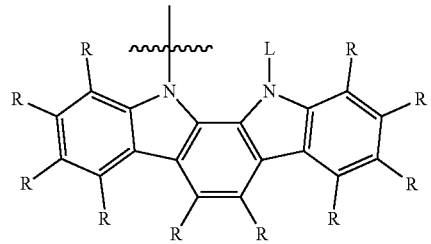

wherein:
each R independently represents a hydrogen atom or a substituent, and
L represents a substituent.

8. The organic electroluminescent element according to claim 3, wherein the electron-donating group represented by the W is represented by general formula 6:

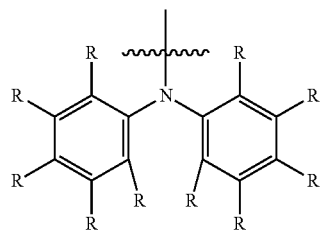

wherein:
each R independently represents a hydrogen atom or substituent.

9. The organic electroluminescent element according to claim 3, wherein the electron-donating group represented by the W is represented by general formula 7:

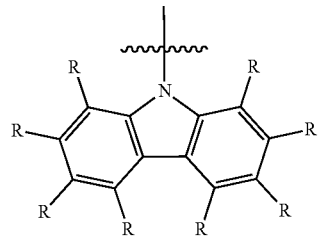

wherein:
each R independently represents a hydrogen atom or a substituent.

10. The organic electroluminescent element according to claim 1, wherein, in the general formula 1, the $X_7$ to $X_9$ are —CW and the W is an electron-donating group.

11. The organic electroluminescent element according to claim 10, wherein the W is an electron-donating group represented by general formula 7:

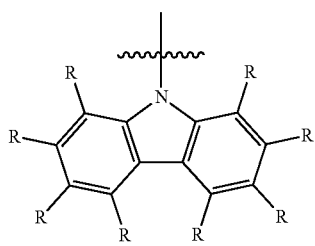

wherein:
each R independently represents a hydrogen atom or a substituent.

12. The organic electroluminescent element according to claim 1, wherein ΔEst of the π-conjugated boron compound represented by general formula 1 is 0.50 eV or less, the ΔEst being an absolute value of difference between lowest singlet excited energy level and lowest triplet excited energy level of the compound.

13. The organic electroluminescent element according to claim 1, wherein:
the organic layer comprises a light-emitting layer, and
the light-emitting layer comprises the π-conjugated boron compound represented by general formula 1.

14. The organic electroluminescent element according to claim 13, wherein the light-emitting layer comprises the π-conjugated boron compound represented by general formula 1, and at least one of a fluorescence-emitting material and a phosphorescence-emitting material.

15. The organic electroluminescent element according to claim 1, wherein the π-conjugated boron compound represented by general formula 1 is used in combination with an electron transport material.

16. The organic electroluminescent element according to claim 1, wherein the π-conjugated boron compound represented by general formula 1 is used in combination with a hole transport material.

17. The organic electroluminescent element according to claim 1, wherein the organic layer comprising the π-conjugated boron compound represented by general formula 1 is a layer adjacent to the cathode.

18. A display apparatus comprising the organic electroluminescent element according to claim 1.

19. A lighting apparatus comprising the organic electroluminescent element according to claim 1.

* * * * *